US009299956B2

(12) United States Patent
Savas et al.

(10) Patent No.: US 9,299,956 B2
(45) Date of Patent: Mar. 29, 2016

(54) METHOD FOR DEPOSITION OF HIGH-PERFORMANCE COATINGS AND ENCAPSULATED ELECTRONIC DEVICES

(71) Applicant: Aixtron, Inc., Sunnyvale, CA (US)

(72) Inventors: Stephen E. Savas, Pleasanton, CA (US);
Allan Wiesnoski, Pleasanton, CA (US);
Hood Chatham, Scotts Valley, CA (US);
Carl Galewski, Santa Cruz, CA (US)

(73) Assignee: Aixtron, Inc., Sunnyvale, CA (US)

( * ) Notice: Subject to any disclaimer, the term of this patent is extended or adjusted under 35 U.S.C. 154(b) by 239 days.

(21) Appl. No.: 13/917,313

(22) Filed: Jun. 13, 2013

(65) Prior Publication Data

US 2013/0334511 A1    Dec. 19, 2013

Related U.S. Application Data

(60) Provisional application No. 61/659,263, filed on Jun. 13, 2012, provisional application No. 61/668,375, filed on Jul. 5, 2012.

(51) Int. Cl.
*H01L 51/56* (2006.01)
*H01L 31/0203* (2014.01)
(Continued)

(52) U.S. Cl.
CPC ............ *H01L 51/56* (2013.01); *H01L 31/0203* (2013.01); *H01L 31/02167* (2013.01); *H01L 31/048* (2013.01); *H01L 51/5256* (2013.01); *Y02E 10/50* (2013.01)

(58) Field of Classification Search
CPC ..... H01L 51/56; H01L 51/5256; H01L 28/57; H01L 31/02167; H01L 31/048; H01L 31/0203; Y02E 10/50; Y02E 10/541; Y02E 10/544
See application file for complete search history.

(56) References Cited

U.S. PATENT DOCUMENTS 4,230,515 A    10/1980 Zajac
5,543,688 A    8/1996 Morita
(Continued)

FOREIGN PATENT DOCUMENTS

DE        4242894 A1    6/1994
DE   10200410043967    9/2004
(Continued)

OTHER PUBLICATIONS

Babayan, S.E., et al., "Deposition of silicon dioxide films with a non-equilibrium atmospheric-pressure plasma jet", *Plasma Sources Science and Technology* 10 Sep. 12, 2001, pp. 573-578.
(Continued)

*Primary Examiner* — Laura Menz
*Assistant Examiner* — Maliheh Malek
(74) *Attorney, Agent, or Firm* — Ascenda Law Group, PC

(57) ABSTRACT

A method is disclosed for forming leak-free coatings on polymeric or other surfaces that provide optical functions or protect underlying layers from exposure to oxygen and water vapor and do not crack or peel in outdoor environments. This method may include both cleaning and surface modification steps preceding coating. The combined method greatly reduces defects in any barrier layer and provides weatherability of coatings. Specific commercial applications that benefit from this include manufacturing of photovoltaic devices or organic light emitting diode (OLED) devices including lighting and displays.

21 Claims, 26 Drawing Sheets

(51) Int. Cl.
*H01L 51/52* (2006.01)
*H01L 31/0216* (2014.01)
*H01L 31/048* (2014.01)

(56) References Cited

U.S. PATENT DOCUMENTS

| | | | |
|---|---|---|---|
| 5,609,690 A | 3/1997 | Watanabe et al. | |
| 5,686,360 A | 11/1997 | Harvey, III et al. | |
| 5,757,126 A | 5/1998 | Harvey, III et al. | |
| 5,968,610 A * | 10/1999 | Liu et al. | 438/435 |
| 5,981,899 A | 11/1999 | Perrin et al. | |
| 6,083,313 A * | 7/2000 | Venkatraman et al. | 106/287.14 |
| 6,198,217 B1 | 3/2001 | Suzuki et al. | |
| 6,245,396 B1 | 6/2001 | Nogami | |
| 6,262,523 B1 | 7/2001 | Selwyn et al. | |
| 6,281,469 B1 | 8/2001 | Perrin et al. | |
| 6,353,201 B1 | 3/2002 | Yamakoshi et al. | |
| 6,359,250 B1 | 3/2002 | Blonigan et al. | |
| 6,570,325 B2 | 5/2003 | Graff et al. | |
| 6,573,652 B1 | 6/2003 | Graff et al. | |
| 6,576,202 B1 | 6/2003 | Chiu | |
| 6,579,805 B1 | 6/2003 | Bar-Gadda | |
| 6,597,111 B2 | 7/2003 | Silvernail et al. | |
| 6,660,409 B1 | 12/2003 | Komatsu et al. | |
| 6,664,137 B2 | 12/2003 | Weaver | |
| 6,720,203 B2 | 4/2004 | Carcia et al. | |
| 6,743,524 B2 | 6/2004 | Schaepkens | |
| 6,779,482 B2 | 8/2004 | Sakai et al. | |
| 6,838,387 B1 | 1/2005 | Zajac et al. | |
| 6,863,020 B2 | 3/2005 | Mitrovic et al. | |
| 6,864,629 B2 | 3/2005 | Miyaguchi et al. | |
| 6,897,607 B2 | 5/2005 | Sugimoto et al. | |
| 6,916,401 B2 | 7/2005 | Long | |
| 7,015,640 B2 | 3/2006 | Schaepkens et al. | |
| 7,090,705 B2 | 8/2006 | Miyazaki et al. | |
| 7,205,034 B2 | 4/2007 | Kawamura et al. | |
| 7,264,849 B2 | 9/2007 | Keshner et al. | |
| 7,319,295 B2 | 1/2008 | Mashima et al. | |
| 7,342,361 B2 | 3/2008 | Ellingboe | |
| 7,492,091 B2 | 2/2009 | Kharrazi-Olsson et al. | |
| 7,510,913 B2 | 3/2009 | Moro et al. | |
| 7,518,142 B2 | 4/2009 | Hoffmann et al. | |
| 7,829,147 B2 | 11/2010 | Aitken et al. | |
| 7,833,587 B2 | 11/2010 | Mashima et al. | |
| 7,886,690 B2 | 2/2011 | Ellingboe | |
| 7,951,620 B2 | 5/2011 | Won et al. | |
| 8,133,797 B2 * | 3/2012 | van Schravendijk et al. | 438/427 |
| 8,236,424 B2 | 8/2012 | Schaepkens et al. | |
| 8,257,799 B2 | 9/2012 | Lee | |
| 8,298,625 B2 | 10/2012 | Stimson et al. | |
| 8,308,969 B2 * | 11/2012 | Teo | H01J 37/32009 156/345.43 |
| 8,343,592 B2 | 1/2013 | Kudela et al. | |
| 8,359,250 B2 | 1/2013 | Srinivasan et al. | |
| 8,404,502 B2 | 3/2013 | Won et al. | |
| 8,486,487 B2 | 7/2013 | Fukuda et al. | |
| 8,679,982 B2 * | 3/2014 | Wang et al. | 438/694 |
| 8,916,947 B2 * | 12/2014 | Sargent et al. | 257/440 |
| 2001/0006093 A1 | 7/2001 | Tabuchi et al. | |
| 2001/0019133 A1 * | 9/2001 | Konuma et al. | 257/79 |
| 2001/0021422 A1 | 9/2001 | Yamakoshi et al. | |
| 2001/0042554 A1 | 11/2001 | Tamura | |
| 2001/0050059 A1 | 12/2001 | Hongo et al. | |
| 2002/0069971 A1 | 6/2002 | Kaji et al. | |
| 2002/0148561 A1 | 10/2002 | Tetsuhiro et al. | |
| 2003/0066485 A1 | 4/2003 | Yamazaki et al. | |
| 2003/0070759 A1 | 4/2003 | Aota et al. | |
| 2003/0079983 A1 | 5/2003 | Long et al. | |
| 2003/0082313 A1 | 5/2003 | Chien | |
| 2003/0113479 A1 | 6/2003 | Fukuda et al. | |
| 2004/0041147 A1 * | 3/2004 | Park | 257/40 |
| 2004/0137647 A1 | 7/2004 | Miyazaki et al. | |
| 2004/0164293 A1 * | 8/2004 | Maloney et al. | 257/40 |
| 2005/0118533 A1 | 6/2005 | Mirkarimi et al. | |
| 2005/0176230 A1 * | 8/2005 | Sieber et al. | 438/609 |
| 2005/0217798 A1 | 10/2005 | Sugiyama et al. | |
| 2006/0078677 A1 * | 4/2006 | Won et al. | 427/248.1 |
| 2006/0096539 A1 | 5/2006 | Kawasaki et al. | |
| 2006/0177599 A1 | 8/2006 | Madocks | |
| 2006/0214270 A1 | 9/2006 | Iwagami | |
| 2007/0048963 A1 * | 3/2007 | Miura | 438/396 |
| 2007/0093006 A1 * | 4/2007 | Basol | 438/150 |
| 2007/0217119 A1 | 9/2007 | Johnson et al. | |
| 2007/0227662 A1 | 10/2007 | Yamazawa | |
| 2008/0070385 A1 * | 3/2008 | Won et al. | 438/482 |
| 2008/0139003 A1 * | 6/2008 | Pirzada et al. | 438/785 |
| 2008/0149924 A1 * | 6/2008 | Aitken et al. | 257/40 |
| 2008/0309242 A1 | 12/2008 | Ellingboe | |
| 2009/0081360 A1 | 3/2009 | Fedorovskaya et al. | |
| 2009/0117717 A1 | 5/2009 | Tomasini et al. | |
| 2009/0121316 A1 * | 5/2009 | Zelner et al. | 257/532 |
| 2009/0127544 A1 * | 5/2009 | Schrodner et al. | 257/40 |
| 2010/0019335 A1 * | 1/2010 | Ivanov et al. | 257/432 |
| 2010/0080933 A1 | 4/2010 | Kudela et al. | |
| 2010/0112235 A1 | 5/2010 | Prinz et al. | |
| 2010/0136331 A1 | 6/2010 | Fahland et al. | |
| 2010/0140645 A1 * | 6/2010 | Shibata | 257/98 |
| 2010/0176386 A1 * | 7/2010 | Yersin | C07F 9/5045 257/40 |
| 2010/0301311 A1 * | 12/2010 | Oku | 257/40 |
| 2011/0005681 A1 | 1/2011 | Savas et al. | |
| 2011/0005682 A1 | 1/2011 | Savas et al. | |
| 2011/0068332 A1 * | 3/2011 | Han et al. | 257/40 |
| 2011/0081504 A1 * | 4/2011 | Gersdorff | B05D 1/60 427/585 |
| 2011/0192464 A1 * | 8/2011 | Urano | B82Y 30/00 136/263 |
| 2011/0256334 A1 * | 10/2011 | Edwards et al. | 428/69 |
| 2011/0262679 A1 | 10/2011 | Azuma et al. | |
| 2012/0225218 A1 | 9/2012 | Savas et al. | |
| 2012/0273976 A1 * | 11/2012 | David et al. | 257/790 |
| 2013/0049580 A1 * | 2/2013 | Maindron et al. | 313/512 |
| 2013/0126851 A1 * | 5/2013 | Nishiyama | 257/40 |
| 2013/0210199 A1 * | 8/2013 | Chen et al. | 438/127 |
| 2014/0138662 A1 * | 5/2014 | Goeoetz et al. | 257/40 |
| 2014/0138719 A1 * | 5/2014 | Maindron et al. | 257/88 |
| 2014/0225086 A1 * | 8/2014 | Dobbertin et al. | 257/40 |
| 2014/0246664 A1 * | 9/2014 | Shoda | 257/40 |

FOREIGN PATENT DOCUMENTS

| | | |
|---|---|---|
| JP | 2002212744 A | 1/2001 |
| JP | 2003/093869 | 4/2003 |
| WO | WO2006/120239 A1 | 11/2006 |
| WO | 2007016999 A2 | 2/2007 |
| WO | WO2008/055993 A1 | 5/2008 |
| WO | WO2009/121975 A1 | 10/2009 |
| WO | WO2011/006018 A2 | 1/2011 |

OTHER PUBLICATIONS

Loureiro, J., et al., "Non-equilibrium kinetics in $N_2$ discharges and post-discharges : a full picture by modelling and impact on the application", *Plasma Sources Science and Technology* 20 Apr. 1, 2011, 12 pgs.

Soppe, W.J., et al. "Roll to Roll Fabrication Process of Thin-Film Silicon Solar Cells on Steel Foil", *ECN Solar Energy*, 2004, 4 pgs.

Stephens, D. J., et al., "The optical properties of plasma-deposited $SiO_2$ and $Si_3N_4$ bragg reflectors in the spectral range from 1.8 to 3.0eV", *Materials Research Society*, vol. 281, 1993, pp. 809-814.

Strobel, c., et al., "Dynamic high-rate-deposition of silicon thin film layers for photovoltaic devices", *23rd European Photovoltaic Solar Energy Conference*, Sep. 1-5, 2008, Valencia Spain. pp. 2497-2504.

Takagi, T., et al., "Large area multi-zone type VHF-PCVD system for a-Si and μc-Si deposition", *3nd World Conference on Photovoltaic Energy Conversion*, May 11-18, 2003, Osaka, Japan, pp. 1792-1795.

Van Aken, B.B., et al., "Surface (photo)voltage monitoring in roll-to-roll deposition of thin film silicon solar cells", *24th European Photovoltaic Solar Energy Conference*, Sep. 2009, Hamburg Germany, 4 pgs.

Zimmerman, T., et al., "Inline dynamic depositon of a SI:H and μC-SI:H thin-film solar cells", *25th European Photovoltaic Solar*

(56) References Cited

OTHER PUBLICATIONS

*Energy Conference and Exibition / 5th World Conference on Photovoltaic Energy Conversion*, Sep. 2010, Valencia, Spain, 4 pgs.

Y. Maemura, H. Fujiyama, T. Takagi, R. Hayashi, W. Futako, M. Kondo and A. Matsuda; "Particle formation and a-Si:H film deposition in narrow-gap RF plasma CVD". Thin Solid Films vol. 345, pp. 80-84 (1999).

Simon Selitser, Time Domain CVD, Inc. "Plasma-Enhanced Deposition (of silicon dioxide) from TEOS and Oxygen". 2002.

Tobias Roschek, Tobias Repmann, Oliver Kluth, Joachim Mueller, Bernd Rech and Heribert Wagner. "High rate deposition of microcrystalline silicon solar cells using 13.56 MHz PECVD-prerequisites and limiting factors". Mat. Res. Soc. Symp. Proc. vol. 715 (A26.5.1) 2002.

English Abstract of Japanese Application JP2002212744, publication date Jan. 17, 2001.

J. Park, Henins, H. W. Herrmann, G. S. Selwyn, and R.F. Hicks; Discharge phenomena of an atmospheric pressure radio-frequency capacitive plasma source; Journal of Applied Physics; Jan. 1, 2001; pp. 20-28; vol. 89, No. 1; American Institute of Physics; United States of America.

Lee, J.W., MacKenzie, D. Johnson, S. J. Pearton, F. Ren and J. N. Sasserath; Development of Low Temperature Silicon Nitride and Silicon Dioxide Films by Inductively-Coupled Plasma Chemical Vapor Deposition.

G. R. Nowling, S. E. Babayan, V. Jankovic and R. F. Hicks; Remote plasma-enhanced chemical vapour deposition of silicon nitride at atmospheric pressure; Plasma Sources Science and Technology; Feb. 4, 2002; pp. 97-103; vol. 11; Institute of Physics Publishing; United States of America.

S. Y. Moon, J. K. Rhee, D. B. Kim, and W. Choe; •,•,and normal, abnormal glow discharge modes in radio-frequency capacitively coupled discharges at atmospheric pressure; Physics of Plasmas 13, 033502 (2006); pp. 1-6; American Institute of Physics; United States of America.

J. Yota, J. Hander, and A. A. Saleh; A comparative study on inductively-coupled plasma high-density plasma, plasma-enhanced, and low pressure chemical vapor deposition silicon nitride films;; J. Vac. Sci. Technol. A vol. 18 No. 2, Mar./Apr. 2000 pp. 372-376; American Vacuum Society; United States of America.

S. A. Moshkalyov, J. A. Diniz, J. W. Swart, P. J. Tatsch, and M. Machida; Deposition of silicon nitride by low-pressure electron cyclotron resonance plasma enhanced chemical vapor deposition in N2/Ar/SiH4; J. Vac. Sci. Technol. B vol. 15 No. 6, Nov./Dec. 1997, pp. 2682-2687; American Vacuum Society, pp. 372-376; United States of America.

W. A. Lanford and M. J. Rand; The hydrogen content of plasma-deposited silicon nitride; J. Appl. Phys. 49(4), Apr. 1978 pp. 2473-2477.

D. Landheer, N. G. Skinner, T. E. Jackman, D.A. Thompson, J.G. Simmons,Andd.V. Stevanovic, and D. Khatamian; Growth and characterization of silicon nitride films produced by remote microwave plasma chemical vapor deposition; J. Vac. Sci. Technol. A 9 (5), Sep./Oct. 1991, pp. 2594-2601; American Vacuum Society; United States of America.

G. Lucovsky, P. D. Richard, D. V. Tsu, S. Y. Lin, and R. J. Markunas; Deposition of silicon dioxide and silicon nitride by remote plasma enhanced chemical vapor deposition; J. Vac. Sci. Technol. A 4 (3), May/Jun. 1986, pp. 681-687; American Vacuum Society; United States of America.

F.H.P.M. Habraken and A.E.T. Kuiper, Silicon nitride and oxynitride films; Materials Sci. and Eng., R12 (1994) 123-175.

R. Chow, W. A. Lanford, W. Ke-Ming, and R. S. Rosler; Hydrogen content of a variety of plasma-deposited silicon nitrides; J. Appl. Phys., vol. 53, No. 8, Aug. 1982, pp. 5630-5634; American Institute of Physics; United States of America.

J. Madocks, W. Seaman, M.A. George, Q. Shangguan; Plasma Enhanced Chemical Vapor Deposition (PECVD) forLarge Area Applications; Preprint publication from the 53rd Society of Vacuum Coaters Annual Technical Conference 2010.

PCT/US2010/041440 International search report and written opinion dated Nov. 30, 2010.

Babayan, S.E., et al., "Deposition of silicon dioxide films with a non-equilibrium atmospheric-pressure plasma jet", *Plasma Sources Science and Technology* 10 (2001) Sep. 12, 2001, pp. 573-578.

Loureiro, J., et al., "Non-equilibrium kinetics in $N_2$ discharges and post-discharges: a full picture by modelling and impact on the application", *Plasma Sources Science and Technology* 20 (2011) Apr. 1, 2011, 12 pgs.

Soppe, W.J., et al, "Roll to Roll Fabrication Process of Thin-Film Silicon Solar Cells on Steel Foil", *ECN Solar Energy*, 2004, 4 pgs.

Stephens, D.J., et al., "The optical properties of plasma-deposited $SiO_2$ and $Si_3N_4$ bragg reflectors in the spectral range from 1.8 to 3.0eV", *Materials Research Society*, Vol. 281, 1993, pp. 809-814.

Strobel, c., et al., "Dynamic high-rate-deposition of silicon thin film layers for photovoltaic devices", *23rd European Photovoltaic Solar Energy Conference*, Sep. 1-5, 2008, Valencia, Spain, pp. 2497-2504.

Takagi, T., et al., "Large area multi-zone type VHF-PCVD system for a-Si and μc-Si deposition", *3rd World Conference on Photovoltaic Energy Conversion*, May 11-18, 2003, Osaka, Japan, pp. 1792-1795.

Van Aken, B.B., et al., "Surface (photo)voltage monitoring in roll-to-roll deposition of thin film silicon solar cells", *24th European Photovoltaic Solar Energy Conference*, Sep. 2009, Hamburg, Germany, 4 pgs.

Zimmerman, T., et al., "Inline dynamic deposition of a SI:H and μC-SI:H thin film solar cells", *25th European Photovoltaic Solar Energy Conference and Exhibition/ 5th World Conference on Photovoltaic Energy Conversion*, Sep. 2010, Valencia, Spain, 4 pgs.

* cited by examiner

METHOD FOR DEPOSITION OF HIGH-PERFORMANCE COATINGS AND ENCAPSULATED ELECTRONIC DEVICES

RELATED APPLICATIONS

This application claims priority benefit of U.S. Provisional Application Ser. No. 61/659,263 filed 13 Jun. 2012 and U.S. Provisional Application Ser. No. 61/668,375 filed 5 Jul. 2012, the contents of which are incorporated herein by reference.

FIELD OF THE INVENTION

This invention pertains to a method for depositing high-performance coatings either as barriers to protect against penetration of oxygen and water vapor, or provide anti-reflection or optical filtering. An example of an application that benefits from this method is the need for ultra low permeability encapsulation of organic light emitting diode (OLED) displays and lighting. Another example is a coating for Copper Indium Gallium di-Selenide (CIGS) photovoltaic panels that both protects from moisture and provides anti-reflection for incident light so that power output of the module is increased.

BACKGROUND OF THE INVENTION

Thin films that protect or enhance the performance of an underlying material are commonly used in many industrial processes. Applications range from food packaging, hard coatings on eyeglass lenses, and window glass, to protection of integrated circuits, display screens, and photovoltaic panels. Such thin films need to be dense, have excellent adhesion to the underlying layer and not crack or peel for the life of the product. In some cases the coating needs to be a hermetic seal, keeping out water vapor and oxygen, and in this case it must not have too many tiny pinhole leaks that would disrupt the function of even tiny areas of the underlying structure or device. Further, for many of the most high value applications such as OLED display screens or lighting panels or organic photovoltaic panels, where the barrier needs to be tightest, the under-layers must not be exposed during manufacturing to temperatures above a limit that may range from slightly over a hundred degrees Celsius in some cases to less than about seventy five degrees for some polymers.

Presently, adhesion of deposited coatings is achieved either by first putting down an intermediate layer of highly wettable polymer layers, or by subjecting the surface to an inert plasma. Where the application is very cost sensitive it may be too expensive to use such wettable polymers, and for many inexpensive plastics an inert gas treatment has been found not to be effective in promoting adequate adhesion of the hard coating. Therefore, a more effective and less expensive method of ensuring adequate adhesion of coatings is needed.

For deposition of dense hermetic barrier layers at such low temperatures, sputtering of target material onto the substrate is the most common method used. This technique works quite well at substrate temperatures less than or about 100° C. but it generates substantial heat and produces films that are often not as amorphous and effective as barriers. In some applications where the plastic or polymer substrate is thick or cannot be cooled effectively sputtering may not be acceptable due to heating of the substrate. Plasma enhanced CVD has been used very predominantly in applications where the limiting temperature for the substrate is above about 200° C., but has not been capable of providing commercially competitive rates of deposition of high quality dielectrics at substrate temperatures under 100° C. The approach of Savas et al (US 20110006040, 20110005682, and 20110005681) offers promise that plasma enhanced CVD can provide dense homogeneous barrier films at such temperatures and at reasonable cost.

There are a few new and very demanding, high value applications for the hermetic encapsulation processes. Among these are encapsulation of organic and CIGS photovoltaic devices (PV), and encapsulation of organic light emitting diode (OLED) devices for both lighting and displays. These applications all have the strong requirement that the encapsulation be highly transparent to visible light, and very low in moisture and oxygen penetration. Solar panels using thin film materials such as CIGS or organic polymer for photovoltaic conversion require encapsulation with transmission rates from $10^{-4}$ to $10^{-5}$ gm/m$^2$-day of water vapor. For these applications cost must be very low as well, the precise upper limit varying with the particular application. For applications such as OLED lighting and Organic PV modules the cost per square meter should be less than or about US$10/m$^2$ since the total cost of such panels or web needs to be less than US$60/m$^2$ and even as low as US$30/m$^2$. For CIGS encapsulation cost must be no greater than $15/m$^2$ to $20/m$^2$, and for OLED displays encapsulation cost could be as much as $50/m$^2$ since the display screen total cost of manufacture will be between about $1000/m$^2$ to $2000/m$^2$. Anti-reflective coatings that improve the light conversion efficiency of the PV devices are also in need and hard coatings as well for those PV devices that must be exposed to the outdoor environment. These must be very low in cost to be competitive in the energy market— typically less than US$3/m$^2$ and in some other applications even less than US$1/m$^2$.

One of the most demanding applications is OLED displays. Compared to commonly used liquid crystal displays (LCD), OLED technology can provide many benefits, including lower power consumption, higher contrast, wider viewing angles and the ability to be made on flexible substrates. But there are also substantial technological challenges to be solved before OLED displays larger than a square decimeter—such as useful for tablet or laptop displays—can be manufactured with high yield.

In particular, the very thin, low work-function metals used for the electron emitting layer in an OLED device are highly sensitive to damage by oxidation. Therefore, to achieve a useful lifetime in air, an OLED display must be encapsulated such that the oxygen transmission rate (OTR) is less than $10^{-3}$ to $10^{-5}$ scc/m$^2$-day and water vapor transmission rate (WVTR) is even less than $10^{-7}$ g/m$^2$-day. Currently this can only be done in mass production using a top covering of glass which is 100 or more microns thick. In comparison an LCD display is relatively insensitive to water or oxygen and requires encapsulation rated at OTR and WVTR of order 0.1 scc/m$^2$-day or g/m$^2$-day.

As a reference point to understand the needed tightness of such encapsulation, the air and moisture leakage requirement for an OLED display is equivalent to that of a high-vacuum chamber with a He leak rate on the order of $10^{-10}$ scc/sec. High-vacuum chambers with such a high degree of vacuum integrity are not uncommon, but require careful design, are expensive to make and are not generally mass-produced.

It is has been demonstrated that OLED displays can be sufficiently encapsulated when built on glass substrates by installing a top glass layer with a perimeter seal to the OLED area. As this perimeter seal is based on polymers it allows for some permeation or leakage of oxygen and water, requiring a "gettering" material in the space surrounding the OLED to absorb oxygen and water. This is an expensive technique ($50/m² to $100/m²) and only suitable for relatively small and rigid displays, such as on smart phones or tablets. It also suffers from difficulty relating to stresses when front and back surfaces are not maintained at precisely the same temperature.

To reduce cost, increase manufacturing yield and increase applications for OLED both in lighting and displays there is a need to find methods and tools that enable high-volume production encapsulation with transparent thin films between about 30 nm and about 10 µm thick that provide the equivalent integrity of a high-vacuum chamber. In the case of flexible displays, which would be useful for many commercial applications, hard, inorganic barriers usually need to be less than about 100 nm thick to avoid cracking when the screen is flexed or the ambient temperature changes by several tens of degrees Celsius. The consequent leaking of atmosphere into the sensitive material layers destroys the device and makes a "black spot" on the screen or lighting panel. Other barrier materials may be mixed organic-inorganics that have both high transparency for visible light and barrier function while being up to 10 microns thick.

The prior art demonstrates that thin barrier films exist that have the ability to meet the requirements of OLED encapsulation under ideal conditions . Films consisting of inorganic nitrides, oxides, and oxynitrides are particularly suitable as they also are transparent. In particular, aluminum oxide, silicon nitride and silicon oxynitride are commonly used. These are highly transparent and yet very dense dielectrics.

However, under mass production conditions deposited films will have localized areas where the film does not have adequate barrier function. Such defects result from undesirable film morphology or insufficient film density that leads to localized areas that have higher transmission of oxygen and water vapor. Such defects may be caused by particles on the starting substrate, areas on the substrate with higher nucleation energy, particles generated during the deposition, overhanging or re-entrant surface topography and film cracks due to poor adhesion or stress.

Some prior art overcomes the effect of localized particles or other defects in one barrier layer by using multiple deposition layers, often with a planarizing, organic inter-layer between the inorganic barrier layers. In the case of the organic inter-layers the motivation is to bury the defects in the polymer and deposit each new barrier layer on the clean new surface. This causes a wide lateral separation of the defects in successive barrier layers such that the effective path length for transmission of oxygen and water molecules is substantially increased. The prior art suggest that as many as 3 to 7 repeated stacks of interlayer and barrier (films) are required to achieve oxygen or water vapor transmission rates (OTR & WVTR respectively) adequate for extended lifetime (up to 10 years) of an OLED display.

Another challenge to the application of thin barrier films to polymeric substrates in particular (and other surfaces in general) is the difficulty of obtaining adequate adhesion of the coating to the underlying material. This is particularly true of the high optical quality lower-cost polymers (such as acrylics or acrylates) used in both PV and displays. Typical approaches to improving adhesion include use of various plasma pretreatments (at low or atmospheric pressure) using oxygen, nitrogen, ammonia, as well as inert gases. Additional adhesion enhancement methods include deposition of thin metallic 'primer' layers using evaporation or sputtering, but these approaches can compromise the optical quality and operation of the display.

It should be noted that the desired Oxygen Transmission Rate (OTR) and Water Vapor Transmission Rate (WVTR) levels are well below the detection limit of about $10^{-3}$ g/m²-day for current commercial methods such as "MOCON". Some services are able to measure levels about an order of magnitude lower, but are not able to distinguish between moisture leakage due to localized defects or due to bulk permeability. There are also more sensitive methods to determine leakage using a very thin layer of easily oxidized metal, such as Ca whose oxide is transparent. In this case localized defect areas can be seen as transparent areas. Finished OLED panels can also be tested, both for initial defects, and for lifetime.

Panels, modules or sheets of organic PV or CIGS are more cost sensitive than OLED applications and therefore cost effective thin film encapsulation can be an even more important enabler of the cost reductions that are essential for their competitiveness in the energy conversion marketplace. Currently, the cost of making PV panels is roughly US$1 per Watt so that their cost is roughly $100 to $150 per square meter. The encapsulation cost should therefore be no more than about 10% to 15% of this and yet must last for at least 5 years and probably more than 20 years. Since the panels produce the most electricity when exposed directly to sunlight it is likely that most of these must be able to withstand exposure to the elements and dust, and large ranges of temperature (−10° C. to 80° C.). When such panels use plastic substrate, which is far cheaper than metal or glass, they tend to have large thermal expansion coefficients—from about 20 microparts/degree Celsius to more than 100 microparts/degree Celsius. It is also essential that the encapsulation be able to stretch to accommodate the substantial thermal expansion of the substrate. While very thin (<30 nm) inorganic films such as silicon dioxide and silicon nitride accommodate substantial expansion without cracking, thicker films do crack. Since the efficiency of such panels is critical to their cost-effectiveness they would also benefit strongly by having anti-reflection coatings that could make them more efficient by reducing reflected light. Further, it would be helpful if such antireflection coating had an ability to resist scratching so that cleaning dust would not reduce the light transmission and efficiency. Such cleaning must be done several times a year to avoid efficiency loss. The sum of costs for all the above different coatings beneficial to the PV function should stay within the cost limits roughly of US$15 to US$20 per square meter. There are currently no known deposition processes that can produce said coatings within the cost limits. Were such a process found it would give an enormous boost to OPV and CIGS and to PV technology in general.

The above techniques do not allow for a method to monitor defect levels in production directly, and in the case of final test may not catch the effect of a long transmission path due to distributed defects in multiple layer stacks. The end result may be a display that works well initially, but may fail in a year of two, creating a negative perception in the market place.

There is, therefore, for OLED and possibly some PV technologies a need to develop deposition methods for thin films that have suitable bulk properties for low oxygen and water transmission rates. It is further necessary that such methods ensure excellent adhesion of encapsulation to the underlayers and avoid formation of local defects due to imperfections in the starting surface. It is further necessary that the number of defects per square meter be of order 1.0 and that the cost of this process not much exceed $10 per square meter, both in a mass production factory.

SUMMARY OF THE INVENTION

The present invention affords coating of large area substrates with thin coatings or films having at least one layer to provide one or more of the following economically important benefits:

Hermetic sealing of materials and devices sensitive to air, that is virtually pinhole and leak-free at highly competitive cost in mass production.

Anti-reflective or dichroic optical multi-layer coatings.

Hard, scratch protection on plastic substrates that can withstand outdoor or highly variable temperature conditions without cracking or peeling.

Flexibility and elasticity in hard coatings with thicknesses up to ten microns.

Coating processes with one or more of the above qualities may be used for a range of specific applications with rapidly growing, cost-sensitive markets, including but not limited to:

Encapsulation of OLED display devices, whether on rigid or flexible substrates.

Encapsulation of OLED lighting devices.

Encapsulation and/or anti-reflective coating and/or hard coatings for thin film photovoltaic (PV) devices for outdoor energy harvesting. Among those benefiting most are modules or continuous web substrates having Organic PV films or Copper Indium Gallium di-Selenide (CIGS) PV.

A combination of hard anti-scratch coating and anti-reflective coating for concentrator lens panels for concentrated solar PV. Such concentrators are typically cheap transparent plastic on plastic. Resistance to cracking and weathering due to varying temperature and humidity is a major advantage.

Hard or protective coatings for plastic (including lowest cost plastics such as acrylic and PET) for outdoor utilization, where ability to endure large ranges of temperature and humidity without cracking or peeling is required.

For defect sensitive applications such as OLED or thin film PV the disclosed novel coating process produces deposited films or stacks of films with better durability and far fewer defects due to particles on the surface of the substrate or microcracking at lower manufacturing cost than current or conventional techniques. Currently for PV applications where panels are outdoors and cost must be very low, typical hard, protective or optical coatings on low-cost, transparent plastics such as acrylic, PMMA, PET and PEN are found to have cracking, peeling and generally poor durability. This is due to the large temperature ranges in outdoor use in sunny climates which causes much larger thermal expansion of the plastic than of the hard protective layers. For ultra sensitive materials such as OLED, surfaces upon which barriers are to be deposited inevitably have particles on them, which in many cases causes leaky spots with current barrier deposition methods. This is especially true for flexible substrates such as plastic films where such particles cause micro-cracks in hermetic coatings. The disclosed method overcomes thermal problems by using materials that tolerate flexing or stretching of all layers in the coating as the substrate flexes or expands. Further, it avoids defects from pre-existing surface particles by employing a combination of steps, including the formation of novel surface-smoothing layers and methods prior to deposition of the hermetic barrier layer.

The coating process for either OLED or PV for any of the above applications, in some embodiments, may include various combinations of the process steps listed below. Typically, applications requiring ultraclean or defect-free coatings require more cleaning and surface preparation steps, and may benefit from more barrier or smoothing layers in the encapsulation. Coating applications that are not defect sensitive such as for optical coatings that are not hermetic encapsulation may require fewer or no surface cleaning steps, but may need more dielectric deposition steps in which layer thicknesses must be better controlled. In some example embodiments the temperature of the substrate may be less than about 150° C. Further, for OLED-based product manufacture the temperature should mostly be less than about 85° C. during the process. For example embodiments used for encapsulation of Organic PV the substrate temperature should be kept below about 100° C. for the majority of the process time and only very briefly and modestly above this temperature.

BRIEF LISTING OF THE DRAWINGS

Figure 6:
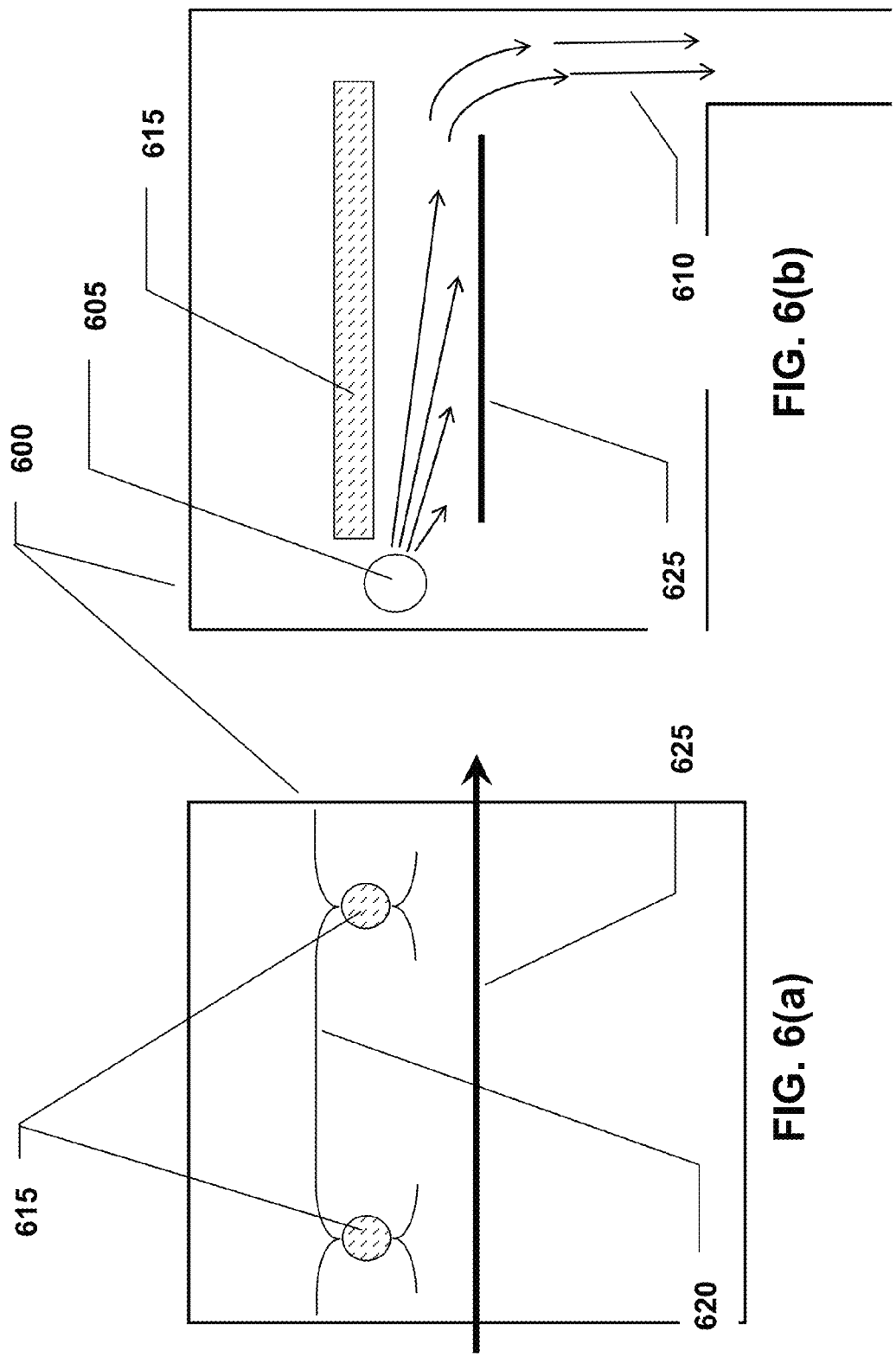

FIGS. 6(a) and 6(b) show different views of a UV surface smoothing chamber for in-line or roll-to-roll processing.

Figure 7:
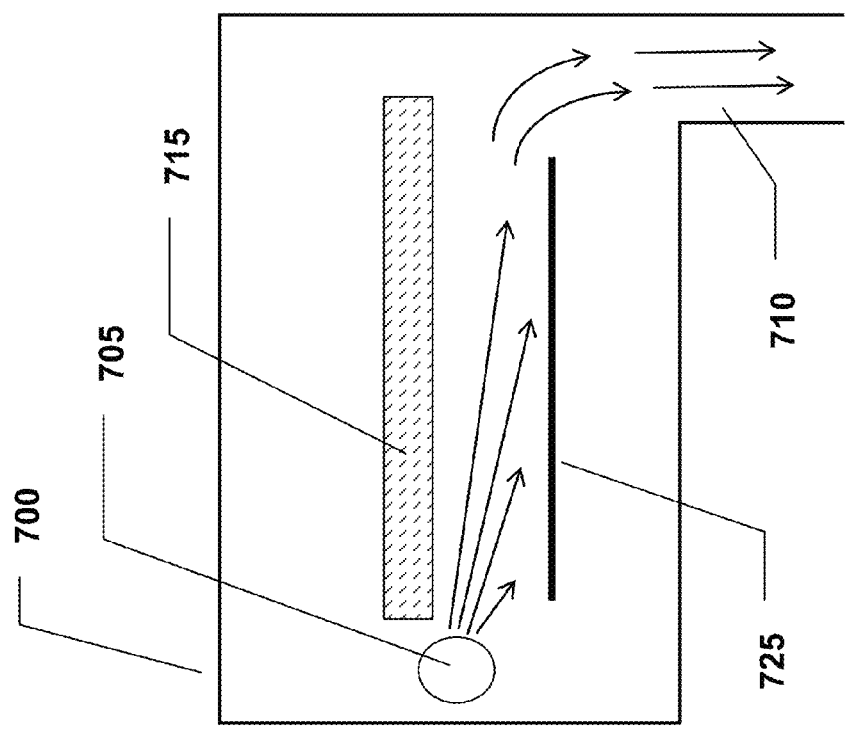

FIG. 7 shows a front view of a hydrogen/argon plasma surface smoothing chamber.

Figure 8:
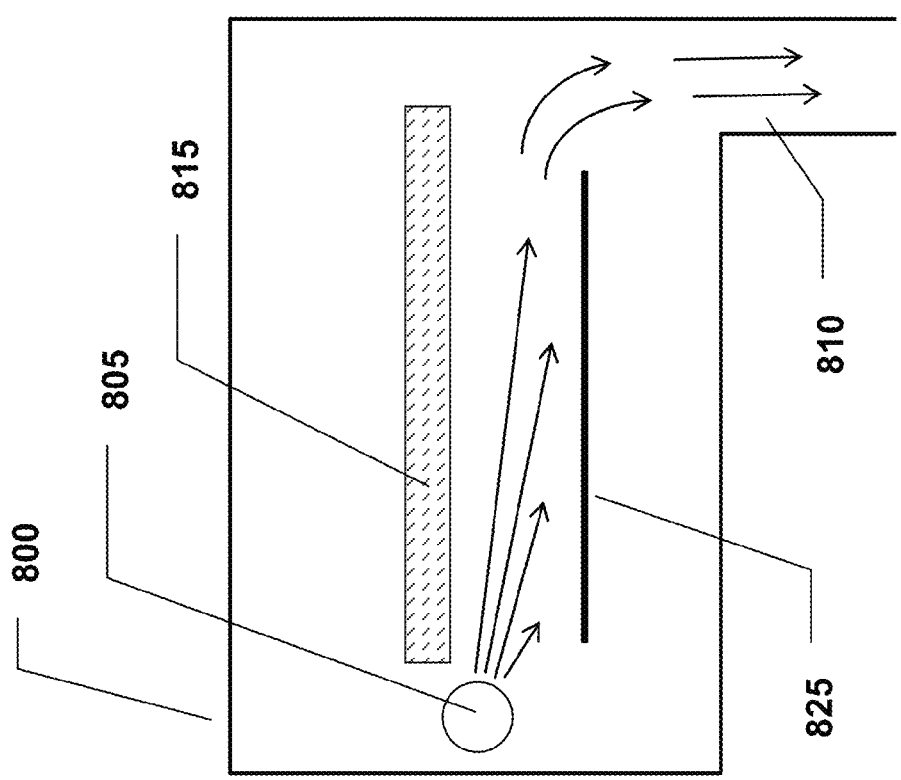

FIG. 8 shows a front view of a chamber for inert gas plasma-based substrate surface desorption and activation chamber.

FIG. 9 (a) shows on a microscale a common particulate on a contaminated surface as it comes for encapsulation process and 9(b) shows this same particle after ion bombardment smoothing.

Figure 10A:
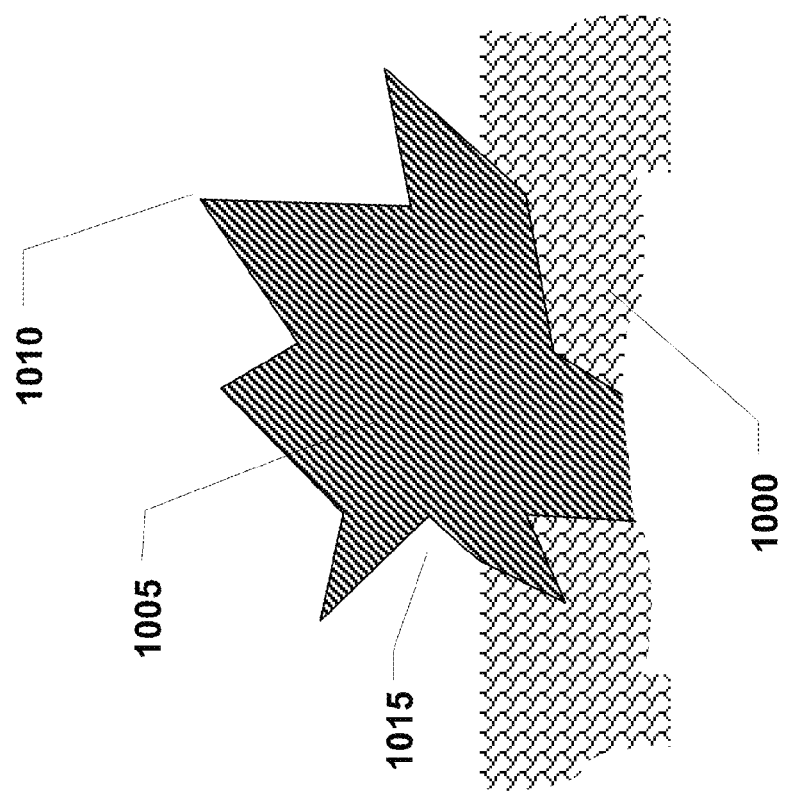

FIG. 10(a) shows the particles and substrate surface before deposition of the smoothing layer, while 10(b) is the surface after deposition/sputter etching of the smoothing layer.

Figure 11:
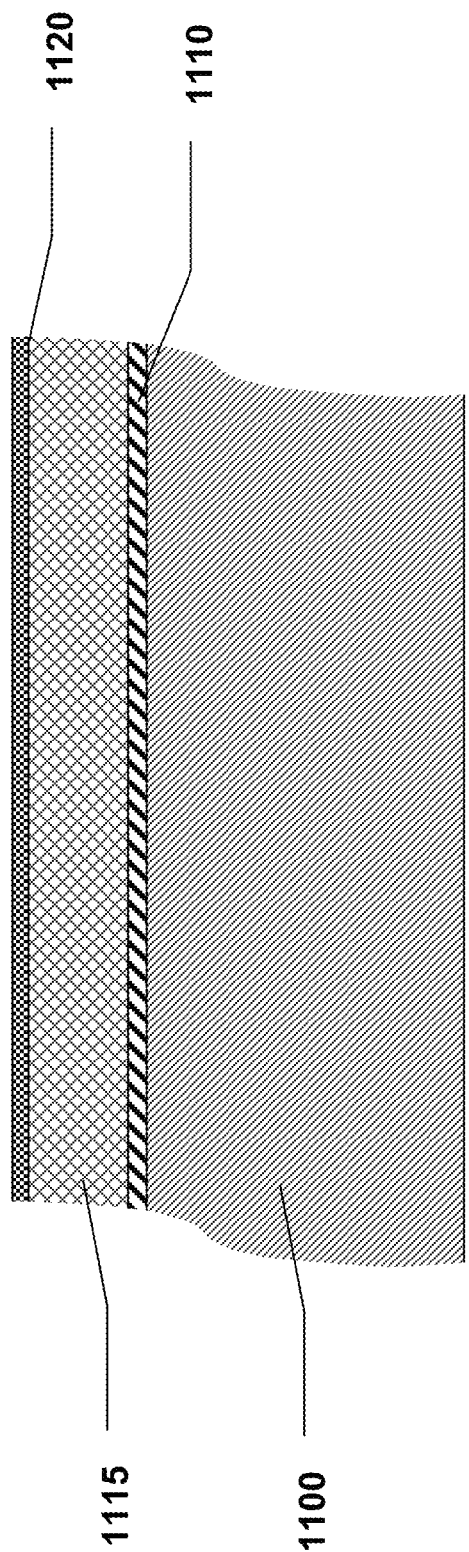

FIG. 11 shows a schematic structure of a smoothing layer using the disclosed process for tighter binding of particles within such layer and smoothing the exposed surface in preparation for barrier deposition.

Figure 12:
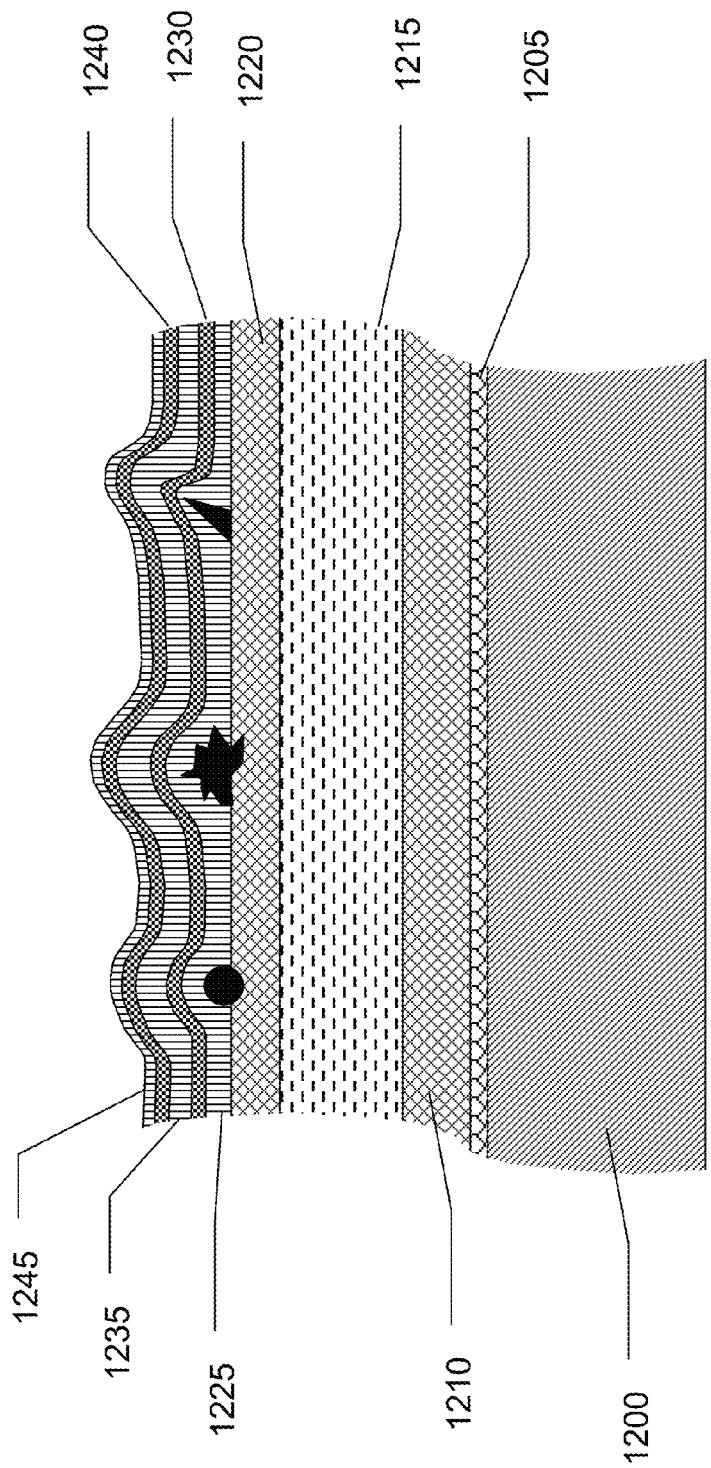

FIG. 12 shows a schematic of a CIGS or Organic photovoltaic device with a 5-layer encapsulation that also can serve as an anti-reflective coating and hard coating.

Figure 13:
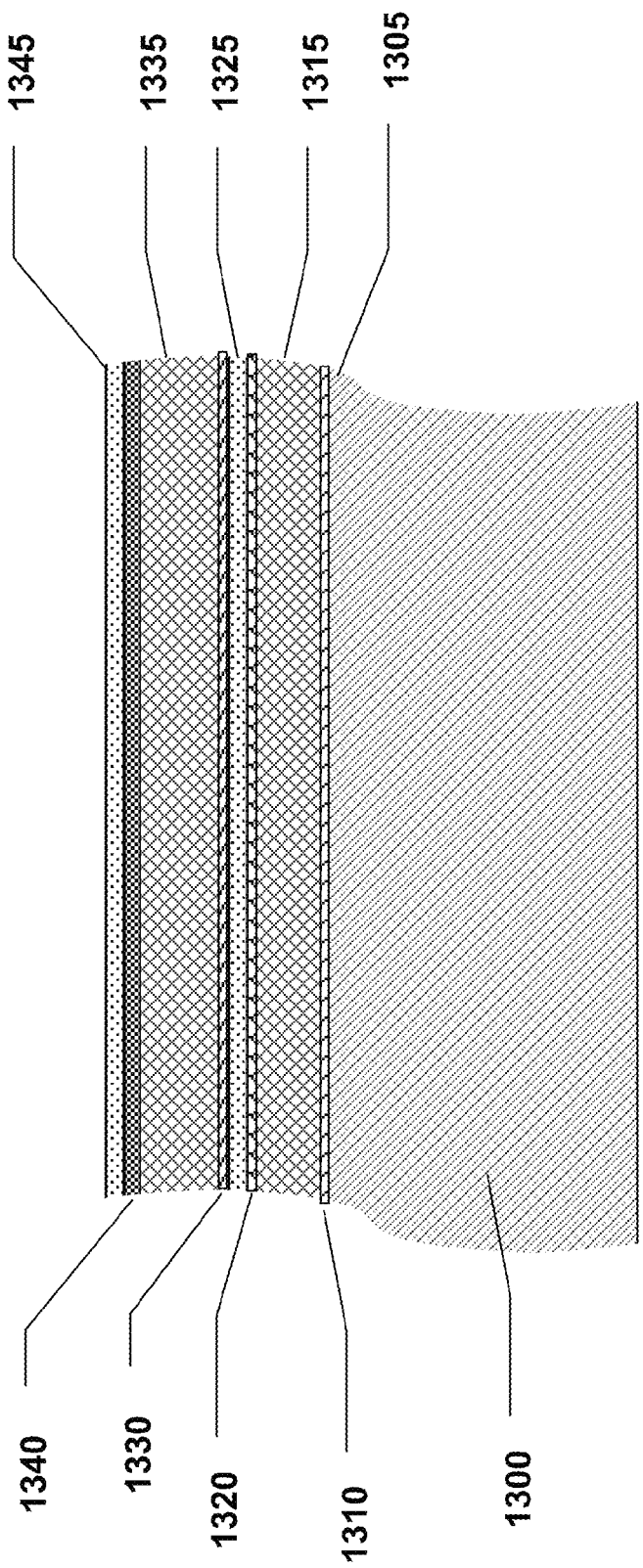

FIG. 13 shows a schematic of a two-dyad encapsulation using thick carbon-containing smoothing layers and thick silicon nitride barrier layers on an organic planarizing layer which may be for an OLED or PV device.

Figure 14:
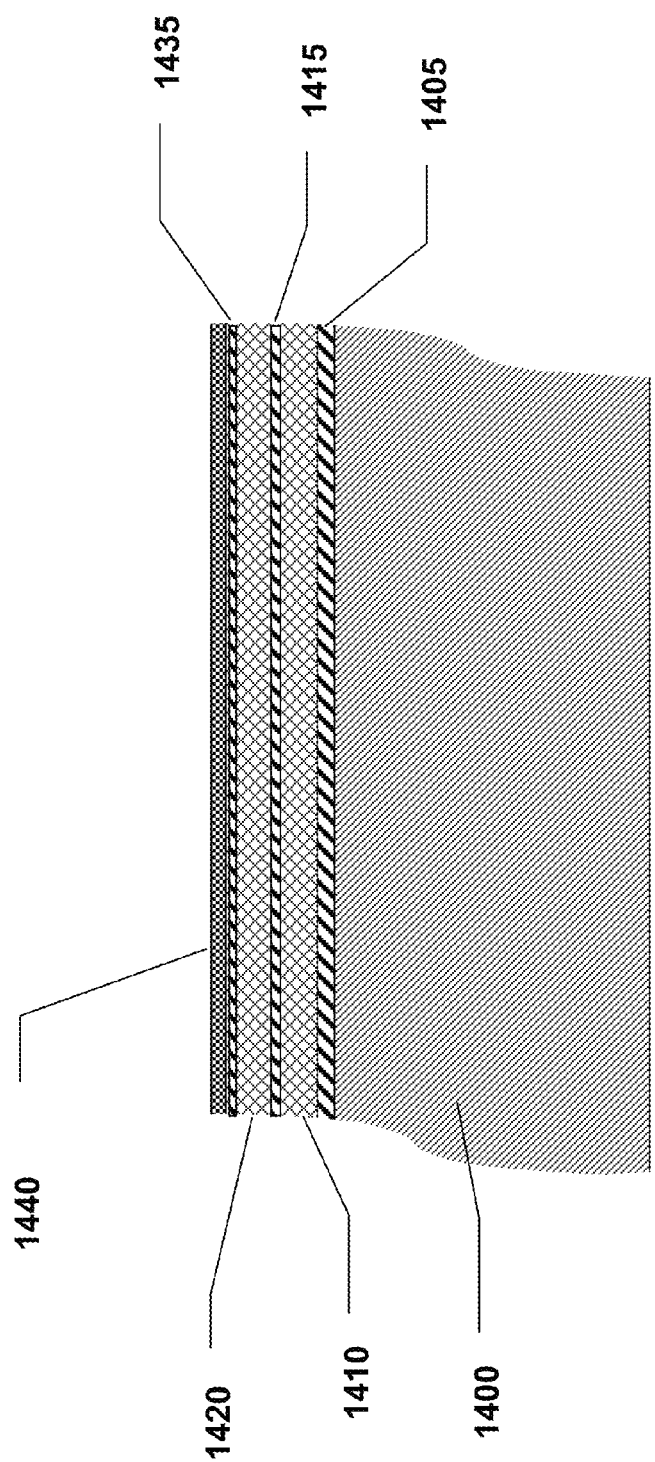

FIG. 14 shows a single dyad encapsulation having a carbon-doped dielectric smoothing layer and inorganic barrier layer.

Figure 15:
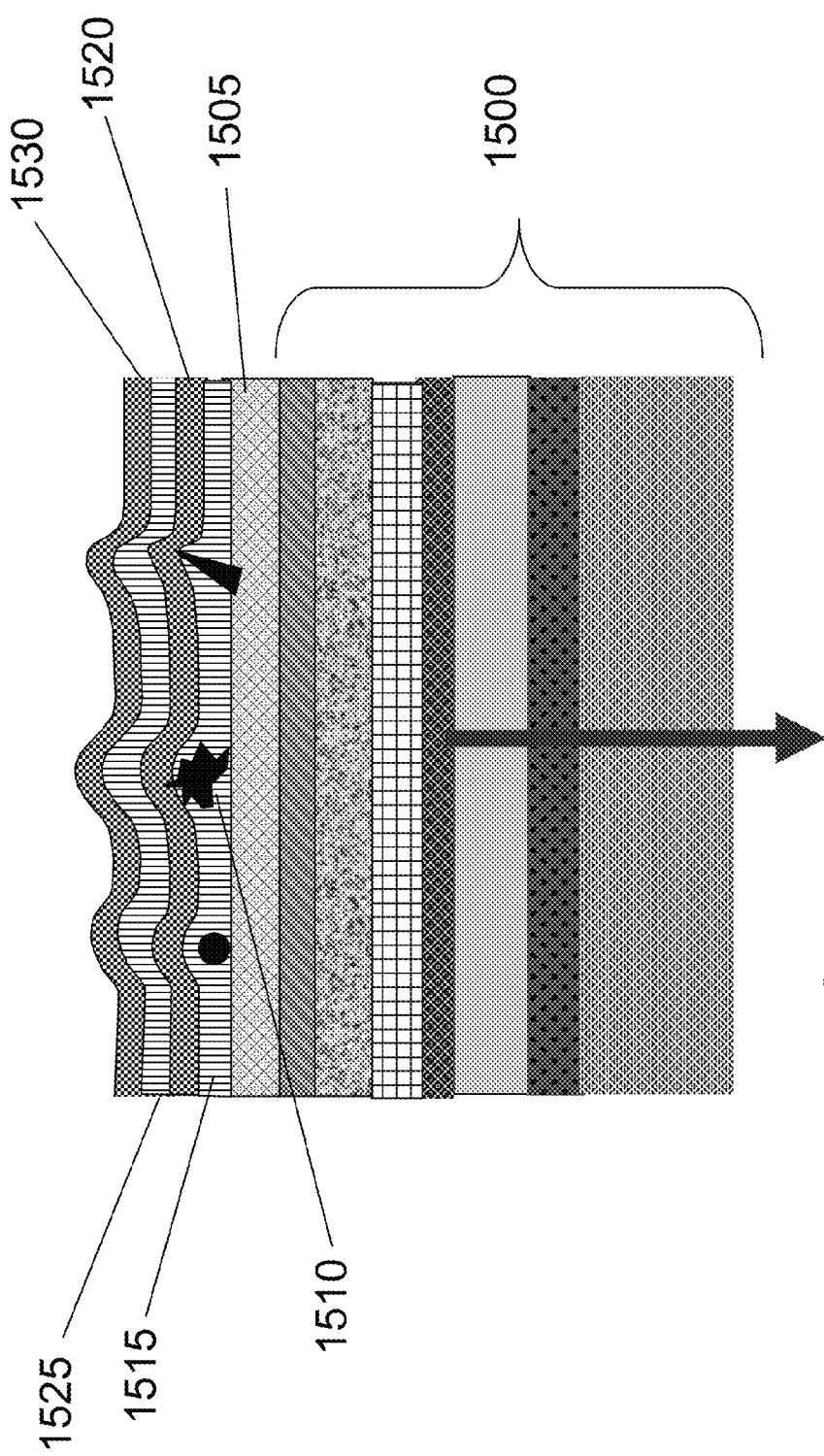

FIG. 15 shows an OLED flexible encapsulation process with thick carbon-doped smoothing and encapsulation layers showing smoothing over surface particles.

Figure 16:
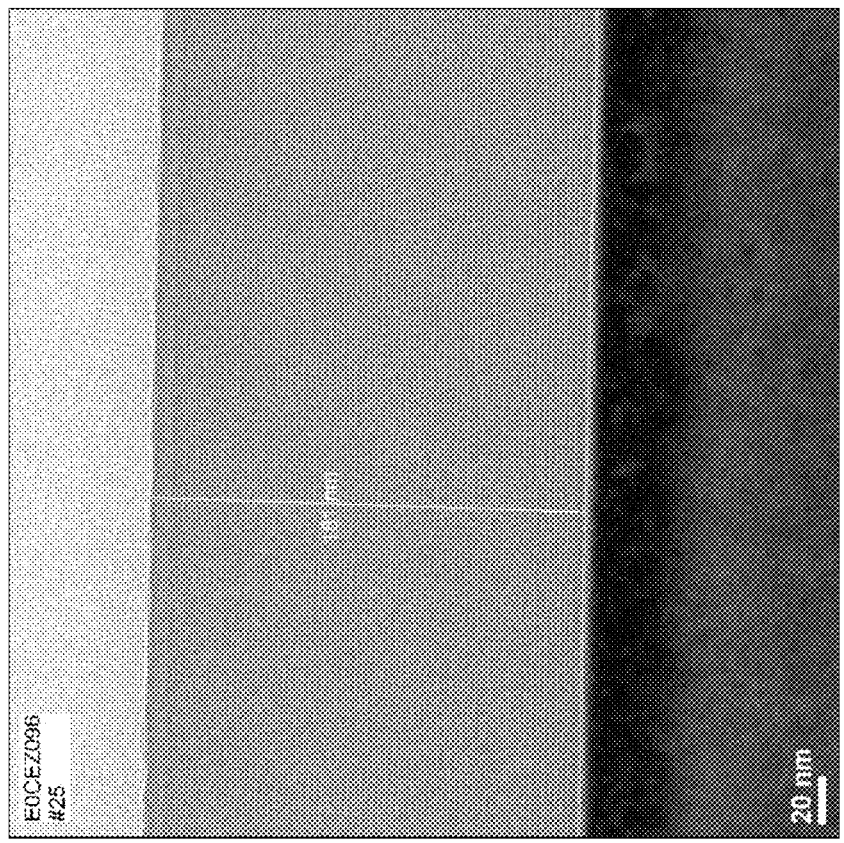

FIG. 16 shows a transmission electron micrograph of a single layer barrier film having nanoscale layering.

Figure 17:
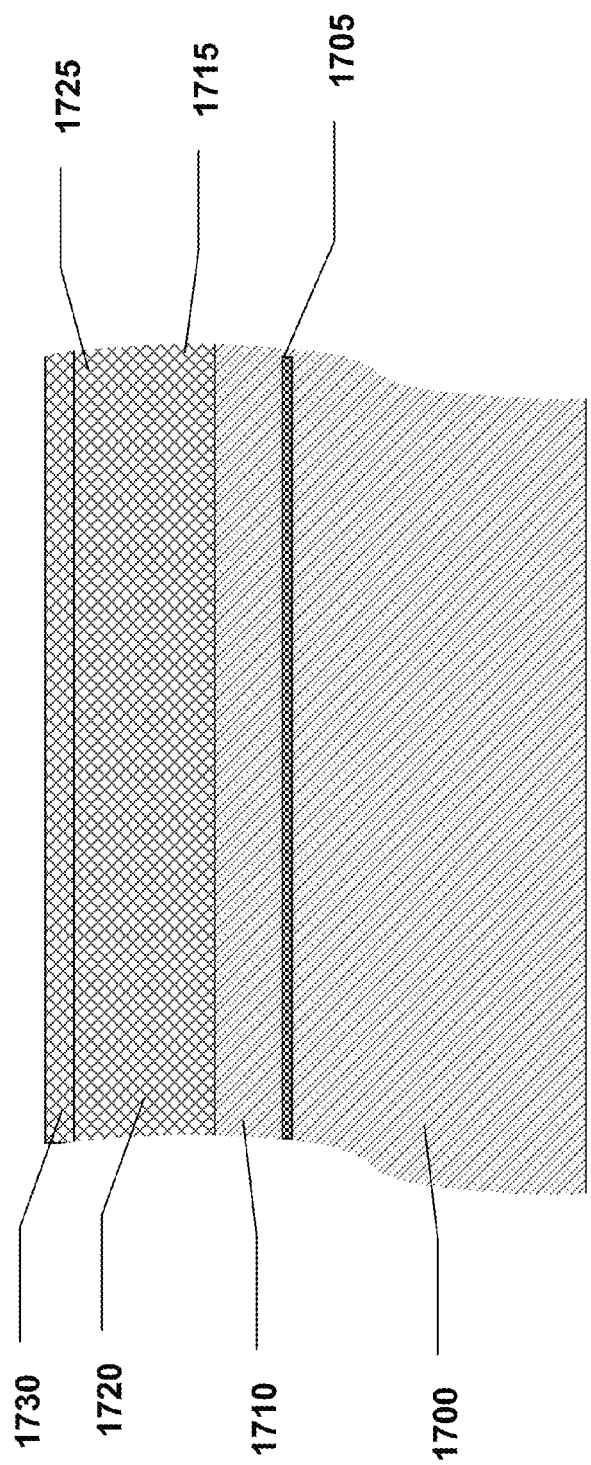

FIG. 17 shows a three layer anti-reflective coating for a plastic lens for a concentrated PV power conversion panel.

Figure 18:
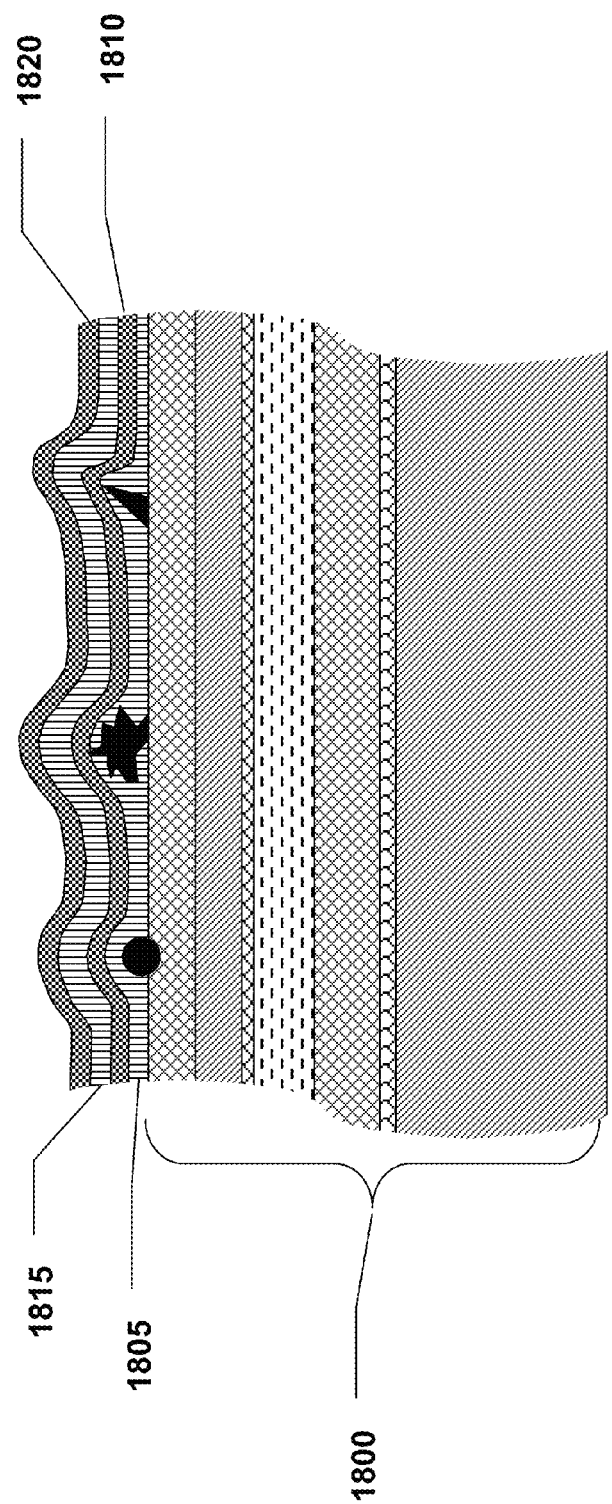

FIG. 18 shows an OLED device having a thick carbon doped smoothing layer and thinner mixed polymeric/non/polymeric barrier layer.

Figure 19:
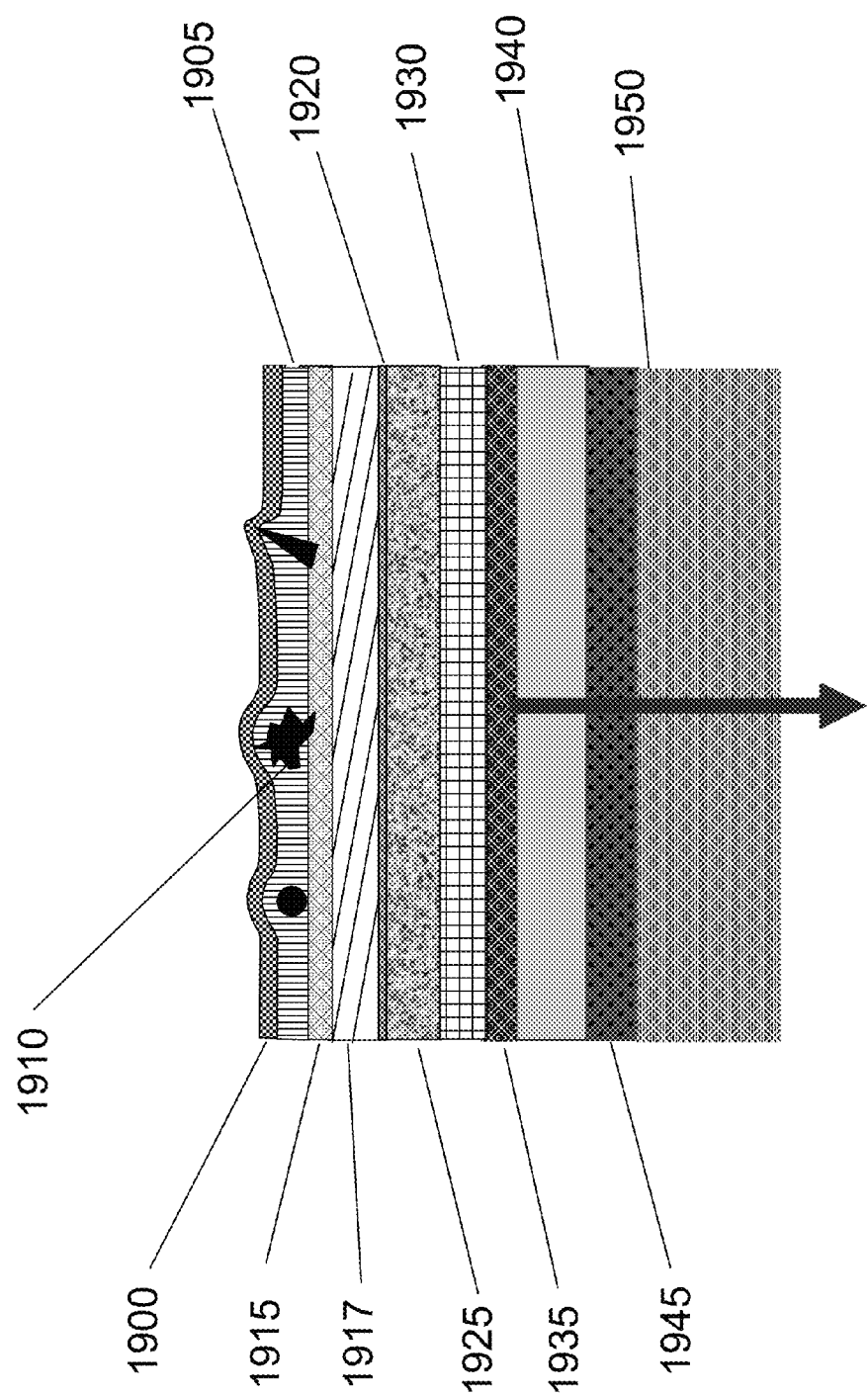

FIG. 19 shows an OLED device including a two layer barrier encapsulation where the layer of the device just under the encapsulation has particle contamination.

Figure 20:
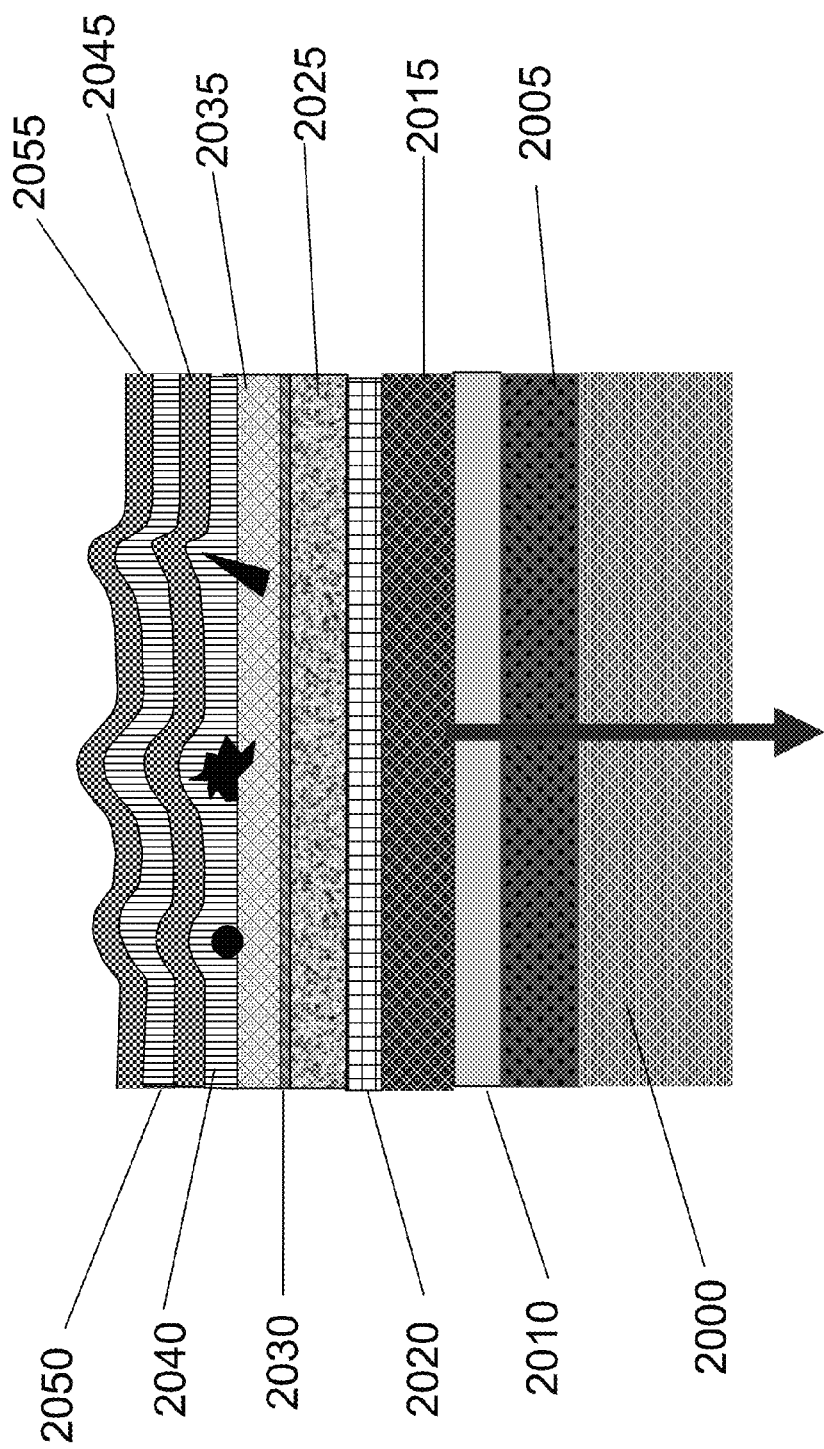

FIG. 20 shows an OLED device which has particle contamination and is encapsulated with a dual dyad, four layer structure including two thicker smoothing structures of carbon doped material and two thicker barrier layers of carbon doped material.

Figure 21:
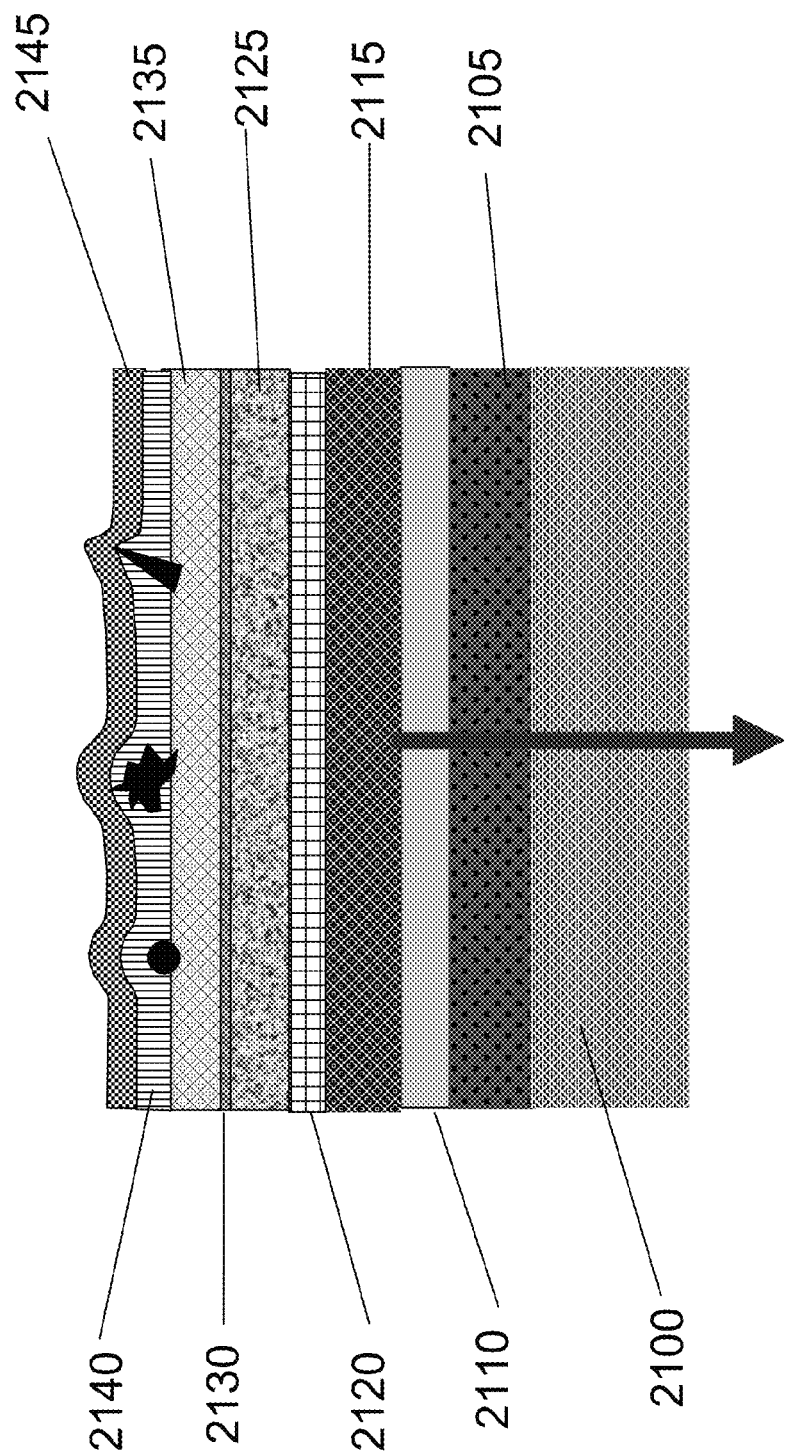

FIG. 21 shows an OLED device including two layer encapsulation consisting of thicker smoothing structure of carbon-doped material and thicker barrier layer of carbon-doped material.

Figure 22:
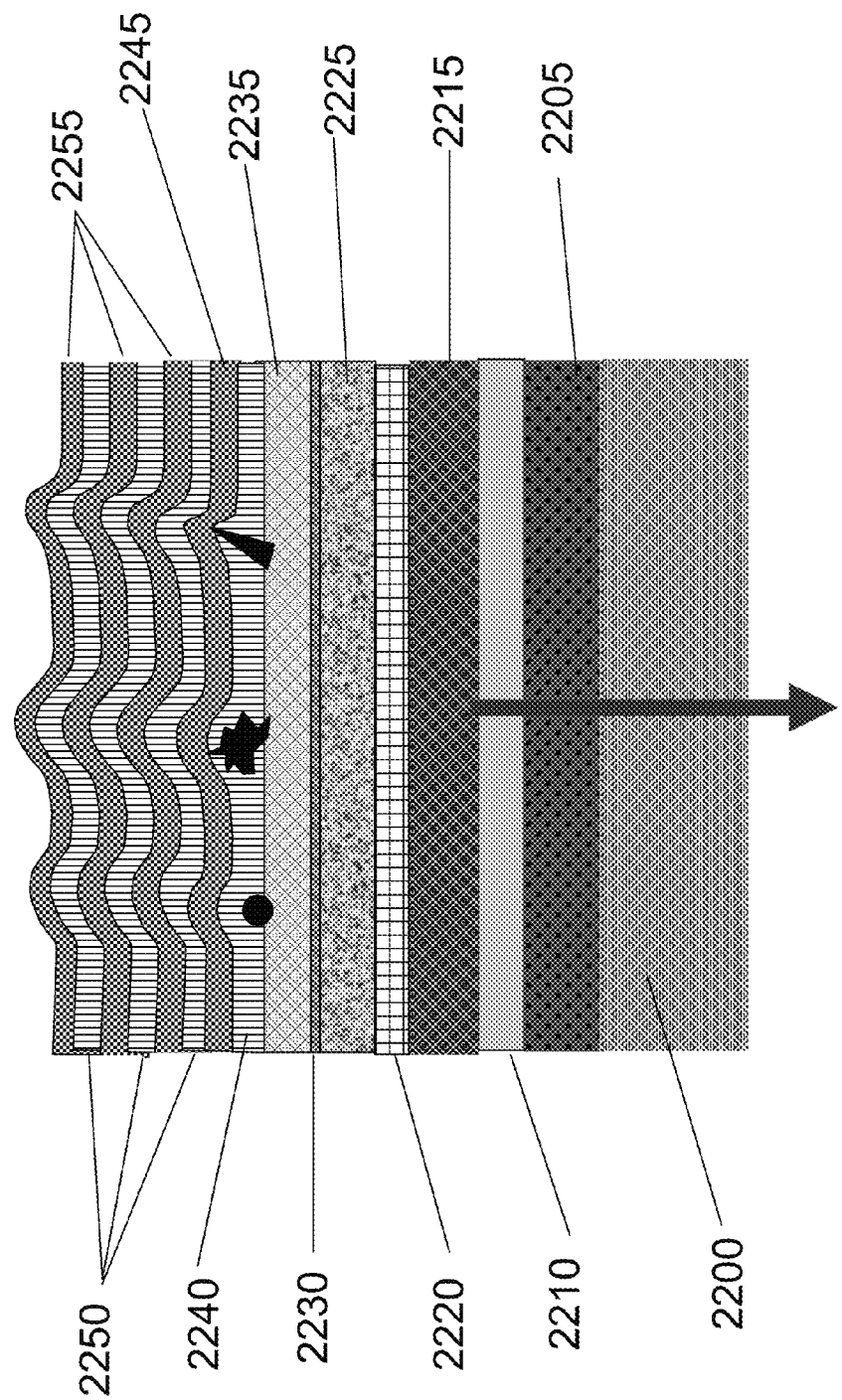

FIG. 22 shows an OLED device including 4 dyads of encapsulation each having a thicker smoothing structure and thicker barrier layer of carbon-doped silicon dioxide.

Figure 23:
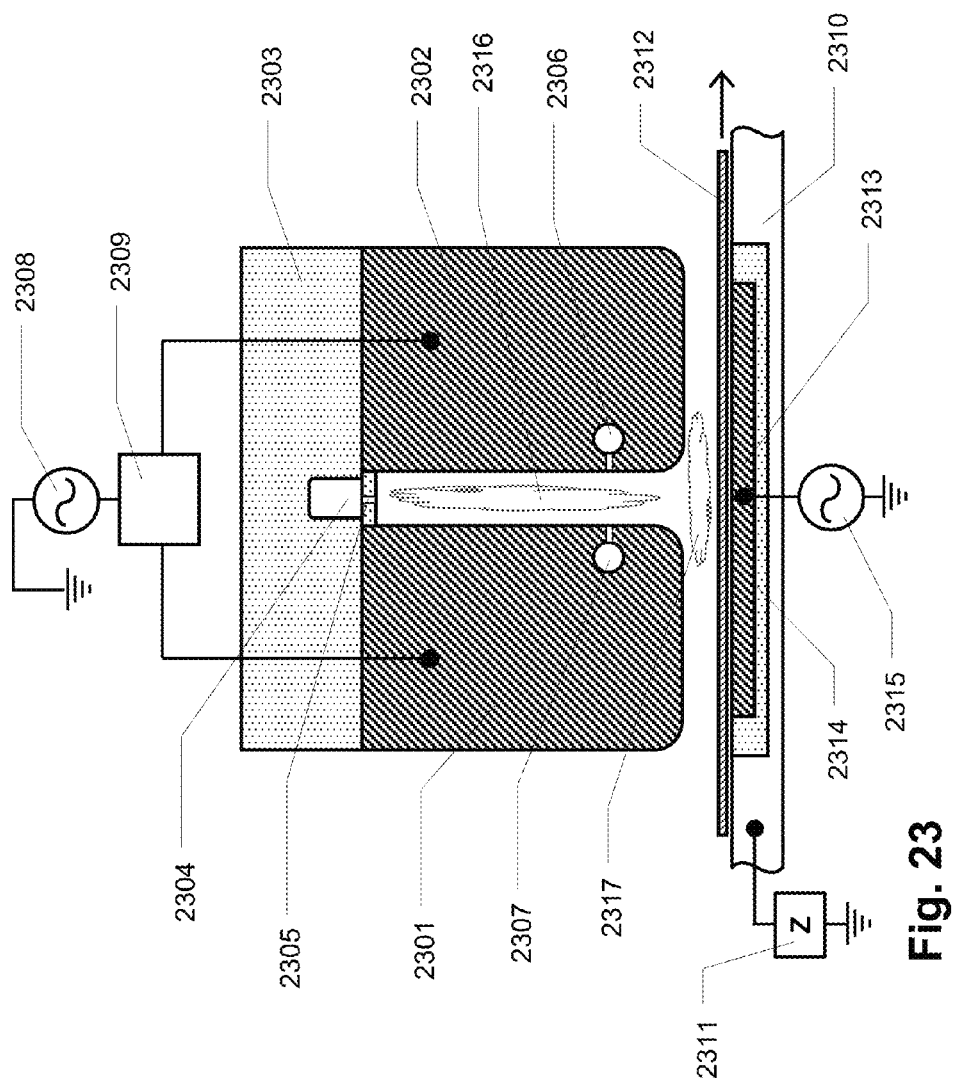

FIG. 23 shows a plasma source for depositing high quality silicon oxide or silicon nitride including a bias power electrode imbedded in the substrate support.

Figure 24:
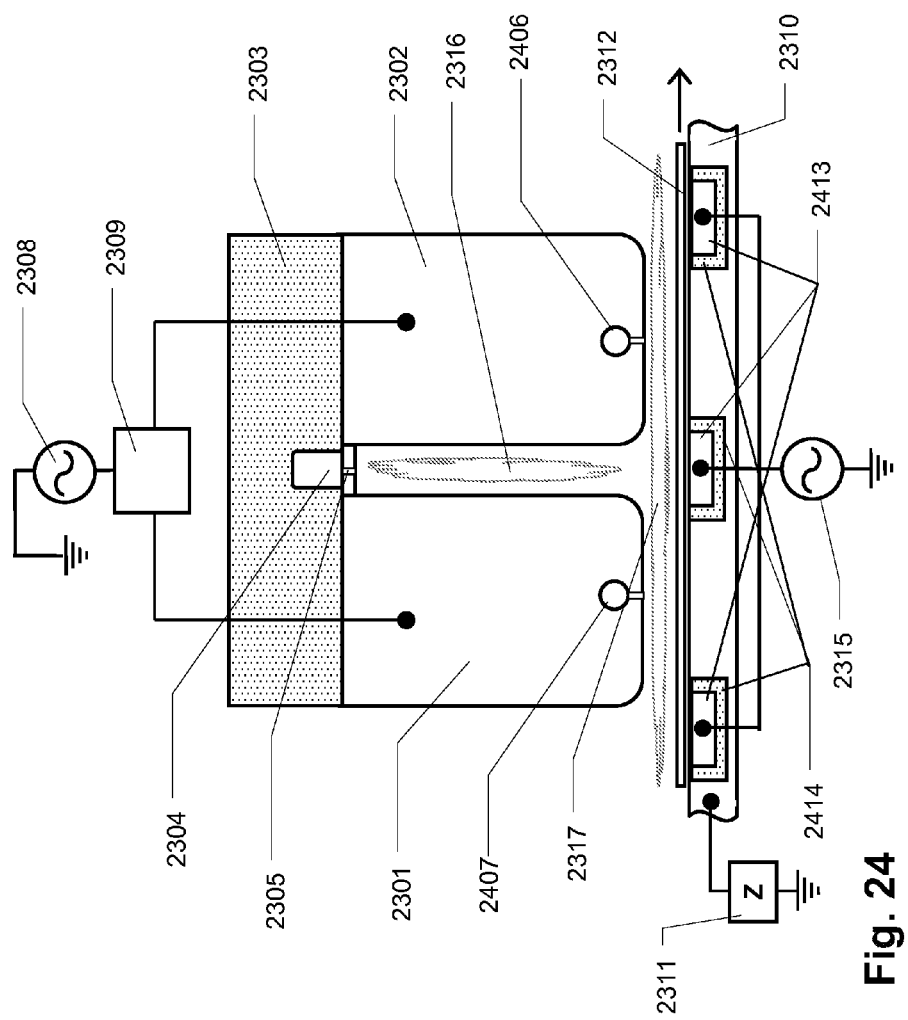

FIG. 24 shows a plasma source for depositing conformal dielectrics including carbon-doped silicon oxide, silicon oxynitride and silicon nitride.

DETAILED DESCRIPTION OF THE PREFERRED EMBODIMENTS

The present invention has utility as a coating process for either OLED or PV for any of the above applications, in some embodiments, may include various combinations of the process steps listed below. Typically, applications requiring ultraclean or defect-free coatings require more cleaning and surface preparation steps, and may benefit from more barrier or smoothing layers in the encapsulation. Coating applications that are not defect sensitive such as for optical coatings that are not hermetic encapsulation may require fewer or no surface cleaning steps, but may need more dielectric deposition steps in which layer thicknesses must be better controlled. In some example embodiments the temperature of the substrate may be less than about 150° C. Further, for OLED-based product manufacture the temperature should mostly be less than about 85° C. during the process. For example embodiments used for encapsulation of Organic PV the substrate temperature should be kept below about 100° C. for the majority of the process time and only very briefly and modestly above this temperature.

It is to be understood that in instances where a range of values are provided that the range is intended to encompass not only the end point values of the range but also intermediate values of the range as explicitly being included within the range and varying by the last significant figure of the range. By way of example, a recited range of from 1 to 4 is intended to include 1-2, 1-3, 2-4, 3-4, and 1-4.

Encapsulation for CIGS

A coating process for example embodiments for any of the applications of interest may include one or more of the following steps which may be in any sequence:

Physical Cleaning

The physical cleaning of the surface of the substrate that may remove particulate contamination. In some embodiments this cleaning may be cryokinetic or gas-based. These methods have been proven very effective in removing loose or weakly bonded particles from the surface. Removal of such a high percentage of larger particles is highly beneficial to defect density of an encapsulation coating and the ability of such a coating to avoid cracking as the substrate is flexed with bending radius less than 10 centimeters. Cryo-kinetic cleaning may be preferable since it has been shown to be exceptionally effective (>99% of particles larger than 100 nm in size) in particle contamination removal while not exposing substrates or sensitive materials to high electrostatic charge, moisture, oxygen or other contamination such as condensable organic compounds that might be damaging.

Surface Smoothing of Polymers

An etching step is provided for polymer-containing contamination using UV-based or reactive radical-based surface etching. This is intended to substantially reduce the size and number of organic particles on the surface, and flakes or protrusions from the surface of the substrate. This step reduces protruding organic materials by irradiating the surface with short wavelength UV radiation, mostly at shallow angles to the surface, so that it causes a minimum of erosion of the base organic material while having higher intensity and removal rate for protruding organic contaminant. Exposure to such hard UV, which may in some embodiments include Vacuum UV (VUV) may be accomplished by a light source with a window to prevent any exposure to the ionized gas used to generate the VUV. Exposure to VUV can also be accomplished by exposing the substrate directly to plasma without a window. Hydrogen plasma is particularly efficient at this. The advantage of not using a window is that all radiation generated by ionization can be transmitted directly to the substrate. The UV radiation is preferably of wavelength so that photons have the energy to break bonds in the organic material. This radiation may also remove much of the gaseous surface contamination that may be undesirable such as adsorbed atmospheric gases and organic gases including hydrocarbons, solvents or carbon dioxide. It also may break down and evaporate organic polymer that is often mixed with inorganic materials in small particles leaving substantially inorganic particles that are strongly bonded to the surface or partly immersed in it.

Surface Activation

Described herein is the surface activation or removal of atmospheric or organic gases from the surface and near surface region of the substrate that may be done by plasma exposure of the surface. In some embodiments, a gas or mixture is used in which oxygen is at most a trace constituent—less than 100 PPM. For some polymers and plastics, use of oxygen in amounts more than a few tenths of a percent will result in substantial surface modification and polymer backbone breaking. This can generally be done without concern for damage to the surface for some plastics having stronger backbone carbon chains, such as polyethylene naphthalene, or even polyethylene terephthalate, but not for some plastics such as acrylics or PMMA.

Controlling Material Properties of the Surface

Described herein are techniques for controlling material properties of the surface onto which encapsulation films will be deposited, which is needed particularly when coating plastics and polymers. This may be done in some embodiments by inserting silicon or metal atoms into the polymer backbone in the near surface region of the underlayer. This provides better bonding sites for the material to be deposited which helps improve film adhesion. This may accomplish one or more things: avoid un-controlled mixing of organic (C or H) content from the underlayer into the deposited inorganic material; form an extremely thin, mixed organic-inorganic layer for the substrate that may provide a superior base upon which an inorganic hard coating can be deposited; avoid ion damage to the polymer backbone of the under-layer in the near surface region that could affect the interfacial properties; avoid liberating into the plasma ambient the mainly carbon and hydrogen due to ion bombardment during the early part of the ensuing thin film deposition step. In example embodiments this may be accomplished in the following ways:

Direct implant of silicon or other inorganic (typically metal) ions at energies less than 500 eV by plasma immersion implantation from a low pressure silicon-containing plasma. This treatment may also leave a very thin—less than about 10 nm—layer of inorganic material that upon the surface that can provide benefits for ensuing deposition steps. The gas pressure in this process plasma may preferably be in the range between one Pascal and one hundred Pascals.

In some embodiments one may first deposit a very thin layer of silicon atoms by a deposition or coating process step. In some embodiments between about 1 nm and 10 nm thickness of a silicon or metal containing layer may be used. This step may be followed by plasma exposure or other source of ions at energies up to about 1000 eV, which bombards the surface to cause "knock-on" implantation of the surface silicon into the very near-surface (<100 Å) region of the plastic or polymer. The result is to provide doping of the near-surface region of the polymer.

After surface preparation step(s) above, the deposition of the layers needed for encapsulation may begin.

Smoothing Layer

Prior art methods for deposition of such smoothing layers generally suffer from poor barrier results. This may be due to their use of conventional plasma deposition or sputter deposition in which bonding of deposited material to surface particles is not as good and surface smoothing requires substantial thicknesses (>500 nm). Vapor phase deposited smoothing layers are very common and can provide a planarized surface but are generally very permeable. The disclosed process deposits transparent material and intensely ion bombards it to densely bind it to the surface particles and at the same time to sputter etch the surface to smooth both deposited material and protruding particles. This very tightly and seamlessly encases surface irregularities and tightly fills any gap between particle and surrounding new material. It covers some areas on top of said particles and fills in the volume around their base and may leave exposed parts at the top of the deposited film.

The disclosed method succeeds where the prior art fails because it more strongly bonds particles to a deposited layer and leaves the exposed surface smoother, providing a better surface for bonding the barrier layer upon it. This method and film thereby avoids micro-cracking between particles and barrier film when the substrate is flexed, or expands due to temperature increase.

In some embodiments such ion bombardment caused sputter etching may be simultaneous with deposition and provided by the same plasma sources when deposition is taking place. In some embodiments such sputter etching of the deposited smoothing film may be done after deposition by plasma sources in which little or no plasma-enhanced deposition is taking place. In such embodiments there may be alternation of deposition sub-steps with sputter etching sub-steps. In some embodiments there may be sputter etching at lower rates as deposition is taking place and higher rates between periods of deposition. The total amount of sputter etching may be a large fraction of the total material deposited so that the net deposition thickness may be a fraction of the total deposited. In some embodiments there is an alternation of layers of densified material deposited and exposed to intense ion bombardment and layers not subjected to intense ion bombardment.

Unlike prior art processes, total height variation of the surface need not be reduced by this process, just the vertical or overhanging slopes of the original surface. In some embodiments the deposited film thickness and the amount of sputtering may be sufficient so that nowhere does the entire resulting substrate surface have a slope greater than 70°. In some embodiments the total height variation of the surface features need not be decreased by this smoothing method. This results in a uniform hydrophilic surface on a dense and homogenous film structure so that the ensuing layer can have defect-free barrier function.

Such materials may be deposited with one or more linear plasma sources, relative to which the web or substrates are moved. In this configuration the deposition process is easily scalable to very large substrates as is important for lowering mass production costs. Depending on the specific deposited material, application, and process requirements the final thickness of the layer may vary between about 5 nm and 300 nm and falls into three categories based on film type and thickness:

Plasma deposition process of a small thickness of inorganic material, such as silicon dioxide, silicon oxynitride or silicon nitride in combination with sputter etching of the film deposited on the surface. Certain metallic oxides or oxynitrides, among others, may also produce high quality smoothing layers. The final thickness of the deposited layer (including effects of both deposition and etching) may be less than 100 nm and in some embodiments as little as 5 nm. Said layer may be so thin in some embodiments that it has elasticity substantially greater than that of the bulk inorganic material.

It may in some embodiments be preferable to deposit a smoothing layer that may be thicker (10 nm to 1000 nm) and more elastic than the pure inorganic materials (i.e. metal oxides, or silicon oxide, silicon nitride or silicon oxynitride). In some embodiments such material may be substantially an oxide, oxynitride or nitride of silicon or a metallic element that has a small (0.5% to 5%), additional content of carbon.

As used herein and unless stated otherwise percentages as they relate to atoms or molecules are in total weight percent.

The addition of the carbon to the films, even in such small concentrations increases the yield strain level of the films—elasticity—and decreases the brittleness of the films. Such mixtures can be more tolerant of flexure or stretching than purely inorganic films. This material may be beneficially employed for coating applications for weatherable and/or flexible products of all types, including but not limited to photovoltaic and OLED. For photovoltaics this layer may in some embodiments, when layer thickness is suitable, serve as one layer with a higher or lower refractive index, of an anti-reflective and anti-scratch coating in addition to encapsulation. For OLED or for PV such thicker smoothing layers may advantageously permit surface smoothing for larger particles not adequately covered and smoothed by a purely inorganic thin layer.

a. Such material has previously been used as a "smoothing" layer in the prior art but with poor results. This is generally because they deposit poor quality material immediately surrounding particles resulting in weak binding of the material to the particle, and do inadequate smoothing of the surface after depositing this layer. In the disclosed technology, because of the use of intense sputter etching during the deposition of at least one part of this layer, in some embodiments, the surface after deposition will have virtually no steep (micro or nano-scale) protrusions which would cause the barrier layer deposited over it have a porous structure inadequate as a hermetic barrier or too steep to allow formation of a tight barrier on top. The disclosed method in example embodiments substantially eliminates overhang of any part of the surface with respect to any other area, so that virtually every area of the surface has a slope less than approximately 70 degrees relative to the gross substrate plane.

In some embodiments this layer may have polymeric as well as silicon or metal non-polymeric content such that it is both transparent and elastic enough to permit flexing the substrate or allowing for its thermal expansion. Such a layer may be called "heavily carbon-doped" oxynitride, oxide or nitride material. Typically may be deposited by using a feed gas or mixture of gases that together contain silicon or metal, along with carbon and hydrogen, and sources of nitrogen, oxygen or both. Preferably this layer is less than about 1000 nm thick and may contain from 5% to about 30% polymeric content. In some embodiments for the subsequent barrier layer to be truly defect-free, there may be substantial ion bombardment occurring as the deposition of this layer is begun. In some embodiments the ion bombardment may be reduced during one or more periods during deposition of the full layer. Too much ion bombardment during growth of thicker films may produce unacceptable levels of compressive stress in the film that may cause substrate "curling". In some embodiments intense energetic ion bombardment may be used for only part of the deposition of thicker films. Soon after beginning deposition, intense bombardment resulting in sputter etching of the surface densely fills around the particles and into its recesses, to tightly encase it and by sputter exposed protrusions to assure that the surface after deposition meets the above state smoothness requirement. In some embodiments sputtering etching may be reduced gradually or abruptly after the first 5 nm to 30 nm has been deposited, and may in some embodiments be increased again during the course of completing deposition. Such sputter etching may also be used during or just following deposition of one or more sub-layers of the deposited material. Such process leaves the surface much smoother, even when larger particles had remained before starting formation of this layer. Once this layer is done the surface is ready for deposition of the barrier layer.

The Barrier Layer

The barrier layer is substantially transparent to visible light and is impervious to gas so that diffusion rates of water vapor or oxygen through it are very low, typically between about $10^{-3}$ grams/m$^2$/day to about $10^{-8}$ grams/m$^2$/day. However, for the barrier to function properly it must be homogeneous and dense material grown at uniform rates over the entire area to be covered. Uneven nucleation and growth are likely to cause leaky spots, especially if the film is less than about 50 nm thick. There may in some embodiments be at least three types of barrier films grown:

First, a dense and homogeneous substantially inorganic material from 10 nm to 100 nm thickness having less than about 0.5% carbon content. In some embodiments it may mostly consist of metal or silicon compounds or both. When deposited on top of a smoothing layer with a uniform hydrophilic surface as disclosed this film will have a dense and homogenous structure. This results from uniform nucleation and growth with ion bombardment of all areas of the film during deposition. There are then far fewer leaky defects in it than competing barriers. Such materials may be deposited with one or more linear plasma sources, relative to which the web or substrates are moved. In this configuration the deposition process is easily scalable to very large substrates as is important for lowering mass production costs. This barrier has superior moisture and gas barrier properties even with less than 50 nm thickness, though in the case of rigid substrates this layer may have thickness greater than 100 nm.

In some embodiments the barrier layer may contain at least one of an oxynitride or nitride of one or more of silicon or metal or both along with additional content between 0.5% and 5%, of carbon and hydrogen. The addition of the carbon to the films, even in such small concentrations, increases the yield strain level of the films—elasticity—and decreases the brittleness of the films. Such mixtures can be much more tolerant of flexure or stretching than purely inorganic films. Such barrier layer may in some embodiments be much thicker than the pure inorganic layer described immediately above. Preferably, for cost considerations, this layer may be less than about 300 nm thick—about a factor of 10 thinner than some barrier layers made of similar materials—so that the cost of the encapsulation or other process is minimized to make such products competitive in the largest possible markets. This material may be advantageously employed as barrier material for weatherable and/or flexible coatings of all types, including but not limited to photovoltaic encapsulation and OLED encapsulation. For OLED or for PV such barrier layers may advantageously permit effective, leak-free encapsulation for larger particles not adequately covered and smoothed by the smoothing layer. In some embodiments, the combination of nitrogen content of the layer, its greater thickness and its elasticity result in a reduction in defects that would allow moisture or gas penetration.

A third group of example embodiments for the barrier uses layers of mixed polymeric and non-polymeric material that may be even thicker than the lightly carbon doped films immediate above. In this case the polymeric content may be from 5% to 95% and the non-polymeric content from 95% to 5% while preserving barrier properties and transparency. In some exemplary embodiments the polymeric content may be from 5% to 20%. The thickness of the barrier film for such material may be between 300 nm and 5000 nm and in example embodiments it may have carbon as a constituent in addition to at least one of silicon and metal. The material in example embodiments may be substantially an oxide, a nitride or oxynitride.

In some embodiments the steps above may be done in a sequence having cleaning and preparation steps first, then including multiple smoothing and barrier layers—not necessarily equal in numbers—to provide a commercially competitive barrier. In some embodiments the smoothing and barrier layers may be done in alternating fashion once or more. In some cases there may be more than one smoothing layer consecutively before a barrier layer—smoothing or barrier layer may be done repetitively without alternation when needed to decrease defects in the encapsulation. The specific encapsulation architecture may be tailored to the requirements of the application and manufacturing process to provide a multi-layer barrier which is impervious to moisture and oxygen.

For OLED displays or OLED lighting panels providing encapsulation resistant to moisture and oxygen transmission and avoiding defects that cause air leaks is very important. Surface particle contamination cannot be completely eliminated from substrates or device structures ready for encapsulation in manufacturing for the above products. Particle densities on substrates prior to encapsulation typically vary from $10^4$ to $10^5$ per square meter. In some embodiments of the disclosed process both cleaning to reduce such high particle counts and treatment to reduce surface micro-scale roughness may be done before depositing encapsulation layers to reduce or eliminate leaky defects in the barrier. Typical requirements for OLED substrates following encapsulation range from about 30 defects per square meter to one or less for large screen OLED products. This is a factor of 100 to 10,000 reduction in defect density and requires most aggressive measures to accomplish. In more sensitive applications, such as OLED, multiple pairs of smoothing and barrier layers alternating may be helpful to meet such defect density requirements. Hereafter we will call a pair of layers including a smoothing layer or layers and barrier layer together a "dyad".

OLED display or lighting devices, or thin film PV devices may be made on transparent plastic or opaque metal films that may be supplied on rolls, such as PET, PEN, acrylic, polyimide, aluminum foil or stainless steel. Such plastics or metal substrates may have different thermal expansion coefficients from the deposited layers, or may be subject to flexing. When the finished product must flex or expand due to substrate temperatures up to about 80° C., it may expand more than an inorganic hard coating could accommodate, and microcracking of inorganic layers may result. Such microcracks in barrier layers destroy the hermetic protection capability of encapsulation and must be totally eliminated for applications on sensitive materials. In these cases a more flexible encapsulation must be made.

In some embodiments the encapsulation may incorporate at least one thin inorganic transparent barrier layer, and at least one very thin smoothing layer of transparent inorganic dielectric, as described above. Such may be flexible and elastic if the total thickness is less than 50 nm. However, in some cases when larger particles are numerous on the substrate, it may be necessary to have more smoothing layers (each with a capping barrier layer) or fewer but thicker smoothing layers and barriers—both resulting in reduced end product flexibility if inorganic materials are used. In this case doping such basically inorganic materials with a small percentage of carbon makes smoothing layer or barrier layer thicker and yet elastic enough so flexing or large temperature ranges may be tolerated. For encapsulation of such substrates, in some embodiments a thicker, carbon-doped smoothing layer having at least one thin band within that is deposited and subjected to intense sputter etching, may be combined with a very thin (<50 nm) inorganic barrier layer to produce a dyad structure that may provide better smoothing of substrate surfaces having substantial particulate contamination and other defects. Such dyad structure, singly or in multiple thickness, is tolerant both of small radius flexure and thermal expansion of the substrate. Carbon content of 1% to 3% does not adversely affect the transparency of the film but does cause bulk material properties of the smoothing layer to be more elastic so that 1% expansion of the substrate relative to the encapsulation is still within its strain limit. In other embodiments a carbon-doped smoothing layer can be combined with a thicker carbon-doped barrier layer to produce a thicker dyad that tolerates larger initial substrate defects and remains leak free. In general, the thicker the total encapsulation the more expensive the process. Thus, applications more tolerant of defects (such as PV modules) that are more cost sensitive may in some embodiments have less dyads and smaller total encapsulation thickness. The particular combination of materials and thicknesses for encapsulation in the disclosed technology providing the best product yields at most competitive cost will depend to some extent on the particular product and the preceding manufacturing processes.

For highly defect-sensitive flexible OLED products, where large particles or defects on the surface are numerous as barrier coating starts, there will be less defects if smoothing layer and barrier are both thicker and elastic. This may be achieved in some embodiments using dielectrics substantially consisting of silicon or metal, or mixtures thereof, that are lightly doped with carbon. In some embodiments smoothing layers may be oxides, or oxynitrides while barriers may be nitrides or oxynitrides. This thicker structure reduces the defect density relative to encapsulation structures having thinner barrier layers of inorganic material due to the elasticity of the barrier layer and more conformal coating of the particles that protrude from the surface. Because the carbon-doped silicon or metal oxynitride or nitride is more elastic than pure inorganic material, the disclosed methods allow electronic devices on flexible substrates to tolerate large temperature changes such as required for outdoor use such as in solar farms in desert climates: from −40° C. to 85° C. or to be flexed with bending radius less than 10 mm without microcracking.

In some example embodiments for high levels of surface contamination or defects on the substrate there may be a single, thick barrier layer on a single smoothing layer. The thicker barrier which may be substantially an oxide compound, such as of silicon or metal or mixture thereof, with between 5% and 20% polymeric content (the remainder being non-polymeric) is impenetrable to moisture due to its density and the bonding, and by virtue of its thickness it is much less likely to result in leaky defects as it covers particles on the surface of the substrate in encapsulation.

In some embodiments there may be a complete encapsulation coating made substantially of a single carbon-doped material containing at least one of: silicon oxynitride, silicon nitride, silicon dioxide, metal oxynitride, metal nitride, oxynitride or metal oxide. In some embodiments such encapsulation may be predominantly silicon nitride or silicon oxynitride. In some embodiments this material may have carbon content up to 3% with bands of differing carbon content at different depths, some of which serve more to smooth the surface while other bands serve more as a barrier. Two adjacent depth bands could be considered to define a dyad and the encapsulation in some embodiments may have two or more such dyads whose layers may have different thicknesses and differences in chemical composition. In some embodiments where there are three or more depth regions, the smoothing and barrier depth regions alternate to give one or more dyads. The smoothing bands may be formed by combining plasma deposition and intense sputter etching and have less carbon content. A depth region with greater carbon content which may be considered as barrier may be formed with substantially less ion bombardment so that carbon content is higher and intrinsic film stress is less.

The structure of the finished encapsulated OLED device in some embodiments may include the multi-layer encapsulation covering a top layer electrical conductor (which may be a transparent conducting oxide material such as indium tin oxide or zinc aluminum oxide). The cathode may be a very thin (<100 Å) layer of metal having a low work function. Next is the electron transport layer, which conducts electrons to the surface of the OLED material, and then the organic light emitting diode (OLED) layer, which efficiently emits light as electrons pass through it and then a phosphor layer. The hole transport layer is immediately below the phosphor and is transparent, as is a bottom TCO layer that is on the plastic or thin glass substrate.

The structure of the encapsulation coating for thin film PV modules such as CIGS and OPV, in some embodiments may also be a hard protective coating and an anti-reflective coating to enhance efficiency and increase panel lifetime. The coating in some embodiments may have as few as one high refractive index (RI) barrier layer alternating with two low RI smoothing layers, or have up to 10 high RI barrier layers alternating with 11 low RI smoothing layers. It is generally to be preferred for the sake of cost savings to have between 2 and 4 low index layers and 1 to 3 high index layers. The thicker layers in some embodiments may be elastic, carbon-doped inorganic material because even a modest concentration of (1% atomic to 3% atomic) carbon in the film makes its bulk material properties modestly elastic, and the thinner, inorganic barrier layers may be elastic because of their nanoscale thickness. This coating when applied to photovoltaic panels may be an anti-reflective coating that is hard so it also prevents scratching by dust or during cleaning. It is weather-able because the elasticity enables it to avoid cracking when high temperatures cause the substrate to expand. The total thickness of the layer in some embodiments may be between 300 nm and 5000 nm, and preferably between 300 nm and 1000 nm. This substantially improves the overall lifetime and value of photovoltaic panels that will be used outdoors and their effective levelized cost of energy (LCOE).

The completed CIGS or Organic PV device including the encapsulation process would have an architecture optimized for both cost and efficiency: encapsulation would, in some embodiments be positioned directly upon a transparent conducting oxide (TCO) material that conducts the electric current generated by the CIGS PV or OPV layer underneath it. Said PV layer, is formed of either copper-indium-gallium-diselenide or organic photovoltaic material, or a combination thereof and is positioned upon another conducting layer which may be transparent or metallic and this layer is supported by an insulating layer or by the substrate itself if it is plastic, glass or other insulator material.

We believe that in the case of CIGS modules this technology can reduce the levelized cost of energy (LCOE) by up to 25% relative to alternative encapsulation technologies, and 15% for OPV modules, due to increased efficiency of conversion as well as the increased module life and cost savings from elimination of top cover glass or plastic.

In example embodiments the disclosed technology for forming anti-reflection (A/R) coatings can also provide hard, weather-able A/R coatings for large area inexpensive plastic (Fresnel) lenses for concentrated solar modules (produced by companies such as Amonix). Such coatings would have a similar layer structure to that for CIGS or OPV encapsulation as described above. However, this application requires no hermetic encapsulation so there is no need for sputter etching in the smoothing layer deposition. In fact, there is no smoothing layer, but rather may in some embodiments just be an elastic low RI layer that may be carbon-doped silicon dioxide. In example embodiments this method may be used for making such A/R hard coatings on plastic such as acrylic, kapton or PET that will be resistant to cracking due to thermal expansion of the substrate. Such coatings can be made without concern for defects and barrier properties since the Fresnel lenses are not moisture or oxygen sensitive. In this case, since cost per Watt is of overriding importance one would use A/R coatings with minimum total thickness of combined low RI layer and high RI layer. Such an A/R coating might in some embodiments have as few as two low RI layers and one high RI layer. An alternative A/R coating for greater hardness and anti-reflective efficiency may have up to 4 low RI layers and three high RI layers such as have been described.

In some embodiments the disclosed encapsulation may be done on a bare or pre-coated polymer substrate to protect materials that will be deposited later above the barrier film. In some embodiments the barrier deposition method is used to cover materials or devices that have been built underneath such as organic LED or PV materials or electrically conducting metal oxides or metals already deposited on the substrate.

The disclosed method addresses in a very efficient way the root causes of defects in hermetic or other hard coatings and thereby provides a highly cost-effective and competitive solution to the current need for a very low defect barrier for OLED, organic PV, CIGS PV and other highly moisture sensitive devices. It further provides coatings on plastic or polymeric substrates that are capable of adapting to temperature changes without cracking or peeling—weatherable coatings that can function as anti-reflective coatings and protective hard coatings for outdoor use. It therefore offers considerable economic benefit for production of PV, lighting and display devices.

The cleaning and/or surface preparation and/or deposition processes in some embodiments such as the above may be implemented in coating systems that are for in-line processing or roll-to-roll processing. Said processes may in some embodiments be performed using plasma enhanced processes in which linear plasma sources are used. Arrays of such linear sources may be well suited to depositing multi-layer films such as those described above. The configuration of the linear sources may be of many types, possibly as described in US Patent Application Publications 2011/0005681 A1, 2011/0005682 A1, 2011/0006040 A1, and 2012/0225218 A1. For the steps where oxide, nitride or oxynitride films are deposited, one or more reactant gases or a mixture may be injected into a plasma region of said linear sources. Herein are produced the radical species which then mix with and react with at least one silicon, metal or carbon-containing precursor gas that is injected nearer the substrate to provide at least one of the elements: silicon, metal, carbon for the growing film.

Figure 1A:
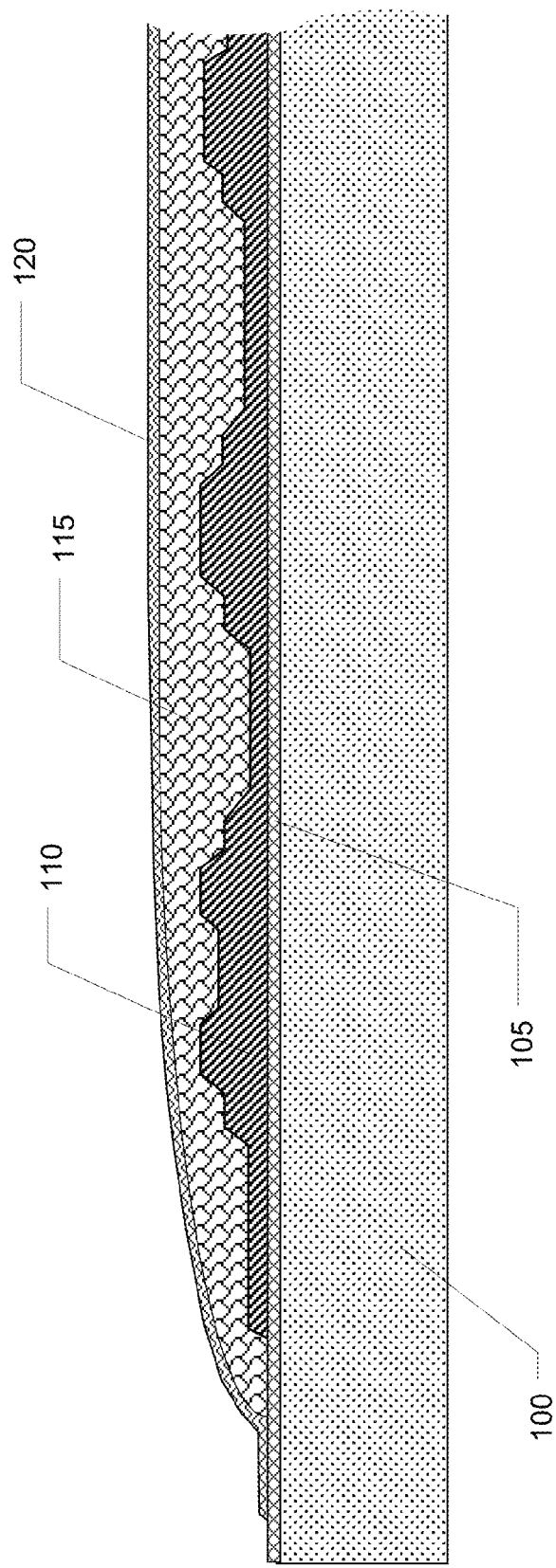
FIG. 1a shows a schematic cross-section representing the general features of an OLED device on a permeable substrate showing where barriers may be needed to protect the photo active materials.
Figure 1B:
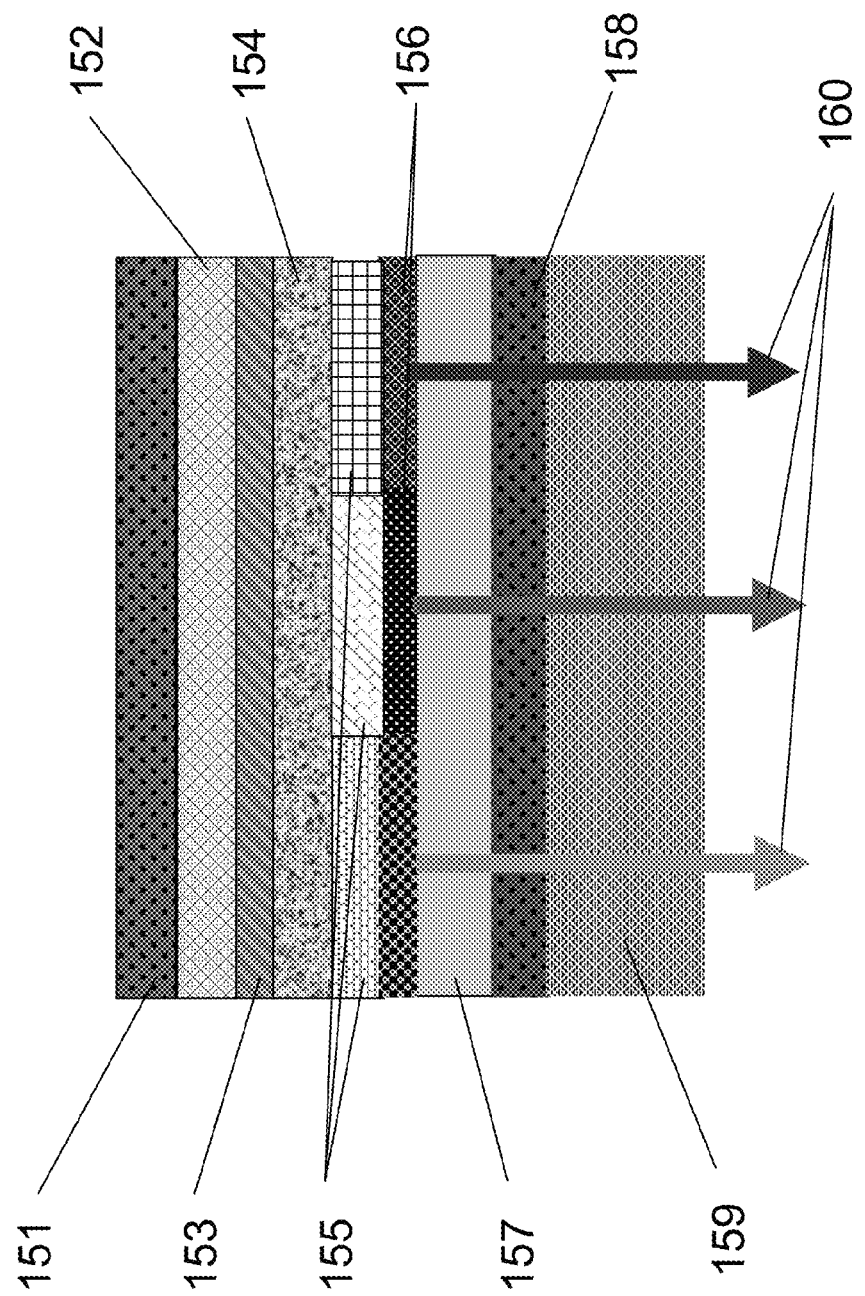
FIG. 1b illustrates an OLED device according to the present invention.

Shown in FIG. 1(a) is a schematic cross-section representing the gross features of a photonic electronic device on a permeable substrate, 100, that requires a barrier film, 105, below and above, 120, the photo active layers, 110. In this cross-section a planarizing polymer, 115, used in prior art encapsulation, and currently the predominant commercial technology, is also shown. The purpose of this polymer is to cover topography of the device surface and most particles, to provide improved barrier layer adhesion, and to protect the photoactive layer during the deposition of the barrier film. In FIG. 1(b) we see the more detailed structure of one kind of photonic electronic device—an OLED display device. In this device: the top layer of encapsulation or hermetic barrier, 151, shown as a single layer, covers the top conductor, 152, which may be a transparent conducting oxide (TCO) material and provides electric current for each pixel. The next layer of the OLED device is the cathode, 153, which has a low work function and so injects electrons into the electron transport layer, 154, where they are conducted to the OLED material, 155, which efficiently emits light when that individual pixel is to be turned on. The OLED produces light that is converted by the phosphor, 156, to the desired color of light for each pixel. The hole transport layer, 157, is immediately below the phosphor and is transparent, as is the bottom TCO layer, 158, that has been deposited directly on the glass, 159. The emergent light of each color and for each pixel, 160 transmits through the hole transport layer, bottom conducting layer and the (usually) glass substrate to the viewer.

Figure 2:
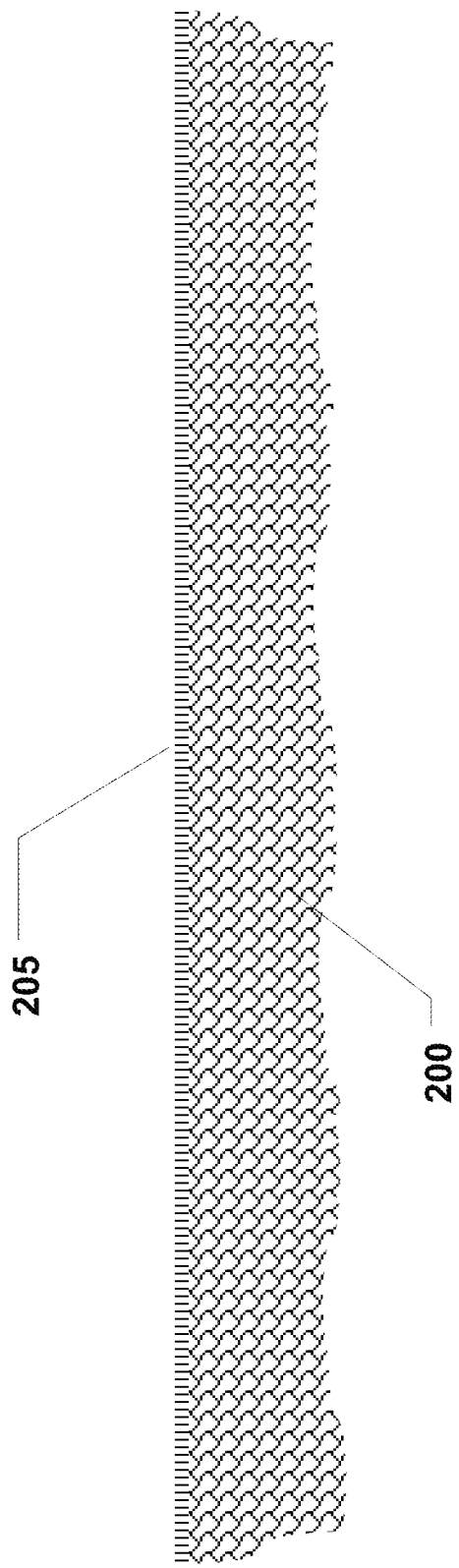
FIG. 2 illustrates an ideal starting surface for barrier deposition.
Figure 3:
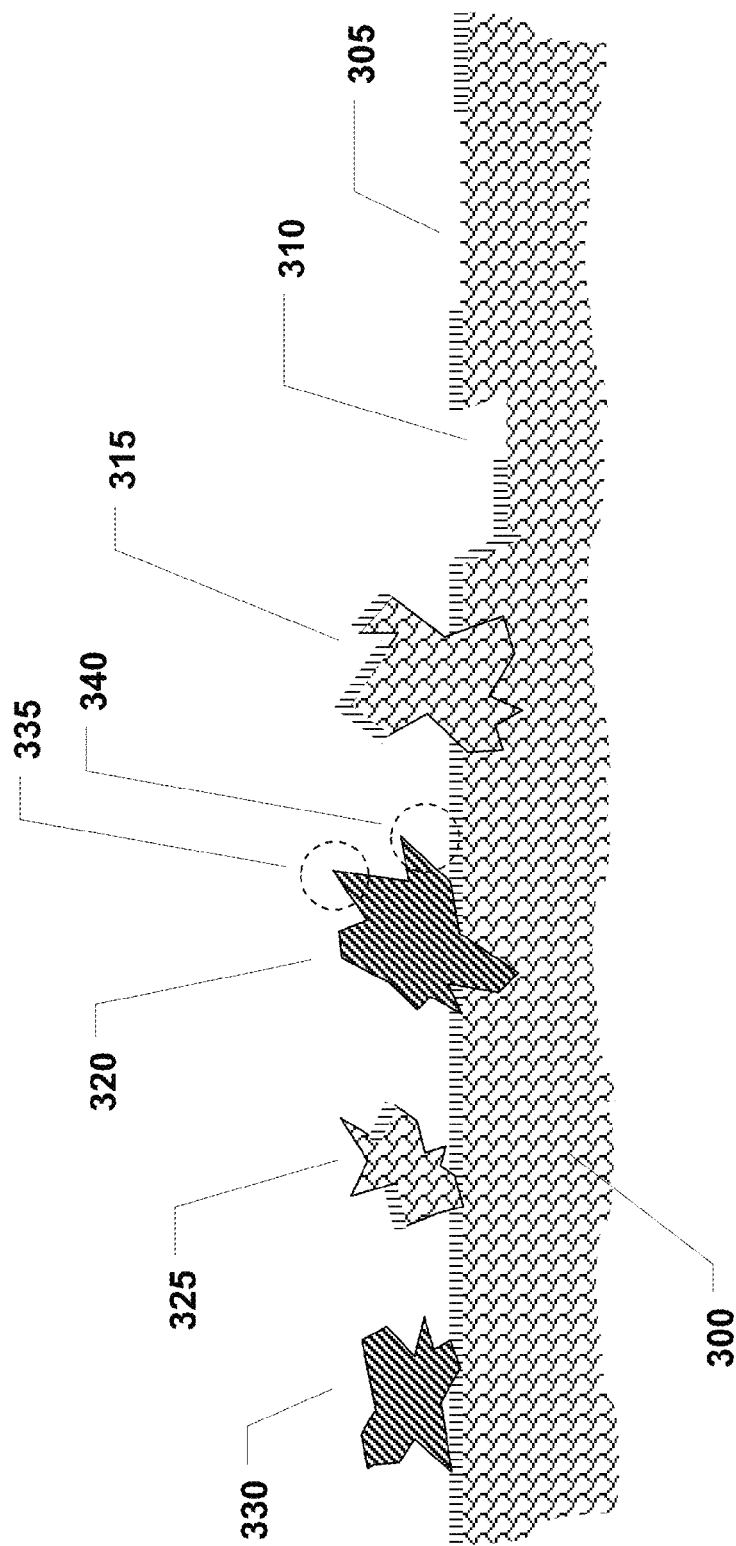
FIG. 3 illustrates a real surface with the imperfections that a barrier film deposition method must accommodate to reduce formation of localized defects.

FIG. 2 illustrates an ideal starting surface for a barrier layer deposition. The starting surface layer, 200, is smooth and of uniform composition without local defects and has a surface, 205, that has a uniform distribution of reactive sites that provide uniform nucleation and strong adhesion for the barrier layer. However, real substrate surfaces typically have at least some areas that are not ideal. FIG. 3 depicts a more realistic starting surface that illustrates the surface conditions that a barrier deposition method must overcome in order to greatly reduce formation of defective areas that permit penetration of oxygen and water. The realistic starting surface layer, 300, has areas where nucleation sites are not uniformly distributed, 305, and sites where the surface is not smooth, 310, due to non-uniform deposition of the starting layer that may also involve changes in nucleation site density. Such areas of non-uniform surface condition may cause the deposited barrier film to form a defective region with higher water vapor or oxygen transmission rates because it is thinner, weakly bonded to the surface, or have an unfavorable composition, or combination thereof. In addition to deposition uniformity issues there will also be particles on the starting layer that prevent uniform deposition of the barrier layer. Particles may be embedded in the film during preceding steps and have a composition similar to the starting layer 315, or of a dissimilar material 320. For example, particles with similar composition to the starting layer may be flakes from material that deposited on walls or other surfaces inside the equipment during deposition of the starting layer material. An example of dissimilar particles would be metal flakes generated by moving mechanisms inside or outside the equipment used to deposit the starting layer material. If either type of particle arrives at the surface after the preceding layer material is in place, they may rest on the surface as non-uniform areas of similar composition, 325, or different composition, 330, from the starting layer. Particles may often have highly irregular shapes, in particular if the source is from flaking of deposits or metallic friction. This makes it highly likely that some particles will have asperities with acutely angled points, 335, and/or form reentrant regions, 340, that can cause defective areas in a deposited barrier film with higher gas permeability because the film will be thinner, weakly bonded to the surface, have insufficient density or columnar structure due to insufficient ion bombardment, or have an unfavorable composition, or any combination thereof. Also, the bonding of the thin inorganic plasma-deposited barrier layer to the material on the substrate surface may be difficult and require additional processing steps to create surface bonding sites to uniformly chemically bond the inorganic coating to the organic substrate surface. One problem that occurs commonly when such particles are incorporated into a flexible film is formation of microcracks or leaky spots after the material is flexed. Substrate flexure may cause the particle to move within the film in which it is embedded so that the fragile bonding of the surrounding layer to the particle is disrupted and gas conduction paths formed around the particle. It is desirable therefore to more firmly and seamlessly encase particles in the surrounding layer—this is done with a process step which we call smoothing that forces dense material to tightly bond around the particle between it and the rest of the film as it is formed.

Figure 4:
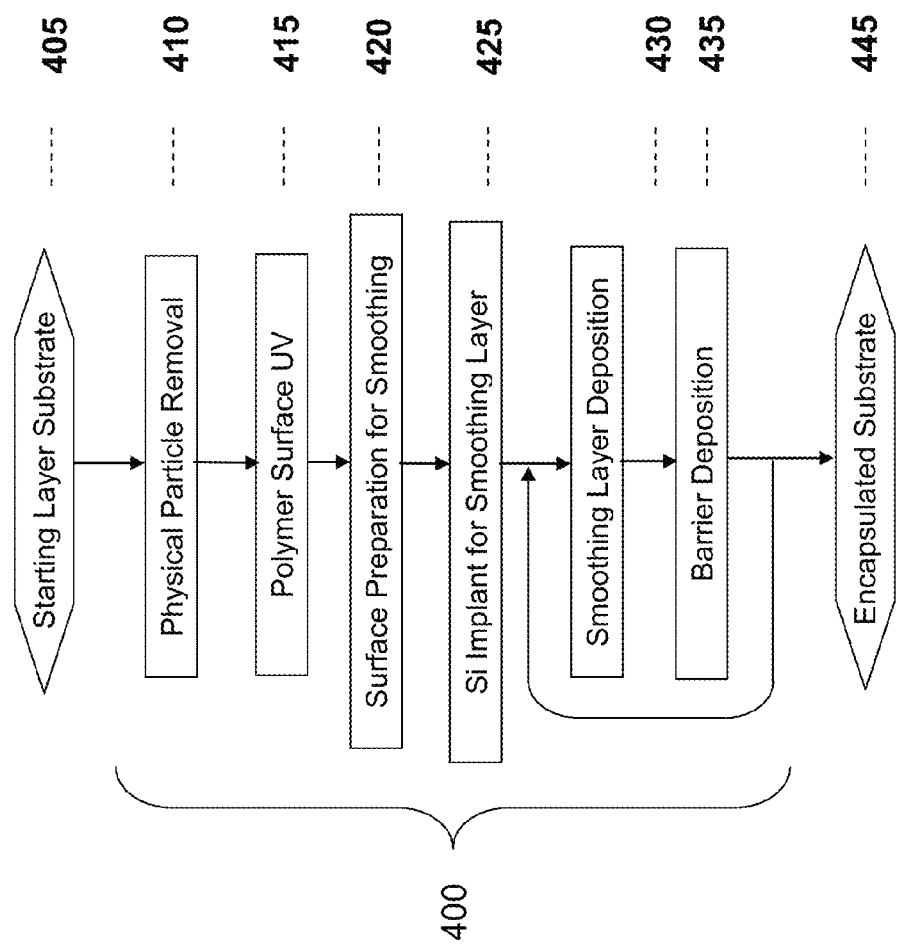
FIG. 4 shows a flow diagram that illustrates the possible steps in an embodiment of the high-performance barrier deposition method.

The method of the invention integrates a series of steps that overcome problems due to contamination as illustrated in FIG. 3 to produce a high performance barrier with excellent adhesion and with a low defect density. A schematic flow chart is shown in FIG. 4 that summarizes the sequence of steps for an example embodiment of the invention. The first step 410 applies a physical cleaning to remove surface particles not firmly embedded in the starting surface. Such particles are often weakly bonded to the surface by electrostatic forces and may be removed by methods that overcome the particle's attractive force to the surface and provide a means of transporting the loosened particle away from the starting surface. Some embodiments of this cleaning may use a spray of solid particles or droplets generated from liquefied gas such as $CO_2$, Ar, $N_2$ that is ejected in jets from the nozzles. This rapidly cools to generates solid or liquid particles entrained in the gas streams that can impact the particles on the surface dislodging them from the surface. Particles are then transported away from the surface and to an exhaust. The step 415 in some embodiments may be used on plastic or organic polymer surfaces that have high roughness or surface irregularities. It reduces protruding organic materials by irradiating the surface with short wavelength UV radiation at shallow angles to the surface causing a minimum of erosion of the base organic material while having higher intensity and removal rate for protruding organic contaminant. Exposure to VUV can also be accomplished by exposing the substrate directly to plasma without a window. Hydrogen plasma is particularly efficient at this. The advantage of not using a window is that all radiation generated by ionization can be transmitted directly to the substrate.

The step 420 is part of the second group of process steps that provide surface conditioning. In some embodiments this step exposes the substrate to inert gas plasma so that dangling bonds are formed in the molecules on the surface and so that very loosely bound gases, including organics, may be desorbed and removed by the gas flow in the plasma sources.

The step 425 in some embodiments implants silicon atoms or ions into the very near-surface region of the substrate. In some embodiments this may be done for substrates having exposed surface of relatively weak-backbone organic polymer or plastic, such as acrylic, polycarbonate, or polypropylene. This process causes silicon atoms to be incorporated into the polymer backbone near the surface promoting adhesion of inorganic dielectric films deposited thereupon. This same step may also mitigate surface defects due to embedded particles by smoothing them before starting the barrier deposition.

The step 430 deposits a smoothing layer of transparent material, in some embodiments a silicon-based dielectric, while providing heavy ion bombardment resulting in sputter etching of the surface to provide a smoother surface for the subsequent barrier layer deposition. The sputter etching may be provided simultaneously with the deposition, or in alternation with the deposition. The intense energetic ion bombardment may be done through the entire thickness of the film—usually when the film is very thin—less than about 50 nm. Alternatively in some embodiments it may be limited to the initial 5 nm to 20 nm of deposition. This is to limit the average stress over the film so as to avoid curling of flexible substrates. In fact, the deposited film may be "sputtered back" during or after deposition so that only a very thin layer remains upon completion of the step. In this case the net deposition rate for this layer would be very low, since the sputter rate may in some embodiments almost equal the deposition rate. Such layer may also be much thicker if composed of a slightly carbon-doped inorganic material that has both transparency and elasticity. In this case the smoothing layer may be up to 1000 nm thick.

Finally, step 435 indicates deposition of a high RI, thin layer that may be a barrier for moisture and oxygen penetration. This layer may be silicon nitride, silicon oxynitride or other oxide or nitride material that is substantially impervious to moisture and oxygen permeation. The smoothing and barrier steps may be repeated in an alternating manner thereafter until the encapsulated device, 440, has the needed level of resistance to moisture and oxygen transmission.

The steps may be divided into three groups: first, in which there is removal of material from the surface by kinetic, chemical reaction or bond breaking; second, steps in which there is surface treatment or modification; and third in which there is net deposition of thin layers of material effected by plasma action on an injected gas mixture that contains at least one of silicon, carbon or metal.

Figure 5:
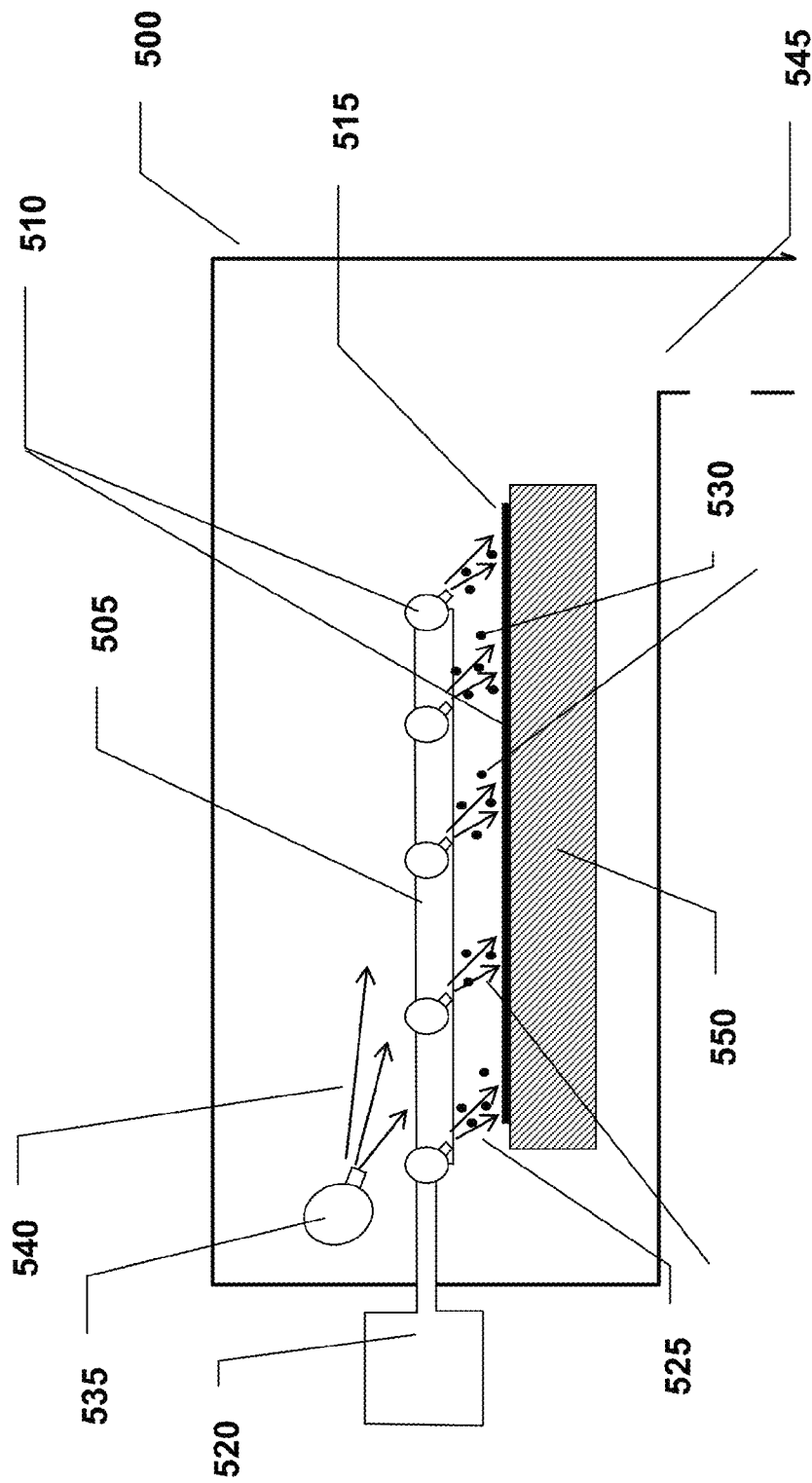
FIG. 5 shows a schematic view of a cryogenic aerosol cleaning chamber and the major components therein.

In some embodiments of this method the first group of steps may contain one or more of the following:

Surface cleaning of the substrate with a non-wet, physical cleaning method. This is more likely to remove larger particles (>1 micron size) and less likely (though still have some effectiveness) in removing particles less than 0.1 µm. In some embodiments this can be a cryo-kinetic spray that in some embodiments may be done in a chamber, 500, having an ambient pressure of less than about 10,000 Pascals and preferably less than 3000 Pascals, using a mixture principally containing liquified gas(es) which may contain less than 10 PPM of oxygen, oxidizing gas or water vapor. Said gases should have melting and boiling temperatures between about minus 10° Celsius and minus 220° Celsius so that condensation of these gases on the substrate is avoided. Gases which are strongly reactive with the substrate surface material should be avoided for purposes of this physical cleaning step. For cryo-kinetic cleaning techniques the removal probability for larger particles has been shown to be very high, exceeding 99%, while for particles of diameter less than 50 nm it may be less than 90%. In some example embodiments, said cleaning should be done preferably with the substrate in thermal communication with a temperature controlled pedestal or drum so that substrate temperature may be better controlled during the cleaning process and to avoid damage to the materials or structures on the substrate. Further, the total flux of spray to the substrate surface should be such that the rate of heat transferred (cooling) from the substrate does not exceed 5 Watts per square centimeter. In some embodiments of the cleaning process, the total flow of cooled gas to the spraying element per unit area of substrate covered is limited to assure the substrate temperature is maintained above −20° C., and preferably between about 40° C. and above about 0° C., throughout this process step. In some embodiments such cleaning may be effected with at least one linear spraying element that contains a plurality of nozzles. In some embodiments there may be an assembly of individual nozzles with their own supply lines in the chamber. In FIG. 5 is shown an illustration of a chamber for performing the disclosed process. The cleaning chamber 500 has two linear spray elements, the first of which, 505, has a plurality of injection nozzles, 510, aiming at the substrate, 515. The supply of mostly liquefied gas for the spray, 520, should be at sufficient pressure (typically above 2 atmospheres and less than 20 atmospheres) such that the gas emergent from each nozzle, 525, contains liquefied or solidified small particles or droplets, 530, as it emerges. In some embodiments there may be a second element, 535, that injects a warmer inert gas, 540, which may prevent recirculation of the gas in the chamber and help avoid excessive cooling of any area of the substrate by the cleaning spray. The assembly should be positioned relative to the substrate such that the distance from the first segment, to the surface being processed allows a substantial fraction of such solid or liquid particles to impact the surface before evaporating completely. Such distance depends on the flow speed, and the background gas pressure and temperature. In some example embodiments a distance between about 1 cm and 10 cm is effective. In some embodiments a linear nozzle element contains at least one small nozzle for every 2 centimeters of its length. At the side of the chamber furthest from the spray assembly, and beyond the edge of the substrate, is an exhaust, 545, that removes the flowing gases from the chamber. In some embodiments, the flows from the nozzles and exhaust are such that recirculation gas flows within the chamber are minimized. In some embodiments the direction of cryo-kinetic injection may be at an angle between about 80° to 180° (measured in the substrate plane) from the direction of substrate motion so that the spray does not drive contaminants onto substrates that have already been cleaned. In order to avoid excessive substrate cooling by the spray the substrate should be supported closely upon a temperature controlled pedestal, 550, that may be maintained at a temperature up to 50° C. so that it provides heat to the substrate avoiding too low a temperature for the substrate. In some embodiments gas bearings may be used to provide a cushion of gas between pedestal, or roller for web substrates, and substrate which is thereby clamped in proximity to the pedestal at a distance less than about 0.05 mm so that heat transfer between substrate and pedestal is sufficient to maintain the substrate temperature above about −20° C. The limiting cryo-kinetic gas flow density depends on the heat conduction between substrate and its support pedestal—which depend on the gap and gas pressure in that gap. Typically, for pressures of 3000 Pascals with gap from substrate to support surface less than 0.05 millimeter there is adequate heat conduction and the minimum acceptable temperature >−20° C. can be maintained when the spray has surface cooling rate of 1 Watt per square centimeter. In some embodiments the total flow rate of gas utilized for the spray may be up to 50 standard liters per minute for a web or substrate width of about one meter.

A process for evaporating from the substrate surface polymeric material that is upon or protrudes from the main substrate surface, wherein the moving surface of the substrate is exposed in some exemplary embodiments to UV light from lamps or possibly plasma. Irradiation by vacuum ultra-violet (VUV) light with wavelengths shorter than about 175 nm has been shown to penetrate as much as 50 to 100 nm into organic polymers, breaking C—O bonds to increase polymer mobility and relaxation dynamics. Exposure to VUV can be accomplished by a light source with a window to prevent any exposure to the ionized gas used to generate the VUV. A preferred process to accomplish a smoothing process is to utilize a removal method that enhances the removal of asperities compared to flat areas. In some embodiments a linear plasma source built and operated according to the disclosures in related US Patent Application Publications 2011/0005681 A1, 2011/0005682 A1, 2011/0006040 A1, and 2012/0225218 A1 can provide VUV exposure coupled with low ion bombardment energy by using for example a plasma of Ar gas, and in some cases mixed with other gases, such as $H_2$, He, $O_2$, $N_2O$, $NH_3$, $SiH_4$, $CH_4$, $N_2$, or other gases with similar properties to enhance VUV emission, and/or adjust reactivity with the substrate.

b. This process step in some embodiments may be done with UV lamps that are in a linear array with radiant UV at an intensity above 50 mW per square centimeter, at incidence angles mostly larger than 45° from the local normal to the gross substrate surface. In some exemplary embodiments it is desirable to have at least 100 mW of incident radiation per square centimeter over the surface being treated so that the time required for the treatment may be less than about a minute. It is beneficial to purge the area above the substrate surface during such treatment with a substantial flow (at least 1 standard liter per minute for each square meter of substrate being treated) of inert gas such as argon or helium. This step significantly reduces the protruding organic "flakes" and thin structures on the surface. It also has the benefit of UV-stimulated desorption and removal of atmospheric gases from the polymer surface so that the surface moisture, oxygen, nitrogen and carbon dioxide—which will vary over time in the factory—do not cause variability in the properties of the first few monolayers of the coating material deposited. This is at angles less than 45° to the surface. The chamber, 600, shown in FIGS. 6(*a*) side view, and 6(*b*) view from direction of substrate motion, has an injector, 605, supplying purging inert gas and an exhaust, 610, so that the ambient should always contain less than about 50 ppm of oxygen or water vapor. The linear UV lamp arrays, 615, which are provided with electrical power up to 20 kW per meter of length emit radiation in all directions, some of which hits reflector/baffles, 620, to reflect light that would otherwise directly hit the surface within 45 degrees of normal incidence. Thus, the majority of the UV radiation is incident on the surface at shallower angles so it preferentially evaporates protruding features. In some embodiments the substrate surface, 625, should be swept by a flow of inert gas while being exposed to the UV radiation. The gas has a bulk flow speed at least 10 centimeters per second at a gas pressure between 20 Pascals and 1000 Pascals. This causes the vapors evolving from the substrate surface to be exhausted promptly from the chamber. The flow of the inert gas from 605 in some embodiments should be between 1 and 30 standard liters per minute for each square meter of substrate encompassed by the chamber. In some embodiments the gas may be heated to a temperature up to 40° Celsius so that the vapor pressure of moisture is minimized. The direction of the bulk purge gas flow should be between 60° and 180° from the direction of the substrate motion in the plane of the substrate. The inert gas should have a non-recirculating flow within the chamber so that it does not carry vapor products from the surface to the walls of the enclosure or chamber within which processing is taking place. In some embodiments there may be at least one cooled trap in the exhaust line which serves to condense the polymeric material from the gas stream.

c. As an alternative to enclosed UV lamps, in some embodiments the source of UV generation may be illustrated using FIG. 7 where a plasma is sustained in the chamber, 700, that generates substantial hard UV radiation by exciting feed gases such as hydrogen and argon. In some inventive embodiments, the plasma has a modest plasma potential so that damage by and implant of energetic ions into the substrate or device is minimized. In such case, 715 may represent a radio frequency (rf) or microwave powered electrode or antenna, typically using from 1000 W per meter to 10,000 W per meter that sustains a plasma for the provision of UV radiation—originating predominantly in the region near the antennas. Inert gas injected from a manifold, 705, sweeps across the substrate, 725, and into an exhaust, 710, carrying atmospheric gas or volatile organics from the substrate. Said gas having bulk flow speed at least 10 centimeters per second at a gas pressure between 20 Pascals and 1000 Pascals. This causes the vapors evolving from the substrate surface to be exhausted promptly from the chamber. The flow of said inert gas in some embodiments should be between 1 and 30 standard liters per minute for each square meter of substrate encompassed by the chamber. In some embodiments the gas may be heated to a temperature up to 40° Celsius so that the vapor pressure of moisture is minimized. The average direction of the bulk purge gas flow should be between 60° and 180° from the direction of the substrate motion in the plane of the substrate. The inert gas should have a non-recirculating flow within the chamber so that it does not carry vapor products from the surface to the walls of the enclosure or chamber within which processing is taking place. In some embodiments there may be at least one cooled trap in the exhaust line which serves to condense the polymeric material from the gas stream. For more fragile polymers brief (<30 seconds) treatment with plasmas of low to moderate power densities (between 0.01 W/cm$^2$ and 0.5 W/cm$^2$) is effective and not destructive of the near surface polymer material.

The second group of steps include surface treatment or conditioning with the purpose of preparing for the thin film deposition that is to follow. Either or both treatments may be employed. Should both treatments be used they should be done in the sequence described below so that silicon doping of the substrate should occur after plasma surface conditioning. Said surface treatment in some embodiments may be done with the invention from the same inventors disclosed in related US Patent Application Publications 2011/0005681 A1, 2011/0005682 A1, 2011/0006040 A1, and 2012/0225218 A1.

The first step of this group consists of plasma-based surface cleaning and activation. In this process the surface of the web or substrate is exposed to a substantially inert gas—containing at least one of the gases argon, nitrogen and helium—plasma having at most a trace concentration (<10 PPM) of oxygen or of moisture. Said plasma may be generated in some embodiments by linear plasma sources, as in the incorporated references or simply as shown in FIG. 8 in an evacuated chamber, 800, in which one or more antennae or electrodes such as 815 that are supplied with microwave or rf power to generate a soft plasma. The rf or microwave power supplied to these antennae or electrodes may range from 50 Watts per meter of its length to as much as 1000 Watts per meter. There may be from 1 antenna per meter of chamber length to 5 per meter. The substrate or web may in some embodiments move continuously or in a periodic manner past said plasma generation elements. Said treatment may cause atmospheric gases or organic solvents in the very near-surface region of the substrate or on the surface to be removed. It may further causes dangling bonds to be formed at the substrate surface thereby making it substantially hydrophilic. In some embodiments said plasma may be at a gas pressure between about 10 Pascals and about 1000 Pascals and provide modestly energetic ions and electrons to the surface as well as some activated neutral species.

The second of these substrate pre-deposition treatments implants silicon atoms into the material of the substrate within 20 nm of the surface. This is important as a preparation for the ensuing step which involves deposition of the smoothing layer. The presence of the silicon atoms in the near-surface region of the polymer provides bonding sites that can form "anchors".

a. In some embodiments this may be done with plasma immersion ion implantation—which may be done with a low pressure plasma containing silicon or metal ions. In some embodiments this plasma may be substantially inert contain a small admixture—between 1% and 10%—of inorganic (silane, or metallorganic such as dimethylzinc, trimethyl indium, tetramethyltin and others) containing gas. In some embodiments the gas feed to said plasma may be a mixture having mostly inert gas containing at least one of the gases (helium, argon and nitrogen) with a modest admixture—from 0.1% to 3% of silicon-containing species that do not contain oxygen, preferably such as silane or disilane. This technique always leaves some amount of silicon-based residual material on the surface which may be beneficial in some cases as a pre-treatment for the following process step which may include film deposition combined with sputter etching by heavy ion-bombardment of the growing material. The dose of said implanted silicon ions should be in the range between $10^{14}$ ions/cm$^2$ and $10^{17}$ ions/cm$^2$ and preferably between $10^{15}$ ions/cm$^2$ to $10^{16}$ ions/cm$^2$ with the depth of implant being between the surface and maximum depth less than 20 nm. This may be accomplished by a pulsed or rf bias on the substrate in which the peak sheath voltage on the substrate, whether from pulsed dc or steady state rf power, may be in the range between 100 Volts and 1000 Volts. Since there will be deposition of silicon or metal on the surface as well, the inert ion impact serves to implant these species by knock-on implantation. Such surface inorganics effectively protect the organic polymer from too much de-hydrogenation making its surface graphitic.

b. Alternatively, this implant may be done by first depositing a very thin layer of silicon-containing material (other than silicon oxide) on the surface of the substrate and then bombarding it with inert gas ions to implant the silicon atoms (by the knock-on effect) into the near-surface region (<20 nm from the surface) of the underlying material of the substrate. In either case, said inert gas may include one or more of the gases helium, argon and nitrogen. This second part of the process should preferably be done with ion bombardment of high current density, more than 1 $mA/cm^2$, to efficiently (within about a minute or less) provide an ion dose sufficient to implant the silicon into the underlayer to a dose of at least $10^{14}$ to as much as $10^{17}$ $ions/cm^2$ thereby injecting at least a volumetric dose of $10^{20}$ $ions/cm^3$ implanted into the top 10 nm of the underlying organic layer. In case the silicon or metal is first deposited on the surface of the substrate, prior to knock-on implant, the thickness of said layer in some embodiments should be between 1 nm and 10 nm and preferably in the range between 1 nm and 5 nm. In this case the integrated bombarding ion exposure may equal a dose of energetic ions (E>100 eV) between $10^{17}$ ions per square centimeter and $10^{19}$ per square centimeter. Generally, higher ion doses are required for helium ions and nitrogen ions than for argon ions to produce the same implanted silicon or metal dose in the substrate material. Preferably, argon should be a substantial constituent of said plasma for the sake of efficiency of silicon implantation.

c. In some embodiments said silicon ion implantation may be done on the moving substrate or web using at least one linear plasma source. In some embodiments said inorganic containing gas may be injected into a stream of inert gas within the source that has already been activated by the plasma. In example embodiments the gas pressure in the source may be between 3 Pa and 100 Pa, and the flow of gas between 100 standard cc per minute and 3 liters per minute per meter of electrode length. In some embodiments energies of ions from the plasma should not exceed five hundred electron volts so that the average depth of implant should not exceed 20 nm. Total implant dose of silicon ions may in some embodiments be between about $10^{14}/cm^2$ and $10^{17}/cm^2$ so that the volumetric concentration of inorganic species in the processed underlayer is between about $10^{19}$ to $10^{22}/cm^3$. This may in some embodiments involve plasma exposure times between a second and a hundred seconds, but preferably in the range between 5 seconds and thirty seconds.

The third group of steps—those that include substantial deposition of layers of the encapsulation—may be done with the invention (from the same inventors) disclosed in US Patent Application Publications 2011/0005681 A1, 2011/0005682 A1, 2011/0006040 A1, and 2012/0225218 A1. Such process steps include as described below: thin film deposition with high rates of sputter etching to produce a smoothing layer; and deposition with less sputter etching to produce a barrier layer. In some embodiments combining these two layers—first smoothing, then barrier—produces hermetic encapsulation superior to and less expensive than the prior art. In some embodiments for encapsulation requiring ultra-low defects, there may be two or more such pairs of layers made by repeatedly alternating between these two types of deposition processes, which are described in detail below:

The plasma-deposited smoothing layer is transparent material deposited to provide a smooth surface upon which to deposit the barrier film. This layer may be deposited continuously or with interruptions during a period within which there may also be varying intense ion bombardment causing sputter etching of said deposited material. The rates of deposition of said material and sputter etching of said film may both vary independently during the course of the layer being deposited. Thus, through the depth of said layer there may be bands of material that are subjected to varying amounts of sputter etching as they are deposited or after deposition. Said combination of deposition and sputter etching has two benefits: first, it surrounds and covers particulates and irregularities on the substrate surface and reduces the slope of the surface of said deposited material and of protrusions or underlying material. This provides a better foundation for the barrier layer to be deposited thereupon. This deposited film, when completed, may cover surface particles and other irregularities partially or completely. Secondly, it causes the deposited film to densely and tightly bond to, and envelop particles on or protruding from the preceding layer prior to deposition, leaving dense material tightly bonded to the encased particles or surface irregularity as it is to the material underneath.

It produces a layer of material on the device that may in some embodiments have thin sub-layers within that may have slightly different composition, morphology and density as well as intrinsic film stress that may exceed 500 MPa. These sub-layers have such stress and other properties due to exposure of the deposited material to higher intensities of sputter-etching, which may be simultaneous with or following deposition. There may be one or more such regions within the smoothing layer that may be separated by sub-layers having intrinsic stress that may be less than 500 MPa, or in some embodiments less than 200 MPa, and slightly different composition or morphology than in the high stress regions. The purpose of this step is to produce a layer having a less sloped, smoother upper surface as a foundation for an effective barrier layer. It accomplishes this by reducing or eliminating sharp protrusions or overhangs due to exposed surface particles, micro pits or scratches. These would otherwise cause steep surface topography or overhanging regions on micro or nano scales. In some embodiments said layer may be deposited at low substrate temperature by a plasma enhanced chemical vapor deposition (PECVD) method. It may be a layer whose thickness, homogeneity, structure and composition depend on encapsulation requirements.

d. In some embodiments the layer may be a thin (5 nm to 100 nm) pure inorganic material which may have at least one of the following constituents: silicon dioxide, aluminum oxynitride, aluminum oxide, zinc oxide, tin oxide, zinc-tin oxide, titanium oxide, titanium oxynitride, silicon nitride and silicon oxynitride. In applications where flexibility is important the thickness may be preferably between 5 nm and 50 nm. In some embodiments this layer may be deposited in such manner that the deposited material is all subjected to intense sputter etching so that the entire layer has compressive intrinsic stress above 500 MPa, or that some part or parts have intrinsic stress below 500 MPa. In some example embodiments this may be a thicker layer (10 nm to 1000 nm) having minimal carbon-doping of 0.5% to 5% in an otherwise substantially inorganic material, that may in preferred embodiments be in the range between about 1% and 3%. The thickness, in this case with mixture of carbon and inorganic content, may preferably be between 50 nm and 300 nm to keep fabrication cost low. There may in some embodiments additionally be between 2% and 25% hydrogen content in such films. While this material has a primary function as a smoothing layer it may also benefit encapsulation even if as a barrier it would permit moisture penetration at 0.1 g/m$^2$/day to 10$^{-3}$ g/m$^2$/day. This benefit may come when barrier layers above and below it have defects that are not vertically aligned. One such benefit is the smoothing layer helps to prevent alignment of the defects in barriers above and below it. Another benefit may result from the slowing of lateral gas transmission between non-aligned leaky spots in barrier layers separated by such smoothing layer. This mixed material is more flexible and elastic than pure inorganic layers of the same thickness and therefore may be helpful in applications where the substrate may have a greater rate of thermal expansion, or need to tolerate flexure with small bending radius. Such applications may include thin film photovoltaics such as CIGS and Organic photovoltaic modules, or flexible OLED applications for barriers.

e. In some example embodiments this layer may be even thicker (100 nm to 5000 nm) and be a mixture of polymeric and non-polymeric material in which polymeric material may be between 5% and 20% and non-polymeric material is between 80% and 95%. In some embodiments the material may be predominantly based on silicon or metallic oxide with organic polymeric content based on carbon and hydrogen. This material may be made by a plasma enhanced process in which a silicon and carbon containing precursor gas is injected along with an oxidizer gas. As above with layers having less organic content, while this material may have a primary function as a smoothing layer it may also contribute to encapsulation even if it might itself as a sole barrier permit moisture penetration at 0.1 g/m$^2$/day to 10$^{-4}$ g/m$^2$/day. This mixture material is more flexible and elastic than pure inorganic layers of the same thickness and therefore may be helpful in applications where the substrate may have a greater rate of thermal expansion, or need to tolerate flexure with small bending radius. Such applications may include thin film photovoltaics such as CIGS and Organic photovoltaic modules, or flexible OLED applications for barriers.

In example embodiments of all three of the above types of materials for smoothing layers, there may be substantial ion-based sputter etching during at least part of its deposition process to provide surface and particle smoothing. During such sputter etching there will be filling of nano-scale gaps between particles and surrounding material with dense material. Computation we have done with the TRIM ion simulation code as well as experiment has shown that the rate of sputter etching varies strongly with angle of incidence of ion to surface—for incidence angles between the normal to the surface and about 20° the yield per ion is less than 0.25, then increases to 0.54 at 40° and 1.22 at 60°, reaching a maximum of about 1.44 at about 80°, more than six times the yield at normal incidence and then falls very rapidly to zero. This causes protrusions, such as from imbedded particles, to be very rapidly sputtered off and valleys or gaps to be rapidly filled. There may be such intense ion sputter etching during more than one period of time during the deposition. The resulting smoothing material may in some embodiments be non-homogeneous, varying in composition or properties as a function of depth.

Feed gases that may be used to deposit the different types (a-c) of smoothing layer materials may depend on the material. For oxides and oxynitrides the reactant gas may include one or more of: oxygen, nitrous oxide, nitrogen and ammonia. For nitride: ammonia, nitrogen, and argon.

For depositing different types of smoothing (or barrier) films appropriate gases may include one or more of the following:

i. Precursors for depositing substantially inorganic silicon oxide or oxynitride: silane, disilane, methylated silanes, HMDSO, TEOS, TMCTS, BTBAS, VTMS, and HMDS. (Generally, large proportions—upwards of 20-to-1—of reactant are required with any of the organosilicon precursor compounds to make substantially inorganic films defined as not having significant carbon inclusion.)

ii. Precursors for depositing carbon-doped silicon oxide or oxynitride: combinations of (silane or disilane or other silanes) and (methane or ethane or hydrocarbon or alcohol or single precursors: methylated silanes, HMDSO, TEOS, TMCTS, BTBAS, VTMS, and HMDS.

iii. Precursors for depositing carbon-doped silicon-based oxides or oxynitrides which may also be called carbon doped materials (>5% carbon—having more than about 5% polymeric content): HMDSO, TEOS, TMCTS, BTBAS, VTMS, and HMDS.

iv. For depositing inorganic or carbon doped silicon nitride: Precursors: combinations including (silane, or higher silanes or cyclic silicon-hydrogen compounds) and (methane, ethane, linear or cyclic hydrocarbons, or alcohols) methylated silanes, BTBAS, and HMDS. (Generally, large proportions—upwards of 20-to-1—of reactant are required with any of the organosilicon precursor compounds to make substantially inorganic films not having significant carbon inclusion.)

v. Precursors for depositing carbon-doped silicon based nitrides having higher percentage of polymer content: combinations including (silane, or higher silanes or cyclic silicon-hydrogen compounds) and (methane, ethane, linear or cyclic hydrocarbons, or alcohols), methylated silanes and higher silanes, BTBAS, and HMDS.

vi. Precursors for depositing inorganic or carbon-doped metallic oxides and oxynitrides: trimethyl aluminum, dimethyl zinc, trimethyl indium, tetramethyl tin, Tetrakis(t-butoxy) Hathium, Tetrkis(dimethylamino) Titanium and others, Bis(indenyl)dimethyl Zirconium, tris-n-cyclopentadienyl yttrium. Generally, large flow ratios for reactant gases are required to yield substantially inorganic materials.

vii. Precursors for depositing heavily carbon-doped (>10%) metal oxides and oxynitrides: trimethyl aluminum, dimethyl zinc, trimethyl indium, tetramethyl tin, Tetrakis(t-butoxy) Hathium, Tetrkis(dimethylamino) Titanium and others Bis(indenyl)dimethyl Zirconium, tris-n-cyclopentadienyl yttrium. Any of the above may be added with methane, ethane, linear or cyclic hydrocarbons, alcohols and other volatile carbohydrates.

viii. For depositing inorganic or carbon-containing metal nitrides: trimethyl aluminum, dimethyl zinc, trimethyl indium, tetramethyl tin, Tetrakis(t-butoxy) Hafnium, Tetrkis(dimethylamino) Titanium and others, Bis(indenyl)dimethyl Zirconium, tris-n-cyclopentadienyl yttrium. Generally, large flow ratios for reactant gases are required with any of the organometallic precursor compounds to make substantially inorganic films not having significant carbon inclusion.

ix. Precursors for depositing carbon-doped metal nitrides having higher carbon content (>5%): trimethyl aluminum, dimethyl zinc, trimethyl indium, tetramethyl tin, Tetrakis(t-butoxy) Hathium, Tetrkis(dimethylamino) Titanium and others, Bis(indenyl)dimethyl Zirconium, tris-n-cyclopentadienyl yttrium.

For those embodiments where the layer has carbon, near the interface of the smoothing layer with the layer below there may be such sputter etch conditions resulting in less carbon and hydrogen or other organic or polymeric content—as much as 50% less than in other parts of the layer. This lower organic content may come from a higher level of ion bombardment power in deposition of this layer and/or from increased proportion of reactant relative to precursor gases.

For all types of smoothing layer as disclosed, the increased ion bombardment and consequent sputter etching at the top of the layer may be helpful for function of the barrier layer to be deposited afterward since it improves both the film density, binding to enveloped particles, and surface smoothing due to sputter etching of the rough protrusions of some particles. In some example embodiments there may be at least one additional period of intense sputter etching before deposition of this layer is completed. This may result in one or more sub-layers wherein densification of the material and smoothing of the surface takes place. The thickness of such sublayers may be between 5 nm and 50 nm. The material between such sublayers may have higher carbon or polymeric content and less intrinsic stress, and have a thickness greater than 50 nm. In some embodiments it is preferred for thicker layers not to have heavy sputter etching throughout their thickness, since the high compressive stress in the entire layer could cause curling or distortion in flexible substrates. One way to avoid this problem is to have very thin such sub-layers wherein the sputter etch rate on the flat surface is nearly equal to the deposition rate so that the net deposition rate is low—in which case the final thickness of that part of the film may be less than 30 nm so that the effect of high stress in such a thin layer is very modest.

In some example embodiments where the smoothing layer is thicker or has more organic or polymeric content it may be deposited with higher ion bombardment or more reactant so it has less carbon content near its top interface than in its bulk, so as to provide a superior substrate surface for the growth of the barrier layer upon it. Increased ion bombardment power during the latter stages or following deposition in some embodiments could remove material so that the layer is thinner and at the same time densify the top 2 nm to 20 nm. This may help provide a smooth dense material on the smoothing layer upper surface as a superior base for the growth of the higher index material or barrier material on top.

Some suitable materials for a thick carbon-containing or mixed polymeric-non-polymeric smoothing layer might include: a carbon-doped silicon oxide, a mixture of fluoropolymer and metal oxides.

Figures 9A, 9B:
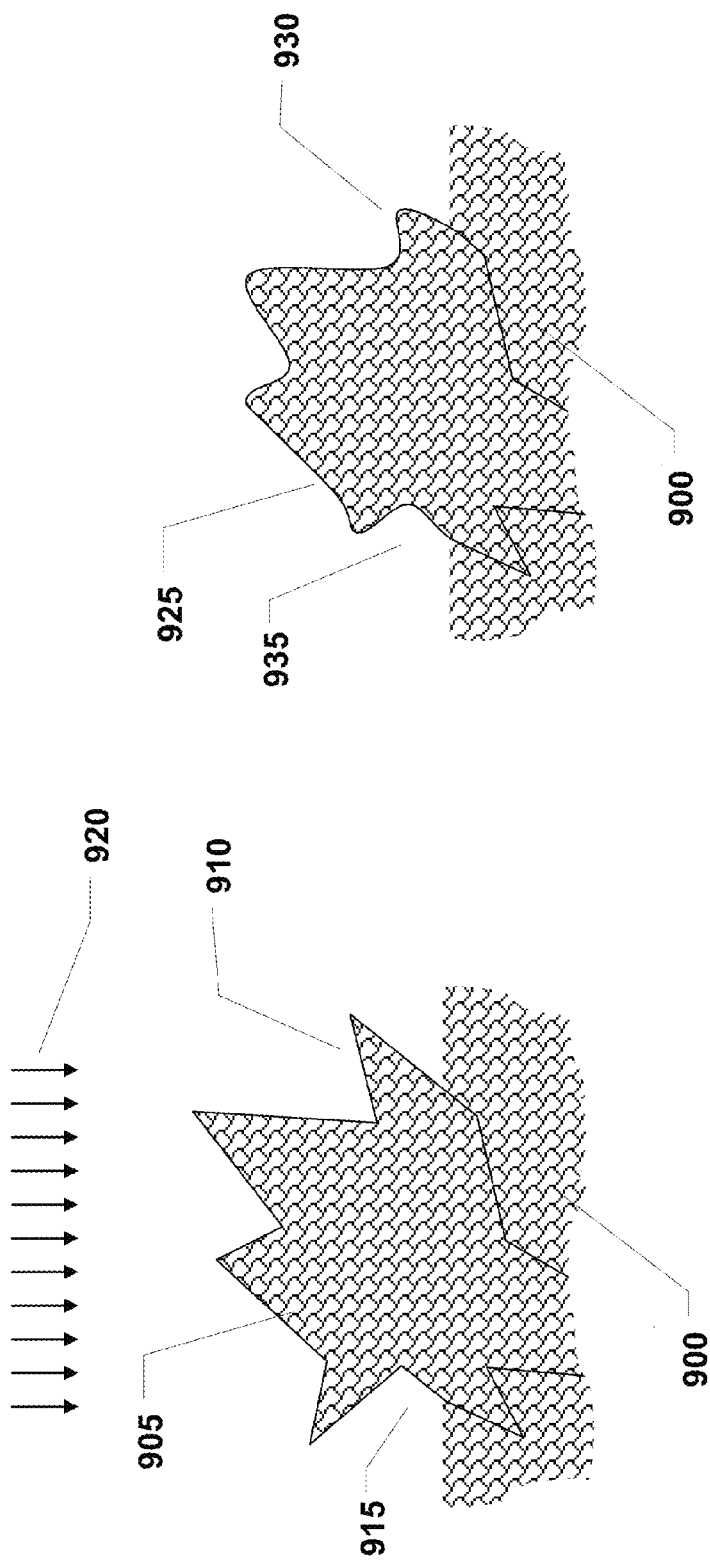

See FIGS. 9(a) and 9(b) for an illustration of the effect on a particle of the ion-based sputter etching that may in some embodiments be part of the smoothing layer deposition process. In 9(a) the substrate or device surface, 900, before smoothing layer deposition with unprocessed particle, 905, has sharp protrusions, 910, and areas, 915, where it overhangs microscale or nanoscale areas of the surface and substrate material. After the surface and particle are ion bombarded, 920, from above the substrate by the plasma, as shown in 9(b), the particle, 925, has been smoothed so that the protrusions, 930, are not so sharp, nor are the areas of overhang, 935, as large as before.

In some embodiments the gas pressure during film deposition for the smoothing layer may be in the range between about 10 Pa and about 400 Pa. The total power injection to the source may be from about 100 Watts per meter of length of a linear plasma source (that may be perpendicular to the substrate motion) to as much as 2 kWatts per meter. The ion bombardment power density may be in the range between 0.01 Watts/cm$^2$ and 3 Watts/cm$^2$. The gas feed to the plasma source for any of the different types of smoothing materials may include at least one of: nitrogen, ammonia, argon, oxygen, nitrous oxide, argon, helium and nitric oxide. The sputter etching part of the smoothing layer deposition process may be done with a bombarding ion energy distribution extending at least above 70 eV, and with source power between about 200 Watts per meter of source length to as much as 5 kWatts per meter. The ion bombardment power on the substrate in such source may be between 0.2 Watts/cm$^2$ and 10 Watts/cm$^2$. The ion bombarding power may in some preferred embodiments may be in the range between about 0.5 Watts/cm$^2$ and 3 Watts/cm$^2$ so that a commercially cost-effective sputter etching rate greater than 20 nm/minute is obtained. In some embodiments the gas may preferably contain principally argon or nitrogen or mixture thereof and may have a small (less than 0.5% by volumetric flow) added amount of an etching gas such as $CF_4$, $SF_6$, $Cl_2$, or $CH_4$. The gas pressure for the sputter etching part of the process step may be in the range between about 1 Pascals and about 300 Pascals and preferably in the range between 3 Pascals and 50 Pascals. In some embodiments the maximum angle of the surface to the plane of the substrate after this step should be reduced, so at virtually no point on the surface is it greater than about 70°.

Figure 10B:
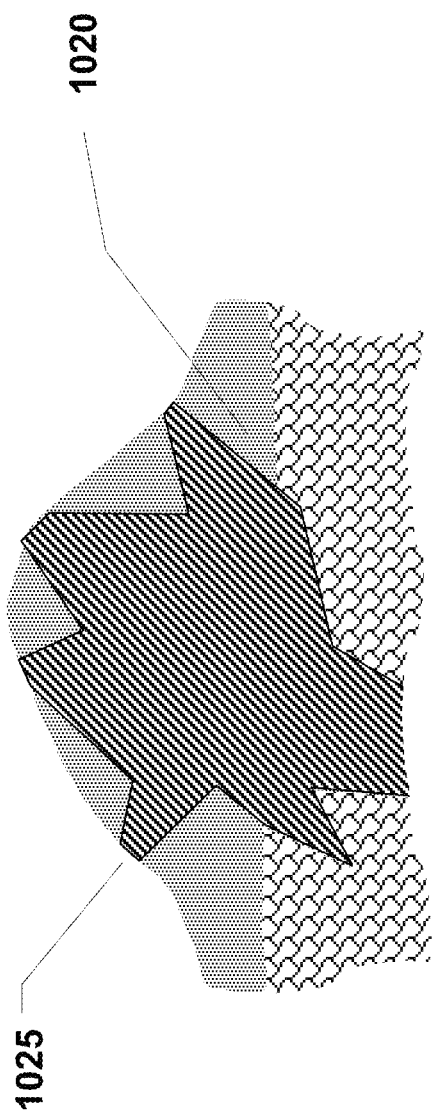

In embodiments where the process step for smoothing has simultaneous deposition and sputter etching the time-averaged rate of smoothing layer deposition may be between 20% and 200% greater than the rate of sputter etching on a horizontal surface (the rate is much higher on sloped surfaces) so that the net deposition rate in horizontal areas may be between about 17% and 67% of the rate considering deposition alone. In some embodiments the sputter rate may be higher during periods of time in which the surface is "etched back" and the remaining material densified by the bombardment—so long as there is a net deposition of material during the process step. For example, 50 nm of material may be deposited without sputter etching and then the sputter etching done to reduce the thickness to 20 nm. In this case the remaining material will be densified, protrusions etched off and recesses filled even as the average thickness is decreasing. See FIGS. 10(a) and 10(b) for the surface topography changes due to smoothing layer deposition. In FIG. 10(a) we see the surface, 1000, before deposition with visible protruding particulate contamination, 1005. Such particulates have complex shapes including sharp protrusions, 1010, and typically areas, 1015, where they overhang the substrate surface. In FIG. 10(b) we see that previously overhanging areas have been filled, 1020, or shrunk. The exposed surface is smooth with sharp protrusions smoothed, 1025.

In example embodiments this combined deposition and sputter etch step may have sub-steps in which different process conditions prevail resulting in material properties that vary through the thickness of the smoothing layer, as shown in FIG. 11. In embodiments where the deposition of said layer has sub-steps, the first sub-step may include deposition with intense ion bombardment power, more than 1 W/cm$^2$, sputter etching on a substrate, 1100, producing a deposited first part layer, 1110, having a thickness of 5 nm with higher compressive stress (>500 MPa). Upon this may be deposited, with moderate ion bombardment (<0.3 W/cm$^2$), a bulk layer, 1115, with thickness 30 nm having slight intrinsic stress between 100 MPa and 250 MPa. Finally, the step is concluded and the smoothing layer completed with a sub-step having intense ion bombardment in which a further net 5 nm of higher stress (between 500 MPa and 1 GPa) material, 1120, is deposited.

In embodiments where there are sub-steps in this smoothing deposition, and the first sub-step uses deposition with no sputter-etching, the second may have sputter etching alone. Thus, it could proceed by alternation of deposition of very thin layers followed by sputter etching that removes or densifies most of the newly deposited layer, while smoothing protrusions. All of the steps in some embodiments may be performed by passing the substrate under a series of linear plasma units (LPUs) operating under suitable conditions—which may be different pressures and gas compositions when under the sources wherein deposition takes place versus sources where sputter etching takes place.

The deposition of the barrier layer—which may be substantially a silicon-containing compound such as silicon nitride, silicon oxynitride or silicon oxide, or metal compound containing at least one of: aluminum, titanium, zinc, tin, zirconium, indium, yttrium, or hafnium—follows the deposition of the smoothing layer. The barrier material may be deposited from various precursor gases by plasma enhanced deposition. Being deposited on top of the smoothing layer described above, the barrier film may be exposed to moderate ion bombardment during deposition—not at levels sufficient to cause substantial sputter etching of the film (as in the smoothing layer), but sufficient to make it properly densified, homogeneous and resistant to gaseous diffusion. Typically, the power density of ion bombardment in this step may be one to two orders of magnitude (10 times to 100 times) less than during the formation of the smoothing layer.

f. In example embodiments it may be entirely inorganic, non-polymeric material. This layer in some embodiments may be a dense and homogeneous inorganic material from 10 nm to 100 nm thickness. Such barrier layers that are thicker than about 40 nm to 50 nm may have limited tolerance for flexibility without cracking so that they would preferably be used with rigid substrates. Such materials may be deposited with one or more linear plasma sources, relative to which the web or substrates are moved. In this configuration the deposition process is easily scalable to very large substrates as is important for lowering mass production costs. Because the smoothing layer eliminates overhang or steeply sloped surfaces this barrier has superior moisture and gas barrier properties even with less than 50 nm thickness.

g. In some embodiments the barrier layer may contain at least one of an oxynitride or nitride of one or more of: silicon, aluminum, titanium, tin, zinc, indium, zirconium, hafnium and yttrium, along with additional content between 0.5% and 5% of carbon. In some preferred embodiments carbon may be in the range between about 1% and 3%. Additionally, there may be from 5% to about 25% hydrogen content in such films. The addition of the carbon to the films, even in such small concentrations, increases the yield strain level of the films—elasticity—and decreases the brittleness of the films. Such mixtures can be more tolerant of flexure or stretching than purely inorganic films. Such barrier layer may in some embodiments be much thicker than the pure inorganic layer described immediately above. Preferably, for cost considerations, this layer is between 50 nm and 300 nm thick about a factor of 10 thinner than some barrier layers made of similar materials, so that the cost of this layer is reduced and the cost of the encapsulation or other process is minimized to make such products competitive in the largest possible markets. This material may be advantageously employed as barrier material for weatherable and/or flexible coatings of all types, including but not limited to photovoltaic encapsulation and OLED encapsulation. For OLED or for PV such thicker barrier layers may advantageously permit effective, leak-free encapsulation for larger particles not adequately covered and smoothed by the smoothing layer. The process for depositing said film may in some embodiments employ one or more linear plasma sources providing total plasma excitation power per length of the source, roughly in the range between about 0.5 Watts/cm and 10 Watts/cm, depending on the deposition rate of the material. Generally, higher deposition rates require greater ion bombardment power density in roughly linear proportion, so that deposition rates of greater than 1000 Å/minute may require the bombardment power to preferably be above about 2 Watts/cm$^2$. In some embodiments, the combination of nitrogen content of the layer, its greater thickness and its elasticity result in a reduction in defects that would allow moisture or gas penetration. In some embodiments the barrier film may have only slightly different composition from that of a smoothing layer, or even the same composition though with a possible difference in the film density or intrinsic stress due to differences in deposition conditions during formation—including ion bombardment power and sputter etching rate.

h. A third group of example embodiments for the barrier uses even thicker layers of mixed polymeric and non-polymeric material where the polymeric content may be from 5% to 95% and the non-polymeric content from 95% to 5%. In some exemplary embodiments the polymeric content may be from 5% to 20%. The thickness of such a barrier film may be between 300 nm and 5000 nm. Such material in example embodiments may have carbon as a constituent in addition to at least one of silicon and metal. See Table I for a listing of process conditions and properties of such barriers. The material in example embodiments may be substantially an oxide, a nitride or oxynitride. In some embodiments the layer may be deposited with gas pressures in the range between 10 Pa and 300 Pa and with excitation power density in the range between 0.1 Watts/cm$^2$ and 1 Watts/cm$^2$ of electrode area and with total gas flows from 500 sccm per square meter of deposition area to 5 Liters per square meter. In one example embodiment the process uses the precursor gas HMDSO, along with oxygen as reactant gas to produce a material that is a mixture of silicon dioxide, carbon and hydrogen. In most cases the hydrogen is part of methyl groups, $CH_3$, that are bonded to the silicon.

Integrated Process and Architecture of the Coatings:

In some embodiments the encapsulation for a thin film PV device may be a single dyad, incorporating at least one transparent barrier layer mainly containing silicon nitride between 10 and 100 nm thick deposited on at least one smoothing layer of carbon-doped silicon dioxide between 10 nm and 300 nm thick. An additional 50 nm to 100 nm thick carbon-doped silicon dioxide layer may be deposited on the barrier as a hard coating. This results in a three layer stack with total encapsulation thickness for a single dyad between 70 nm and 500 nm, and preferably between 100 nm and 350 nm. Such a barrier, in some embodiments, may also be an anti-reflection coating when the smoothing layer thickness is between about 150 nm and 250 nm thick and the barrier layer thickness is between about 10 nm and 25 nm. The silicon dioxide layers in this structure may have between 1% and 3% carbon content and some embodiments be may be deposited with intense sputter etching as in the smoothing layer description given above.

When high densities of surface particles or irregularities of 500 nm size and larger are present on the substrate as deposition begins, one or more additional dyads including smoothing layers, each covered with a barrier layer, may help reduce air leaks. In some embodiments the smoothing and barrier layers having roughly the same thicknesses and refractive indices as smoothing and barrier layers in the first dyad, may be repeated so that a four layer encapsulation may have two smoothing layers and two barrier layers alternating, with smoothing layer deposited first—a two dyad structure. Three dyad encapsulation with an additional hard carbon-doped oxide, when layer thicknesses are chosen suitably, is likely to have even better anti-reflection properties as well that improve PV efficiency but at higher cost. In this case, the total encapsulation thickness may preferably be from about 500 nm to 800 nm. Such a two dyad encapsulation structure with an additional hard layer on top is shown in a schematic cross section of a panel that may be a CIGS or Organic PV device in FIG. 12. The substrate, 1200, supports a lower encapsulation layer 1205 and then the PV device consisting of TCO layer 1210, then the PV layer 1215, and the top TCO layer 1220. The top encapsulation layers comprise: a first (150 nm to 300 nm thick) carbon-doped (1% to 5%) silicon dioxide smoothing layer 1225 that has between 1.4 to 1.5 refractive index (RI) and substantially smoothes the surface and tightly binds to particles. This layer may have sublayers that are more heavily ion bombarded during or after formation and have less carbon content than layers receiving less bombardment. The first barrier layer 1230 may be relatively thin (10 nm to 30 nm) high RI material, silicon nitride that may have carbon doping (<5%) and has a RI from 1.8 to 2.0, that functions to stop gas leaks due to most particle-based defect. Next is a second, carbon-doped (1% to 5%) silicon dioxide smoothing layer 1235 having thickness of 150 nm to 300 nm as the lower smoothing layer, that reduces surface slopes adequately to support a defect free barrier. Upon this is a second, thinner (10 nm to 30 nm thick) silicon nitride barrier, 1240, that may be carbon-doped (<5% carbon) and by virtue of the smoothing layers (that have left the surface with modestly sloping bumps) is virtually defect free. Finally, there is a thinner carbon-doped (1% to 5% carbon) silicon dioxide top coating, 1245, that is between 50 nm and 100 nm thick having a RI of less than 1.5. This provides physical protection due to the hardness of the silicon dioxide for the nitride layer and optically helps the 5 layer barrier structure be an efficient anti-reflection coating. For such PV panels to be most cost-effective they should not need a cover glass and therefore, the encapsulation/antireflection coating should be weatherable—meaning it can tolerate a wide range of environmental temperatures.

Since thin film PV devices may be made on transparent plastic or opaque metal films (that may be supplied on rolls such as PET, PEN, acrylic, polyimid, aluminum foil or stainless steel) that have different thermal expansion coefficients from the deposited layers (from about 10 μparts/° C. to 100 μparts/° C.) the finished product must tolerate relative substrate expansion due to substrate temperatures up to about 80° C. It may expand more than an inorganic hard coating thicker than about 40 nm could accommodate, and microcracking of inorganic layers may result. Such microcracks in barrier layers destroy the hermetic protection capability of encapsulation and must be totally eliminated for applications on sensitive materials. The encapsulation structure described in FIG. 12 avoids this problem by using materials for both types of layers that have sufficient elasticity to accommodate substrate thermal expansion.

The structure of the combined hard/antireflective encapsulation coating for thin film PV modules such as CIGS and OPV, in some embodiments may have as few as one high RI barrier layer alternating with two low RI smoothing layers, or have as many as 20 high RI barrier layers alternating with 21 low RI smoothing layers. The thicker layers in some embodiments may be elastic, carbon-doped inorganic material because even a modest concentration of carbon in the film makes its bulk material properties modestly elastic, and the thinner, inorganic barrier layers may be elastic because of their nanoscale thickness. This coating when applied to photovoltaic panels may serve as a hard coating to prevent scratching by dust or during cleaning. The total thickness of the layer in some embodiments may be between 300 nm and 5000 nm, and preferably between 300 nm and 1000 nm. The material properties of the various layers provide hardness, elasticity, and hermetic encapsulation. This substantially improves the overall lifetime and value of photovoltaic panels that will be used outdoors and their effective LCOE.

In some embodiments the structure of the encapsulation for thin film photovoltaic panels that also functions as an anti-reflective coating for sunlight may include at least two layers (150 nm to 300 nm) of carbon doped silicon oxide having between 1% and 3% carbon content, and at least one thin barrier layer of carbon-doped silicon nitride material of between 10 nm and 30 nm thickness having between 1% and 3% carbon content and a refractive index at 500 nm wavelength between 1.8 and 2.0. There also may be an additional layer of carbon-doped silicon oxide having thickness between 50 nm and 100 nm that also serves as a hard coating on the top of the stack. These layers are arranged so as to alternate silicon oxide with silicon nitride, the silicon oxide layer being deposited first on the device or substrate and followed by a nitride layer and then another thicker silicon oxide layer followed by the second nitride layer and then the thin silicon oxide layer on top. Because all of these layers have greater than a 1% elastic strain limit this encapsulation can withstand both flexing and environmental exposure in the range between about −45° C. and 85° C. while using substrates such as PEN, PET and kapton (trademark of DuPont). We believe that in the case of CIGS or OPV modules this technology can reduce the LCOE by up to 30% relative to alternative encapsulation technologies, coming from the improved electrical efficiencies of these panels (for CIGS by up to about 2 percent from 15% without this A/R coating to 17% with A/R coating) and 1.5% for OPV modules, as well as the increased module life and cost savings from elimination of top cover glass or plastic.

In some embodiments, there may be for encapsulation for an OLED device on flexible substrates, a structure with two dyads, each having a thick (50 nm to 300 nm) carbon-containing smoothing layer combined with a thick (50 nm to 300 nm) carbon-containing barrier layer that is tolerant, both of small radius flexure and thermal expansion of the substrate. These materials may contain substantially silicon oxide or silicon oxynitride for the smoothing layers and silicon nitride or silicon oxynitride for the barrier layers along with the carbon. The carbon content for either layer may be at a low, doping level, below 3% in some embodiments, or in some embodiments at a carbon doping level, between 5% and 20%. In FIG. 13 is a schematic of a two-dyad encapsulation having heavily carbon doped (>5% carbon) material smoothing layers on an organic polymer top layer 1300 (that could be a planarizing layer for an OLED device) with its near-surface region 1305 implanted to a dose of $5 \cdot 10^{15}/cm^2$ of silicon ions to a depth of about 10 nm. Upon this is a 100 nm to 500 nm thick smoothing layer of mixed polymeric-non-polymeric material comprised of three bands: a bottom band 1310 that is thin (10 nm to 30 nm thick), deposited with intense sputter etching to smooth surface irregularities from particles or surface damage. This very thin layer of material is dense and compressive in intrinsic stress, that may have between 5% to 10% carbon content. On this is deposited a middle band, the bulk (40 nm to 280 nm) of mixed polymeric (5% to 20%) and non-polymeric material 1315 with intrinsic film stress less than about 200 MPa. Upon this is the second dense compressive band, 1320, with like characteristics to the first band. Deposited next is 50 nm to 300 nm thick silicon nitride (carbon content from 5% to 20% carbon) barrier layer 1325 having modestly compressive stress <200 MPa. The second smoothing layer is similar to the first, a heavily carbon-doped (>5% carbon) material containing silicon dioxide and having three bands within it of which the top and bottom layers are dense and have greater than 500 MPa intrinsic stress. Again, the first band is a 10 nm to 30 nm thick sub-layer 1330 having 5% to 10% polymeric content, deposited with sputter etching for smoothing the remaining asperities on the surface. On this is a second band 1335 of low intrinsic stress (<200 MPa) heavily carbon-doped (>5%) material as in the first smoothing layer, and on this is a second dense, compressive band 1340 of mixed material as in the first smoothing layer. A second barrier layer 1345 is also of silicon nitride that is 30 nm to 300 nm thick, having low intrinsic stress (<200 MPa) with characteristics like the first barrier layer. This encapsulation is flexible with very few defects even with high initial defect density on the surface. The thin smoothing layers though they may not be inadequate hermetic barriers by themselves, having effective WVTR from about $10^{-1}$ g/m2/day to $10^{-3}$ g/m2/day, nonetheless provide significant help in reducing the WVTR of the combined structure. They do this not only by providing a flatter surface for the barrier layer to be deposited upon, but by greatly reducing the rate of moisture transport between barriers and parallel to the substrate relative to organic polymer smoothing layers currently widely used. Such a dual dyad encapsulation may also be formed with all layers using lightly carbon-doped material (1%<carbon concentration <3%) instead of the heavily carbon-doped (>5% carbon) material in FIG. 13.

In some embodiments of an encapsulation structure for OLED or PV devices a single dyad encapsulation shown in FIG. 14 has a substrate with a surface layer that may be organic polymer, transparent conducting oxide or other material, 1400, supporting a smoothing layer having five bands made up of two types of material with very similar composition. A first type, 1405, 1415 and 1425 that are very thin (10 nm to 30 nm) sub-layers substantially of silicon oxynitride that have carbon content of between 0.5% and 5%, and preferably between 1% and 3%, and are deposited while exposed to intense sputter etching and may also be sputter etched further to smooth protruding features. Such layers may have intrinsic stress greater than 500 MPa or even greater than 1 GigaPascal. Sandwiched between the three densified layers are sub-layers of a second type of the smoothing layer, 1410 and 1420 that may be between 30 nm to 100 nm thick, and also composed substantially of silicon oxynitride, with between 10% and 30% nitrogen, and having carbon doping between 1% and 5%. This layer may be deposited with low-to-moderate ion bombardment so that there is only slight sputter etching and the film intrinsic stress is only very slightly compressive. Then another sputter etched, very thin (10 nm to 30 nm) sub-layer, 1415, substantially of silicon oxynitride that has carbon content of between 0.5% and 5%, and preferably between 1% and 3%, and is deposited in combination with and may also be followed by intense sputter etching. Upon this is a second less bombarded part of the smoothing layer, 1420, that is 30 nm to 100 nm thick, also substantially of silicon oxynitride, with between 10% and 30% nitrogen, and having carbon doping between 1% and 5%, and which is deposited with moderate ion bombardment so that there is only slight sputter etching. Upon this is a thin (10 nm to 100 nm) substantially silicon nitride barrier layer, 1430, that may be slightly carbon doped (1% to 5% carbon). The encapsulation total thickness for a single dyad may be between 60 nm and 1100 nm. The thickness would be approximately twice that for a four layer structure having two such dyads. The very thin barrier layer, though substantially inorganic, is elastic due to nano-scale thickness or carbon doping or both. In some embodiments more than 1% expansion of the substrate relative to the encapsulation is still within its elastic or strain limit. In some embodiments these materials may be deposited, singly in a chamber, or multiple layers one after another in a processing chamber, by plasma enhanced chemical vapor deposition using linear plasma sources. Deposition of the barrier layer in some embodiments may use precursor gas including silicon-containing or metallorganic gas precursors such as compounds of aluminum, zinc, tin, titanium, tantalum, hafnium, yttrium, zirconium and indium: (trimethyl aluminum, dimethyl zinc, trimethyl indium, tetramethyl tin, Tetrakis(t-butoxy) Hathium, Tetrkis (dimethylamino) Titanium, Bis(indenyl)dimethyl Zirconium, tris-n-cyclopentadienyl yttrium) or silicon compounds such as tetraethylorthosilicate, hexamethyldisiloxane, methylated silanes (methyl silane, trimethyl silane, tetramethyl disilane and others), hexamethyldisilazane, silanes, linear hydrocarbons, cyclic hydrocarbons, and alcohols.

For some flexible OLED and PV products, where large particles or defects on the surface are numerous as barrier coating starts, there will be less defects if smoothing layer and barrier are both thicker which means the layers greater than about 30 nm thick need to be of materials that have bulk elasticity. This may be achieved in the disclosed method using dielectrics containing silicon or metal or mixtures thereof that are lightly doped with carbon. This doping minimally degrades layer transparency when carbon is 5% or less and provides sufficient elasticity of layers up to 1000 nm thick to tolerate flexure with small radius for flexible screens and large temperature ranges. In some embodiments both smoothing layer and barrier material contain oxygen or nitrogen or a mixture. The carbon content of such film layers in some embodiments may be between 0.5% and 5% and preferably between 1% and 3%. Such compounds, which may be called "oxynitrides" in some embodiments also include between 10% and 50% nitrogen. This structure reduces the defect density relative to encapsulation structures having thinner barrier layers of inorganic material—in large part due to the elasticity of the barrier layer and more conformal coating on that part of the particle that protrudes from the surface. There may be intense sputter etching concurrent with deposition of a smoothing layer or alternating with it during the period of deposition of any of those layers. Barrier layer deposition in some embodiments uses moderate levels of ion bombardment power so as to keep film intrinsic stress below 200 MPa. One example barrier material may be silicon nitride with carbon doping of 1% to 3% atomic concentration. Another may be silicon oxynitride having between 10% and 50% atomic fraction of nitrogen and 1% to 2% carbon doping. A third may be aluminum oxide having 3% to 5% carbon doping deposited with plasma enhanced CVD from trimethylaluminum. Seen in FIG. 15 is an OLED lighting or display device with the active device 1500 and the top TCO layer 1505. The surface particles 1510 are smoothly and tightly surrounded by the first smoothing layer 1515 that is between 50 nm and 300 nm thick and made of carbon-doped dielectric containing silicon dioxide and having 1% to 3% carbon content. The barrier layer 1520 is a carbon doped silicon nitride or oxynitride layer between 100 nm and 300 nm thick. This has between 1% and 4% carbon so that its refractive index may be between 1.65 and 2.0. The next smoothing layer 1525 and barrier layer 1530 are within the same ranges of thickness and properties as the initial smoothing and barrier layers described above. Their thicknesses should be minimized where possible within the stated ranges, however, so that the total thickness of the encapsulation may be less than about 600 nm. This dual dyad encapsulation should meet the requirements of the most sensitive, large area OLED devices and achieve less than 1 defect per square meter. Because the carbon-doped silicon or metal oxynitride or nitride is more elastic than pure inorganic material, the disclosed methods allow electronic devices on flexible substrates to tolerate large temperature changes such as required for outdoor use in harsh climates—from −40° C. to 85° C.—or to be flexed with bending radius less than 10 mm without microcracking compromising barrier function.

In a second set of example embodiments of this encapsulation technology, also represented by FIG. 15, a smoothing layer, 1525, made of carbon doped silicon oxynitride (between 10% and 30% nitrogen) having a thickness between 100 nm and 300 nm, and carbon content between 1% atomic and 3% atomic, is situated between two barrier layers, 1520 and 1530. The limited moisture permeability and reduced thickness of the intermediate carbon-doped oxide smoothing layer between any two barrier layers provides a substantial advantage for multilayer encapsulation. This smoothing layer, though a poor barrier itself, virtually eliminates aligned defects in the barrier layers above and below it. It further substantially retards moisture propagation over the large lateral distances between nearest defects in the two barrier layers by virtue of the very large aspect ratio. This helps meet requirements for long-life defect sensitive products even for defect levels of more than 100 per square meter in any individual barrier layer. Consequently, defect location in a barrier layer is more than 99% of the time more than a centimeter away from the defects in the nearby barrier layer(s) creating a long pathway for moisture to penetrate to the device. Further, since the permeability of the smoothing layer between first and second barrier layers is low (as a barrier film it would transmit less than about $10^{-2}$ g/m²/day) it serves to substantially delay the onset of the first dark spot in more than 99% of 50 inch screens. In some example embodiments there may be nitrogen content in the smoothing layer from 10% to 30% that further reduces the diffusion rate of moisture through the material—in this case the WVTR of the smoothing layer material might be $10^{-3}$ to $10^{-4}$ g/m²/day. Even if defect densities in each barrier layer alone are 10 per square meter so that each barrier is only $10^{-2}$ g/m²/day the effective leak rate WVTR for the entire 4 layer structure is less than $10^{-7}$ g/m²/day. Yields of OLED screens or lights can be substantially increased by use of such encapsulation. Due to the beneficial effects of the disclosed smoothing layer, WVTR is much less than those of current technologies and it will be possible to get good yields for larger area devices with single or multiple barrier layers.

The steps of the disclosed coating processes may in some embodiments include one or more preparatory steps including surface cleaning (denoted $C_1$ for cryokinetic, or $C_2$ for UV-Based) and/or energetic particle-based surface modification of the substrate surface (denoted $M_1$ for direct inorganic implant, and $M_2$ for surface very thin coating+inert ion bombardment knock-on implant). These may be followed by the principal deposition steps, of which there are three alternative smoothing processes: $S_1$ representing pure inorganic layer, $S_2$ representing carbon-doped oxide with <5% carbon, and $S_3$ representing the mixed polymeric-non-polymeric material with >5% carbon or other polymeric material; and three different barrier processes: $B_1$ representing the pure inorganic barrier—usually a thin (<100 nm) nitride or oxynitride, $B_2$ which is the <5% carbon doped type of material that may be much thicker (>100 nm) while retaining flexibility, and $B_3$ which is the heavily carbon-doped (>5% carbon) material which may be up to 3000 nm thick. One example embodiment process sequence then might use both cryokinetic ($C_1$) cleaning and UV cleaning ($C_2$) as well as surface doping with silicon ($M_1$) before doing a thick partially polymeric smoothing and inorganic barrier—denoted by a sequence: $C_1C_2M_1S_3B_1$. This particular process may be used on a substrate that supports an electronic device whose surface has already been planarized by a polymer based layer to cover the topography of the underlying materials which may be an OLED-based display.

In some embodiments for ultra-clean process, such as for manufacturing OLED lighting, where the surface doping with silicon may not be done before smoothing layer deposition and where very thin inorganic smoothing and barrier layers are used in a dual dyad the sequence of process steps may be $C_1C_2S_1B_1S_1B_1$. In some embodiments, for most sensitive encapsulation where leakage must be lowest and the substrate must be flexible, the two principal deposition steps may be alternated making a sequence such as: $C_1C_2S_2B_2S_2B_2S_1B_1$.

In some embodiments one could repetitively do the same barrier deposition process with two or more different, possibly alternating process conditions. For the three different barrier deposition conditions one could do $CMS_2B_2B_1B_3S_1B_1B_2B_3$. Alternatively one could use two different smoothing steps during the sequence $S_1B_1B_2S_2B_1B_2S_1B_1B_2$ so that arbitrary combinations of smoothing and/or barrier deposition could be done.

For less defect sensitive applications such as anti-reflection coatings that are also hermetic barriers for photovoltaics such as CIGS or organic PV in some embodiments of the coating process there may be no cleaning steps needed or used: $S_2B_1S_2B_1S_2$.

For more defect sensitive OLED display fabrication where there is a planarizing organic polymer applied just before encapsulation both cryogenic aerosol and UV surface preparation as well as surface conditioning with silicon or metal implanted ions may be used: $C_1C_2M_1S_2B_3S_2B_3S_1B_1$.

For encapsulation of CIGS modules where a previously deposited layer is a transparent, electrically conductive oxide, in some embodiments, there may be no UV treatment step nor silicon implant step needed prior to the deposition of the smoothing and barrier layers and use of a triple dyad barrier results in better A/R performance: $S_2B_1S_2B_1S_2B_1S_2$ where refractive indices and thicknesses of layers are such that the coating is anti-reflective for wavelengths between about 400 nm and 700 nm. In example embodiments as seen in Figure such thicknesses $S_2$ might range from 220 nm to 250 nm thick with refractive index (RI) of 1.46, while $B_1$ might range from 15 nm to 25 nm thick with RI of 1.9, and a second layer $S_2$ may be 200 nm to 280 nm thick with RI of 1.46, while the next set of higher index layers $B_1$ might be 15 nm to 20 nm thick with RI of 1.8 and a final layer $S_2$ would be 60 nm to 80 nm thick with RI 1.45.

Another example embodiment of the process for encapsulation might take the form of a superlattice in which up to two hundred successively deposited material layers are between 3 nm and 15 nm thick—so there is effectively no bulk material. See FIG. 16 for a Transmission Electron Micrograph we have made of such a film deposited with the proprietary deposition system. Such layers in some embodiments may be of the architecture, SBSBSBSB . . . SBSBS, where S represents layers subjected to higher sputter etching rate while B represents layers of material containing more nitrogen which are subjected to less sputter etching. This is an alternating stack between very thin smoothing layers and very thin barrier layers. Such superlattices have been shown to have valuable properties in a number of applications, including visible or UV light filtering and hard coatings. One such application could be enhanced reflection of UV light to protect plastic substrates from degradation in natural sunlight.

The cross section of an encapsulated concentrator lens panel for concentrated PV is shown in FIG. 17. The plastic substrate, 1700, which in some embodiments is made of acrylic plastic has a layer of silicon-based material (not silicon dioxide) that is between about 1 nm and 5 nm thick as a pretreatment for the surface of the acrylic, and a layer of carbon-doped (1% to 5%) silicon dioxide, 1705, that has RI between 1.4 and 1.5 and is between about 180 nm and 280 nm thick, followed by a deposited silicon nitride ($Si_3N_4$) layer, 1710, having RI between 1.8 and 2.0 with thickness between 5 nm and 25 nm. The following layer of carbon-doped (1% to 5%) silicon oxide, 1715, also has RI between about 1.4 and 1.5 and thickness between 180 nm and 280 nm, final high RI layer of $Si_3N_4$, 1720, with thickness between 5 nm and 25 nm, and top layer of carbon doped silicon dioxide and organic polymer, 1725, with thickness between 50 nm and 120 nm. The top layer, 1730, is mostly the carbon-doped silicon dioxide material but the top 20 nm of the layer in some embodiments may be deposited with more oxygen or less carbon-containing gas so that it has less organic content—less than 3% so that it is a hard and scratch-resistant surface. In aggregate the stack of layers thickness is between 431 nm and 735 nm and is thick and hard enough to be a true hard coating that will resist scratching despite years of maintenance dust removal. This coating is more than 95% efficient in eliminating reflected light and so improves the PV efficiency of the module by up to 2% relative to top glass encapsulation for CIGS—which is very significant in lowering electricity cost.

For encapsulation of CIGS modules where the preceding layer deposited is a transparent conductive oxide in some embodiments (such as seen in FIG. 13 above) there may be no UV treatment step nor silicon implant step needed prior to the deposition of the smoothing and barrier layers, but just an inert plasma-based surface activation step. Thus, the sequence of process steps in a 3-dyad structure might in some embodiments be: $C_2M_1S_2B_1S_2B_1S_2B_1S_2$. In this case the refractive indices and thicknesses of layers are such that the coating is anti-reflective for wavelengths between about 400 nm and 700 nm. The thickness of layer $S_1$ might range from 180 nm to 280 nm thick with refractive index (RI) of 1.46, while $B_1$ might range from 5 nm to 25 nm thick with RI of 1.9, and a second layer $S_2$ might again be 180 nm to 280 nm thick with RI of 1.40, while the next higher index layer $B_2$ might be 10 nm to 30 nm thick with RI of 1.8 and a final layer $S_1$ may be 60 nm to 100 nm thick with RI 1.45.

Encapsulation for flexible OLED displays or lighting may have more than one dyad, each with a heavily carbon-doped (carbon>5%) barrier layer deposited upon a lightly carbon-doped smoothing layer as shown in FIG. 18. The multi-layered OLED device, 1800, has deposited over it a smoothing layer, 1805, that in some embodiments may be a lightly carbon doped (1% to 3% carbon) silicon oxynitride having between 20% and 30% nitrogen content. This layer may be from 50 nm to 300 nm thick. The first 10 nm to 30 nm band of this material (as described above and illustrated in FIG. 14) may be deposited in combination with or followed by intense sputter etching of the surface. This layer of material is slightly denser, has much more compressive intrinsic stress (>500 MPa) and provides smoothing of exposed particle contamination or surface irregularities as described above. The remaining band of material in this layer (40 nm to 270 nm thickness) is also substantially silicon oxynitride with modest compressive stress (<200 MPa) that may in some embodiments have chemical composition and physical properties that are only slightly different from those of the compressive band because it receives less bombardment. Upon this is a barrier layer 1810 made of heavily carbon-doped material with thickness between 50 nm and 300 nm that has carbon content between about 5% and 10% and inorganic content that includes predominantly silicon nitride. Upon this is deposited a second smoothing layer, 1815, much like the first smoothing layer which may be from 50 nm to 300 nm thick having carbon content between 1% and 3% that has a thin band, that is 10 nm to 30 nm thick, of material subjected to intense sputter etching distributed through the depth (as shown in FIG. 14) of the smoothing film. In such thin layers the material may have slightly lower carbon content than in regions not subjected to the sputter etching. Lastly, upon this is a second barrier layer, 1820, which is also the heavily carbon doped material that has between 5% and 10% polymeric content and contains silicon nitride as part of the non-polymeric content. The deposition process may create the desired depth profile of film properties and carbon content through the smoothing layers film thickness either by varying the ion bombardment, or the flows of the different feed gases, or both. In some embodiments such variation would result from having much more intense ion bombardment producing sputter etching through the thin, low-carbon regions. Thus, each dyad has at least one such smoothing layer and barrier layer and together they have at least 1% elasticity.

The structure of the finished encapsulated OLED device as shown in FIG. 19 in some embodiments may include the two-layer encapsulation having a single barrier layer, 1900, which is between 50 nm and 100 nm thick and comprised substantially of silicon nitride having from 1% to 3% carbon content, and a smoothing layer, 1905 supporting the barrier, that is between 20 nm and 50 nm thick and has between ½% and 1% carbon content and is substantially silicon dioxide. This layer smoothes the surface covering defects such as 1910. Supporting these layers is an OLED device. The topmost layer of that device may be an organic polymer layer that provides a more planar surface for encapsulation, 1915. Typically such is used for OLED displays to smooth surface topography due to pixel structures. Such is not always needed for OLED lighting devices. Whether layer 1915 is present or not, a transparent electrically conducting oxide material such as indium tin oxide or zinc aluminum oxide, 1917, is required to provide electric current to all active areas of the device. The cathode, 1920, may be a very thin (<100 Å) layer of metal having a low work function that injects electrons into the next layer, the electron transport layer, 1925, which conducts electrons to the surface of the organic light emitting diode (OLED) layer, 1930, which efficiently emits light as electrons pass through it, irradiates a phosphor layer, 1935 that produces the desired color or blend of colors of light—typically monochrome for each pixel of a display and polychrome for lighting. The hole transport layer, 1940, is immediately below the phosphor and is transparent, as is a bottom TCO layer, 1945, on the plastic or thin glass substrate, 1950.

The structure of the finished encapsulated OLED device as shown in FIG. 20 in some embodiments may include the four-layer (two dyad) encapsulation having two barrier layers. Supported by a substrate is a flexible OLED device that includes a hermetic barrier 2000 which in turn supports a conductive layer 2005 and upon it a hole transport layer 2010. This layer in turn supports a phosphor layer 2015 that converts light from the OLED layer 2020 into photons having the desired wavelength or distribution of wavelengths. The OLED layer in turn supports the electron transport layer 2025 and it supports the very thin low work-function cathode layer 2030 that provides electrons that will produce the light when conducting through the OLED layer. Upon the cathode is a layer of transparent conductive oxide 2035, which may be aluminum doped zinc oxide, which in turn supports the smoothing layer 2040 of the first dyad. This layer is substantially of carbon doped silicon oxynitride throughout, though it has three parts deposited with varying rates of sputter etching (as described above) so that the intrinsic stress varies through the thickness of this layer. It has total thickness between 80 nm and 120 nm with carbon concentration that varies from about 1% in the two higher stress parts to about 2% carbon in the single lower stress part. This layer has a structure much like that seen in a smoothing layer in FIG. 13. Upon this is the first barrier layer 2045 which is between 50 nm and 100 nm thick and comprised substantially of silicon nitride having intrinsic stress less than 200 MPa and from 1% to 3% carbon content. This barrier in turn supports a second smoothing layer 2050 that has approximately the same structure and composition as the first smoothing layer. Upon this is the second barrier layer 2055 that is approximately the same composition and thickness as the first barrier layer. It should be noted that the smoothing layer between the first and second barrier layers is itself a moderately effective barrier material that would have a barrier performance between $10^{-2}$ to $10^{-4}$ g/m2/day. Since the smoothing layers prevent vertical alignment of the defects that may occur in the first and second barrier layers, the distance between defects in the plane of the substrate is likely to be several millimeters or more for such barriers. This results in a delay of years in the moisture transmission from a defect in the top barrier layer to a defect in the lower barrier layer due to the slow transmission in the smoothing layer material. Key is the combination of the two effects of the smoothing layer: (1) virtually eliminating vertically aligned defects in the two barrier layers, and (2) making a very long delay in moisture and oxygen transmission between defects in the upper and lower barrier layers due to the aspect ratio of the leak path and the slow transmission in the smoothing layer between.

The structure of the finished encapsulated OLED device as shown in FIG. 21 in some embodiments may include the two-layer (single dyad) encapsulation having two barrier layers. Supported by a substrate is a flexible OLED device that includes a hermetic barrier 2100 which in turn supports a conductive layer 2105 and upon it a hole transport layer 2110. This layer in turn supports a phosphor layer 2115 that converts light from the OLED layer 2120 into photons having the desired wavelength or distribution of wavelengths. The OLED layer in turn supports the electron transport layer 2125 and it supports the very thin low work-function cathode layer 2130 that provides electrons that will produce the light when conducting through the OLED layer. Upon the cathode is a layer of transparent conductive oxide 2135, which may be aluminum doped zinc oxide, which in turn supports the smoothing layer 2140 of the first dyad. This smoothing layer is substantially of carbon-doped silicon oxide throughout, though it has five parts deposited with varying rates of sputter etching (as described above) so that the intrinsic stress varies through the thickness of this layer. This layer has total thickness between 200 nm and 300 nm with carbon concentration that varies from about 1% to 2% in the two higher stress parts to about 2% to 3% carbon in the two lower stress parts. This layer has a structure much like that seen in a five-band smoothing layer as shown in FIG. 14. Upon this is the barrier layer 2145 which is between 50 nm and 100 nm thick and comprised substantially of silicon nitride having intrinsic stress less than 200 MPa and from 1% to 3% carbon content. The three separate sputter etched bands in the smoothing layer as well as its thickness insures that even the largest particle or surface defects are smoothed adequately that the barrier layer above will have best possible barrier performance.

In some embodiments there may be a complete encapsulation made substantially of a single carbon-doped material containing at least one of: silicon oxynitride, silicon nitride, metal oxynitride, or metal nitride. In some embodiments such encapsulation may be predominantly silicon nitride or silicon oxynitride. In some embodiments this material may have carbon content from 1% to 3%, with carbon content roughly constant within bands in the film, and varying from band-to-band. Those bands serving more to smooth the surface typically have been subjected to more ion bombardment, have less carbon content and have greater compressive intrinsic stress. Those bands that may be considered to serve as a barrier layers may have received less ion bombardment and have greater carbon content. Such bands alternating through the thickness of the film. Two adjacent depth bands could be considered to comprise a dyad and the encapsulation in some embodiments may have two or more such dyads whose layers may have different thicknesses and differences in chemical composition. In FIG. 22 is shown an OLED device having such single-material encapsulation as described above. The substrate 2200 has a conductive layer 2205 upon it, which in turn supports an ion conductive layer 2210. A phosphor-containing layer 2215 is supported on the conductive layer, and the phosphor layer in turn supports the OLED layer 2220 upon which is the electron conductive layer 2225, and on this the cathode layer 2230 made of low-work function metal. The top layer of transparent conducting material that may be an oxide such as indium-tin oxide or zinc oxide, 2235, typically has defects at its surface. This supports a band of the material 2240, a carbon-doped (1% to 2% carbon) oxynitride of silicon. This has been subjected to intense ion bombardment so that it has substantially compressive (>500 Mega Pascals) intrinsic stress, binds tightly to the defects and has a smoother top surface than the layer upon which it was deposited. Upon this is a band of silicon oxynitride 2245, having carbon content between 2% and 3%, that is less compressive material 2245 and received less ion bombardment than the band below. Upon this are further bands deposited with intense ion bombardment and sputter etching, 2250, that have properties very close to those of band 2240. Alternating with these bands are less ion bombarded bands 2255 with properties very close to those of band 2245. The thickness of any of said bands may be between 10 nm and 100 nm and preferably between 10 nm and 50 nm. In some embodiments the bands such as 2250 have smaller thickness and the bands 2255 have greater thicknesses within this range.

In some embodiments as many as four steps in the encapsulation process may be done in an apparatus having elongated linear plasma sources such as in the incorporated references. Such steps may include implantation of silicon ions into the surface of the substrate, plasma-based cleaning of the substrate surface, both film deposition and sputter etching of the smoothing layer(s) and deposition of the barrier layer(s). The configuration of the plasma source, including the gap between electrodes and between electrodes and substrate as well as the electrode shapes may be different for each of these steps or types of step. Further, the specific types and flows of gas and rf power conditions may be different for each of the steps. Shown in FIG. 23 is a cross-sectional view of an exemplary plasma source. In some embodiments the source configuration shows a gap of 5 mm to 40 mm between elongated electrodes, 2301, and 2302, each of which is at least four times as long as its width or height as shown in the Figure. Said electrodes are supported by an insulating standoff, 2303, so that between these electrodes and substrate 2312 the minimum gap may be between about 5 mm and 40 mm. The gap between said electrodes and substrate may be less than the width of said electrodes (measured along the direction of substrate motion, from left to right in the figure). In some embodiments the gap between said electrodes may be less than the height of said electrodes. The ratio of the minimum gap between said electrodes to that between said electrodes and substrate may be from ¼ to approximately 4 and preferably between ½ and 2. AC power that may be at one or more frequencies in the rf and VHF bands is provided to said electrodes from a supply 2308 and delivered through a matching network 2309 which may include one or more of: transformer, filter and/or splitter for the power so that both electrodes are powered and in some embodiments the phase angle between the AC power to the electrodes is greater than about 90°. A reactant gas or mixture may be supplied to a manifold 2304 in the standoff and said gas then is injected through small holes or slot(s) 2305 and flows down between said electrodes toward the substrate and is activated in the plasma 2316 sustained therein. A second gas which may contain at least one precursor for film deposition is injected from manifolds 2306 and 2307 into said downward flowing gas where it mixes and reacts to produce species that form the film deposited upon the substrate. After said gas stream flows between said electrodes it flows under said electrodes between them and the substrate wherein there is a plasma 2317. The intensity or power density of the plasmas 2316 and 2317 may be independently controlled so that the concentrations and energies of neutral and ionic species are suitable for the chosen process. The substrate moves over a pedestal 2310 that may be grounded through an impedance Z, 2311, that is less than 10 Ohms in magnitude. AC power is supplied to a lower electrode 2313 by an independently controllable source 2315, which may be at a different frequency or frequencies than the ac power provided to the electrodes 2301 and 2302. The source of power to the lower electrode may include impedance matching and splitting of the current to more than one such electrode. Electrode 2313 may be less than the width or height of one of the upper electrodes, and is insulated by a dielectric 2314 from the pedestal, as it is positioned underneath the gap between electrodes.

In some example embodiment illustrated in FIG. 24 the sizes and gaps of the electrodes may generally be similar to those in FIG. 23. The precursor gas may be injected downward toward the substrate from manifolds, 2406 and 2407 into the space between the electrodes and the substrate where it may react with the gas activated in the plasma 2316 found in the gap between electrodes 2301 and 2302. There may be multiple narrow electrodes 2413 powered by AC supply 2315 and isolated by dielectric insulators 2414 from the pedestal 2310.

In some embodiments the disclosed encapsulation deposition may be done on a polymer substrate having no device already on it, but serving as substrate to protect materials that will be deposited later above the barrier film. In some embodiments the barrier deposition method is used to cover materials or devices that have been built underneath such as organic LED or PV materials or electrically conducting metal oxides or metals already deposited on the substrate.

In some embodiments the method may be used on a substrate that supports an electronic device whose surface has already been planarized by a polymer based layer to cover the topography of the underlying materials. This device may be an OLED-based display or photovoltaic panel or OLED lighting panel. The process in some embodiments may include one or more of the pre-treatments including: cryogenic aerosol cleaning, UV cleaning, a surface conditioning process incorporating silicon atoms into the near-surface region of the polymer underlayer, and plasma surface treatment in addition to deposition of at least one smoothing layer and barrier layer. An appropriate encapsulation architecture as described above may then be used for different types of products and substrates.

Patent documents and publications mentioned in the specification are indicative of the levels of those skilled in the art to which the invention pertains. These documents and publications are incorporated herein by reference to the same extent as if each individual document or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

The invention claimed is:

1. A method for forming a moisture and oxygen permeation barrier on an electronic device on a rectangular or continuous web substrate, the method comprising:
   while maintaining the substrate in a temperature range below 100° C., subjecting the substrate to a substrate surface modification step so as to form a first layer upon said electronic device, the subjecting including both plasma enhanced chemical vapor deposition of a transparent dielectric material and sputter etching of said transparent dielectric material on the substrate surface by a plasma adjacent to the substrate, wherein a rate of the sputter etching is reduced from a first sputter etching rate to a second sputter etching rate less than the first sputter etching rate during the deposition of the transparent dielectric material, after deposition of an initial portion of the transparent dielectric material measuring 5 nm to 30 nm in thickness; and
   while maintaining the substrate at a temperature below about 100° C., subjecting the substrate supporting the electronic device to a plasma enhanced chemical vapor deposition process so as to form a second layer comprising a hermetic barrier layer.

2. The method of claim 1, wherein the hermetic barrier layer contains silicon nitride.

3. The method of claim 1, wherein the electronic device is an organic light emitting diode (OLED) device that is subjected to the plasma enhanced chemical vapor deposition of both the first layer and the second layer.

4. The method of claim 1, further comprising depositing a third and fourth layer so as to form a four layer coating, wherein a third layer of the four layer coating is substantially composed of the same material as the first layer and is deposited by a process substantially as used for depositing the first layer, and a fourth layer of the four layer coating is substantially composed of the same material as the second layer and is deposited by a process substantially as used for depositing the second layer.

5. A method for forming a moisture and oxygen barrier on an electronic device on a rectangular or continuous web substrate, wherein the substrate is processed as the substrate continuously moves through a processing system, the method comprising:

cleaning a surface of the substrate by a cryogenic spray cleaning process using at least one of argon, nitrogen and carbon dioxide so as to form a cleaned surface;

subjecting the cleaned surface to a surface modification step so as to form a first layer upon the electronic device, the surface modification step having both plasma enhanced chemical vapor deposition of transparent material onto the cleaned surface and sputter etching of the transparent material on the cleaned surface, wherein a rate of the sputter etching is reduced from a first sputter etching rate to a second sputter etching rate less than the first sputter etching rate during the deposition of the transparent material, after deposition of an initial portion of the transparent material measuring 5 nm to 30 nm in thickness; and subjecting the substrate to a plasma enhanced chemical vapor deposition process so as to form a second layer comprising a transparent hermetic barrier layer, wherein a temperature of the substrate is maintained below about 150° C. during the plasma enhanced chemical vapor deposition of the transparent hermetic barrier layer.

6. The method of claim 5, wherein the hermetic barrier layer contains silicon nitride.

7. The method of claim 5, wherein the electronic device comprises an organic light emitting diode (OLED) device, and the OLED device is coated with the moisture and oxygen barrier.

8. The method of claim 5, further comprising depositing a third and fourth layer so as to form a four layer coating, wherein the third layer of the four layer coating is deposited using substantially the same material and process as used for depositing the first layer, and the fourth layer of the four layer coating is deposited using substantially the same material and process as used for depositing the second layer.

9. A method for forming a moisture and oxygen barrier on a rectangular or continuous web substrate, the method comprising:

while maintaining the substrate in a temperature range below about 100° C., subjecting the substrate to a surface modification step so as to form a first layer on the substrate, the surface modification step including both plasma enhanced chemical vapor deposition of transparent material and sputter etching of the transparent material on a surface of the substrate by a radio-frequency (rf) biased plasma adjacent to the substrate, the transparent material having a thickness after the surface modification step and a surface topography that is smoothed, wherein a rate of the sputter etching is reduced from a first sputter etching rate to a second sputter etching rate less than the first sputter etching rate during the deposition of the transparent material, after deposition of an initial portion of the transparent material measuring 5 nm to 30 nm in thickness; and while maintaining the substrate at a temperature below about 100° C., subjecting the substrate to a plasma enhanced chemical vapor deposition process so as to form a second layer comprising a hermetic barrier layer, the hermetic barrier layer comprising a transparent dielectric material having less than 3% carbon content.

10. The method of claim 9, wherein the hermetic barrier layer contains silicon nitride.

11. The method of claim 9, wherein an organic light emitting diode (OLED) device is located on the substrate and is covered by the moisture and oxygen barrier.

12. The method of claim 9, further comprising depositing a third and fourth layer so as to form a four layer coating, wherein the third layer of the four layer coating is deposited using substantially the same material and process as used for depositing the first layer, and the fourth layer of the four layer coating is deposited using substantially the same material and process as used for depositing the second layer.

13. The method of claim 1, wherein subsequent to decreasing the sputter etching rate from the first sputter etching rate to the second sputter etching rate, increasing the sputter etching rate from the second sputter etching rate to a third sputter etching rate during the deposition of the transparent dielectric material.

14. The method of claim 1, wherein the first layer contains silicon nitride.

15. The method of claim 1, wherein the first layer contains silicon oxynitride.

16. The method of claim 5, wherein subsequent to decreasing the sputter etching rate from the first sputter etching rate to the second sputter etching rate, increasing the sputter etching rate from the second sputter etching rate to a third sputter etching rate during the deposition of the transparent material.

17. The method of claim 5, wherein the first layer contains silicon nitride.

18. The method of claim 5, wherein the first layer contains silicon oxynitride.

19. The method of claim 9, wherein subsequent to decreasing the sputter etching rate from the first sputter etching rate to the second sputter etching rate, increasing the sputter etching rate from the second sputter etching rate to a third sputter etching rate during the deposition of the transparent material.

20. The method of claim 9, wherein the first layer contains silicon nitride.

21. The method of claim 9, wherein the first layer contains silicon oxynitride.

* * * * *